United States Patent
Egashira et al.

(10) Patent No.: US 6,514,335 B1
(45) Date of Patent: Feb. 4, 2003

(54) HIGH-QUALITY SILICON SINGLE CRYSTAL AND METHOD OF PRODUCING THE SAME

(75) Inventors: Kazuyuki Egashira, Saga (JP); Masahiko Okui, Osaka (JP); Manabu Nishimoto, Osaka (JP); Tadami Tanaka, Saga (JP); Shunji Kuragaki, Saga (JP); Takayuki Kubo, Saga (JP); Shingo Kizaki, Saga (JP); Junji Horii, Saga (JP); Makoto Ito, Saga (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/486,300

(22) PCT Filed: Aug. 25, 1998

(86) PCT No.: PCT/JP98/03749

§ 371 (c)(1),
(2), (4) Date: Feb. 24, 2000

(87) PCT Pub. No.: WO99/10570

PCT Pub. Date: Mar. 4, 1999

(30) Foreign Application Priority Data

Aug. 26, 1997 (JP) .............................. 9-229716
Dec. 26, 1997 (JP) .............................. 9-358833
Jan. 28, 1998 (JP) ........................... 10-015530
Feb. 24, 1998 (JP) ........................... 10-042627
Jul. 3, 1998 (JP) ........................... 10-188598
Aug. 24, 1998 (JP) ........................... 10-236717

(51) Int. Cl.$^7$ .............................................. C30B 15/14
(52) U.S. Cl. ....................................................... 117/13
(58) Field of Search ............................ 117/932, 11, 13, 117/15

(56) References Cited

U.S. PATENT DOCUMENTS 5,096,839 A * 3/1992 Amai et al. .................... 437/10
5,248,378 A * 9/1993 Oda et al. ................. 156/617.1

(List continued on next page.)

FOREIGN PATENT DOCUMENTS

| JP | 4-285100 | 10/1992 |
| JP | 6-56588 | 3/1994 |
| JP | 8-268794 | 10/1996 |
| JP | 8-330316 | 12/1996 |
| JP | 9-199561 | 7/1997 |

OTHER PUBLICATIONS

Wolf et al., Silicon Processing in the VLSI Era, vol. 1:Process Technology, Lattice Press, Sunset Beach, CA, USA, pp. 8–21, 36–70, 1986.*

*Primary Examiner*—Benjamin L. Utech
*Assistant Examiner*—Matthew Anderson
(74) *Attorney, Agent, or Firm*—Armstrong, Westerman & Hattori LLP

(57) ABSTRACT

A method of producing a high-quality silicon single crystal of a large diameter and a long size in a good yield by controlling the positions where ring-like oxygen-induced stacking faults (R-OSF) occur in the crystal faces and minimizing grown-in defects such a dislocation clusters and infrared scattering bodies that are introduced in the pulling step. Wafers produced from the above-high-quality silicon single crystal contain little harmful defects that would deteriorate device characteristics and can be effectively adapted to larger scale integration and size reduction of the devices. Therefore, the method can be extensively utilized in the field of producing semiconductor silicon single crystals.

11 Claims, 31 Drawing Sheets

U.S. PATENT DOCUMENTS

| | | | | |
|---|---|---|---|---|
| 5,386,796 A | * | 2/1995 | Fusegawa et al. | 117/13 |
| 5,474,020 A | * | 12/1995 | Bell et al. | 117/20 |
| 5,607,507 A | * | 3/1997 | Bell et al. | 117/20 |
| 5,728,211 A | * | 3/1998 | Takano et al. | 117/14 |
| 5,795,382 A | * | 8/1998 | Bell et al. | 117/20 |
| 5,820,672 A | * | 10/1998 | Bell et al. | 117/20 |
| 5,840,120 A | * | 11/1998 | Kim et al. | 117/208 |
| 5,919,302 A | * | 7/1999 | Falster et al. | 117/3 |
| 5,938,842 A | * | 8/1999 | Sakuada et al. | 117/12 |
| 5,948,159 A | * | 9/1999 | Nakamura et al. | 117/13 |
| 5,954,873 A | * | 9/1999 | Hourai et al. | 117/13 |
| 5,968,262 A | * | 10/1999 | Saishouji et al. | 117/13 |
| 5,968,264 A | * | 10/1999 | Iida et al. | 117/30 |
| 6,045,610 A | * | 4/2000 | Park et al. | 117/13 |
| 6,056,819 A | * | 5/2000 | Ogawa et al. | 117/14 |
| 6,071,337 A | * | 6/2000 | Sakurada et al. | 117/13 |
| 6,120,749 A | * | 9/2000 | Takano et al. | 423/348 |
| 6,159,438 A | * | 12/2000 | Iida et al. | 423/328.2 |
| 6,197,109 B1 | * | 3/2001 | Iida et al. | 117/19 |
| 6,204,188 B1 | * | 3/2001 | Abe et al. | 438/706 |
| 6,227,944 B1 | * | 5/2001 | Xin et al. | 451/41 |
| 6,228,164 B1 | * | 5/2001 | Ammon et al. | 117/19 |
| 6,245,430 B1 | * | 6/2001 | Hourai et al. | 428/450 |
| 6,251,184 B1 | * | 6/2001 | Park | 117/217 |
| 6,254,672 B1 | * | 7/2001 | Falster et al. | 117/13 |
| 6,261,361 B1 | * | 7/2001 | Iida et al. | 117/19 |
| 2001/0000093 A1 | * | 4/2001 | Sakurada et al. | 117/13 |
| 2001/0003268 A1 | * | 6/2001 | Falster et al. | 117/13 |
| 2001/0008114 A1 | * | 7/2001 | Falster et al. | 117/3 |

* cited by examiner

FIG.16
(a)
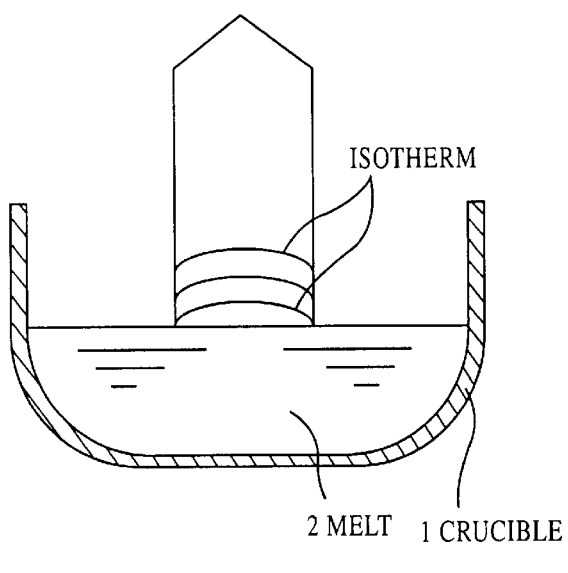
(b)
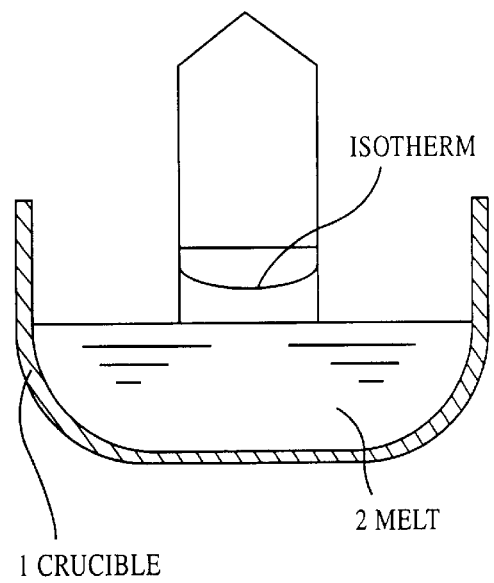

FIG.17
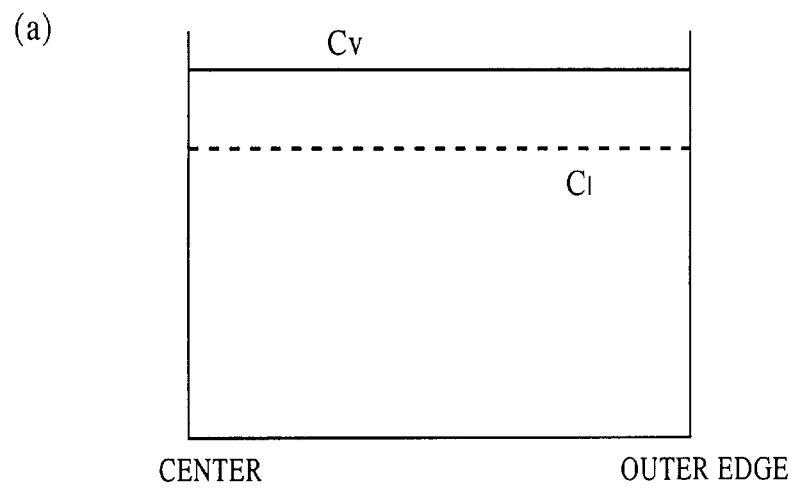
(a)
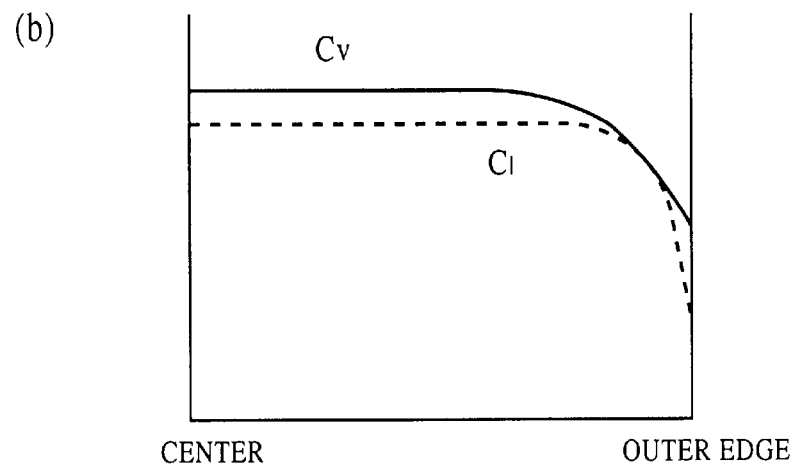
(b)
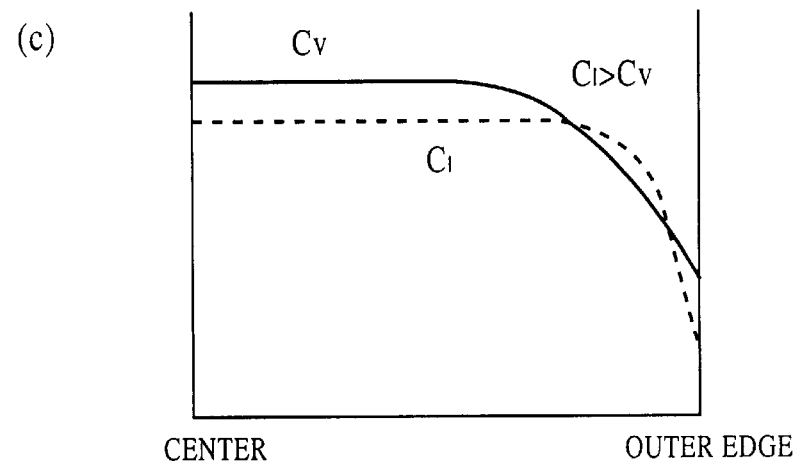
(c)

FIG.31

| TEST NO. | GROWING CONDITIONS ||| EXAMINATION RESULTS OF SINGLE CRYSTAL ||||| REMARKS |
| --- | --- | --- | --- | --- | --- | --- | --- | --- | --- |
| | ROTATING SPEED OF CRYSTAL (rpm) | ROTATING SPEED OF CRUCIBLE (rpm) | PULLING RATE (mm/min) | CRYSTAL POSITION | RATIO OF R-OSF OUTSIDE DIAMETER (%) | AVERAGE DENSITY OF LASER SCATTERING TOMOGRAPHY DEFECTS (SCATTERERS/cm$^3$) | AVERAGE DENSITY OF DISLOCATION CLUSTERS (CLUSTERS/cm$^3$) | PERCENT NONDEFECTIVE IN TERMS OF TIME-ZERO DIELECTRIC BREAKDOWN (%) | |
| 1 | 17 | 0.5 | 0.44 | UPPER | 20 | 0 | 0 | 92.4 | EXAMPLE ACCORDING TO THIS INVENTION |
| | | | | MIDDLE | 21 | 0 | 0 | 91.5 | |
| | | | | LOWER | 22 | 0 | 0 | 91.9 | |
| 2 | 20 | 3 | 0.46 | UPPER | 26 | 0 | 0 | 90.3 | EXAMPLE ACCORDING TO THIS INVENTION |
| | | | | MIDDLE | 24 | 0 | 0 | 91.1 | |
| | | | | LOWER | 25 | 0 | 0 | 90.5 | |
| 3 | 20 | 0.5 | 0.41 | UPPER | 0 | 0 | 0 | 95.3 | EXAMPLE ACCORDING TO THIS INVENTION |
| | | | | MIDDLE | 0 | 0 | 0 | 95.7 | |
| | | | | LOWER | 0 | 0 | 0 | 96.3 | |
| 4 | 15 | 10 | 0.70 | UPPER | 52 | $4.2 \times 10^4$ | $5.5 \times 10^3$ | 68.3 | COMPARATIVE EXAMPLE |
| | | | | MIDDLE | 54 | $4.9 \times 10^4$ | $5.1 \times 10^3$ | 67.7 | |
| | | | | LOWER | 55 | $5.1 \times 10^4$ | $4.9 \times 10^3$ | 66.5 | |

HIGH-QUALITY SILICON SINGLE CRYSTAL AND METHOD OF PRODUCING THE SAME

TECHNICAL FIELD

This invention relates to silicon single crystals for use as semiconducting materials. More particularly, it is directed to a high-quality silicon single crystal that is grown by a Czochralski method (hereinafter referred to as "CZ method") and that is excellent in device characteristics, and to a method of producing such a high-quality silicon single crystal.

BACKGROUND ART

A variety of methods are available to grow silicon single crystals for use as semiconducting materials. Among these methods, the CZ method is extensively used.

FIG. 1 is a schematic sectional view of a single crystal producing apparatus used for producing single crystals by a normal CZ method. As shown in FIG. 1, a crucible 1 comprises a quartz-made, bottomed, cylindrical inner layer holding container 1a, and a graphite-made, similarly bottomed and cylindrical outer layer holding container 1b that is fitted over the outside of the inner layer holding container 1a. The constructed crucible 1 is supported by a support shaft 1c that is rotated at a predetermined speed. Outside the crucible 1 is set a heater 2, which is provided in the form of a concentric cylinder. The crucible 1 is charged with a melt 3 that is a raw molten material heated by the heater 2. A pulling shaft 4, such as a pull rod or a wire, is provided at the center of the crucible 1. A seed chuck and a seed crystal 5 are attached to the distal end of the pulling shaft 4, and the seed crystal 5 is brought into contact with the surface of the melt 3 in order to grow a single crystal 6. Further, by pulling the seed crystal 5 at a predetermined rate using the pulling shaft 4 while rotating the pulling shaft 4 in a direction opposite to the direction of the crucible 1 rotated by the support shaft 1c, the melt 3 is solidified at the distal end of the seed crystal 5, thereby gradually growing the single crystal 6.

For single crystal growth, a seed-constricting step is carried out first so as to make the crystal dislocation-free. Thereafter, to secure a body diameter of the single crystal, a shoulder is formed, and when the body diameter has been obtained, a shoulder-changing step is performed. Then, the single crystal growing process is shifted to the single crystal body-growing step while maintaining the obtained body diameter. When the single crystal has been grown to a predetermined length while maintaining the body diameter, a tail constricting step is carried out so as to separate the single crystal from the melt in the dislocation-free state. Thereafter, the single crystal separated from the melt is taken out of the puller, and cooled under a predetermined condition, and processed into wafers. The wafers thus processed from the single crystal are used as substrate materials for the preparation of various devices.

In an in-plane area of a wafer that is processed through the above-described steps, there may occur, in some cases, oxidation-induced stacking faults (hereinafter referred to as "OSF") as defects appearing through heat treatments. Ring-like extending OSF (hereinafter referred to as "R-OSF") may appear in some cases depending on the pulling condition of a single crystal. At the same time, there occur, in the in-plane area of the wafer, defects that called "grown-in defects." These grown-in defects are formed during single crystal growth and detected in wafers subjected to heat treatments or predetermined evaluation processes.

FIG. 2 schematically illustrates a generally observed relationship between the pulling rate during single crystal growth and the positions where crystal defects occur. As shown in FIG. 2, in a silicon single crystal grown by the CZ method, the region where R-OSF appear shrinks inward from the outer edge of the crystal as the pulling rate is decreased. Therefore, when a single crystal is grown fast, the crystal in the inner region of R-OSF expands into the whole wafer, while when a single crystal is grown slowly, the crystal in the outer region of R-OSF expands into the whole wafer.

Grown-in defects observed on a surface of a wafer are different between a rapidly grown crystal and a slowly grown crystal. In the crystal that is grown fast, i.e., in the inner region of R-OSF, defects called "laser scattering tomography defects" (they are also called as "COP" and "FPD," and are detected by different evaluation methods, but are derived from the same kind of defect) are detected. On the other hand, in the crystal that is grown slowly, i.e., in the outer region of R-OSF, defects called "dislocation clusters" are detected.

FIG. 3 schematically illustrates an example of a typical distribution of defects observed at an in-plane position A of the crystal of FIG. 2 previously described. This schematically shows the results of observations made through X-ray topography as to the distribution of defects of a wafer after the wafer was sliced from a single crystal immediately after growth, had Cu deposited thereon while immersed into an aqueous solution of copper nitrate, and heat-treated for 20 minutes at 900° C. That is, in the in-plane area of the wafer, R-OSF appears at a position that is about ⅔ of the outside diameter, and laser scattering tomography defects are found inside R-OSF. Further, an oxygen precipitation-promoting region exists immediately outside R-OSF so as to touch R-OSF. Oxygen precipitates easily form in this region. Around the outer edge of the wafer extends a region where dislocation clusters easily occur. Furthermore, it is observed that a denuded zone free of dislocation clusters is slightly present immediately outside the oxygen precipitation promoting region, and a denuded zone free of laser scattering tomography defects is slightly present inside R-OSF so as to touch the ring.

OSF impair electrical properties, e.g., in the form of increased leak current while showing themselves up in a high-temperature thermal oxidation process during device fabrication, and dislocation clusters also greatly deteriorate device characteristics. Therefore, a single crystal is usually produced by adjusting the growing rate so that R-OSF is located around the outer edge of a wafer. On the other hand, laser scattering tomography defects are factors for deteriorating the initial oxide film withstand voltage characteristics, and they must also be minimized.

As described earlier, to suppress the occurrence of R-OSF on a surface of a wafer, a single crystal is usually grown under such a condition that the R-OSF position is limited within the outer edge of the wafer. However, it is known that the R-OSF position is determined, in addition to the pulling rate, by the highest temperature range (from the melting point to 1250° C.) in which the crystal stays during growth, and is hence affected by the heat history of the crystal in the highest temperature range during pulling. Thus, to determine the R-OSF position, attention must be paid to two factors, i.e., the temperature gradients in the direction of the pulling shaft and the pulling rate, which are to be achieved while a single crystal being grown stays in the highest temperature range. That is, the R-OSF position can be limited around the outer edge of a wafer by decreasing the temperature gradients when the pulling rate is not changed, or by decreasing the pulling rate when the temperature gradients are not changed.

To check the position and width of R-OSF occurring in the in-plane area of a wafer, it is effective to observe the distribution of defects in the wafer through X-ray topography after immersing the wafer that is processed from an as-grown single crystal into an aqueous solution of copper nitrate to thereby deposit Cu thereon, and heat-treating it for 20 minutes at 900° C. Further, the position of the previously described oxygen precipitation-promoting region present immediately outside R-OSF can also be checked through a similar method.

When a silicon single crystal has low oxygen content of, e.g., $13 \times 10^{17}$ atoms/cm$^3$ or less, one may not observe R-OSF clearly with the above-described method in some cases. In such cases, it is suggested that a ring-like region where the amount of oxygen precipitates is small be observed through X-ray topography after a wafer processed from an as-grown single crystal is charged into a heat treatment furnace of 650° C., thereafter heated at a rate of 8° C./min or less, and then heat-treated for 20 hours at 900° C. and for 10 hours at 1000° C. Further, the position and width of the oxygen precipitation-promoting region present immediately outside R-OSF can also be checked through a similar method.

Further, the R-OSF position can also be checked by using the outside diameter of a circular region where laser scattering tomography defects are detected as a reference when a wafer processed from an as-grown single crystal is subjected to infrared scattering tomography to measure the laser scattering tomography defects. Furthermore, the density of dislocation clusters is observed using an optical microscope through the so-called "Secco etching" in which the surface of a specimen wafer is etched using a Secco solution.

Owing to the recent trends not only toward low-temperature processing during device production to get rid of unsatisfactory effects of OSF easily occurring in high-temperature processes, but also toward lower oxygen contents in crystals, R-OSF are not considered so serious a problem as a factor for deteriorating device characteristics. On the other hand, of the grown-in defects, both laser scattering tomography defects and dislocation clusters are factors for deteriorating device characteristics, and thus it is more important to reduce the density of these grown-in defects in the in-plane area of a wafer. While the grown-in defects are less dense at the previously described denuded zones adjacent to R-OSF, such zones are limited to very narrow regions.

Various methods have so far been proposed to reduce the density of grown-in defects in the in-plane area of a wafer. For example, Japanese Unexamined Patent Application Laid-Open No. 8-330316(1996) proposes a method in which only the outer region of R-OSF is expanded into the whole in-plane area of a crystal without causing dislocation clusters to occur by controlling the pulling rate and the temperature gradients within the crystal during single crystal growth. However, according to the proposed method, both extremely limited in-plane temperature gradient and pulling conditions must be satisfied at the same time, and thus new improvements must be made in growing silicon single crystals for which larger diameter and mass production are called.

Next, Japanese Unexamined Patent Application Laid-Open No. 7-257991(1995) and Journal of Crystal Growth 151 (1995, pp. 273–277) disclose methods in which the temperature gradients in the direction of the pulling shaft of a single crystal are increased, so that R-OSF can disappear into the inside of the crystal under high-speed pulling conditions, and thus the outer region of R-OSF can be expanded into the whole in-plane area of the crystal. However, the methods disclosed by these publications have given no considerations to the distribution of temperature gradients in the in-plane area of the crystal, i.e., the uniformity of a temperature distribution in the in-plane area of a wafer and to the in-plane homogenization of introduced point defects. In other words, no considerations are given to means for reducing grown-in defects in the in-plane area of a wafer, and thus, even if only R-OSF are shrunk inward, dislocation clusters do remain in the in-plane area of the wafer as in conventional crystals. Therefore, the methods disclosed in these publications are not successful either in processing wafers having a lower density of grown-in defects.

DISCLOSURE OF THE INVENTION

This invention has been made in view of the above-described conventional problems over crystal defects. It is, therefore, an object of the invention to provide a high-quality silicon single crystal in which regions free of grown-in defects such as laser scattering tomography defects and dislocation clusters can be expanded into the in-plane area of a wafer by controlling the position and width of R-OSF while adjusting single crystal growing conditions. A further object of the invention is to provide a high-quality silicon single crystal that can be grown into a large diameter and a long size. This invention that has been accomplished to achieve the above objects has as its gist the following first to fifth high-quality silicon single crystals and methods of producing such high-quality silicon single crystals.

1. First High-Quality Silicon Single Crystal
   (1) A high-quality silicon single crystal grown by a CZ method, characterized in that the width of R-OSF exceeds 8% of the radius of the grown crystal and dislocation clusters are absent; or
   (2) A high-quality silicon single crystal grown by a CZ method, characterized in that the width of R-OSF exceeds 8% of the radius of the grown crystal, the inside diameter of the R-OSF is within a range of 0–80% of the diameter of the grown crystal, and dislocation clusters are present at a low density or absent.

2. Second High-Quality Silicon Single Crystal
   (1) A high-quality silicon single crystal grown by a CZ method, characterized in that the outside diameter and the inside diameter of a region where ring-like extending oxidation-induced staking faults occur are within a range of 0–80% and within a range of 0–33% of the diameter of said grown crystal, respectively, and dislocation clusters are absent;
   (2) A high-quality silicon single crystal grown by a CZ method, characterized in that the inside diameter of a ring-like oxygen precipitation promoting region is within a range of 0–80% of the diameter of said grown crystal, the inside diameter of a region where ring-like extending oxidation-induced stacking faults occur which is in the inner side of said oxygen precipitation promoting region is within a range of 0–33% of the diameter of said grown crystal, and dislocation clusters are absent; or
   (3) A high-quality silicon single crystal grown by a CZ method, characterized in that the outside diameter and the inside diameter of a ring-like region where the amount of oxygen precipitates is small are within a range of 0–80% and within a range of 0–33% of the diameter of said grown crystal, respectively, and dislocation clusters are absent.

3. Third High-Quality Silicon Single Crystal and Method of Producing the Same (1) A high-quality silicon single crystal grown under such a condition that the crystal stays in a temperature range of 1250° C.–1000° C. for 7 hours or more when pulled by a CZ method, characterized in that the outside diameter of R-OSF is within a range of 0–60% of the diameter of the grown crystal, and a method of producing this single crystal.

(2) A high-quality silicon single crystal grown under such a condition that the crystal stays in a temperature range of 1250° C.–1000° C. for 7 hours or more when pulled by a CZ method, characterized in that the inside diameter or the outside diameter of an oxygen precipitation promoting region is within a range of 0–60% of the diameter of the grown crystal, and a method of producing this single crystal.

(3) A high-quality silicon single crystal grown under such a condition that the crystal stays in a temperature range of 1250° C.–1000° C. for 7 hours or more when pulled by a CZ method, characterized in that the outside diameter of a ring-like region where the amount of oxygen precipitates is small is within a range of 0–60% of the diameter of the grown crystal, and a method of producing this single crystal.

(4) A high-quality silicon single crystal grown under such a condition that the crystal stays in a temperature range of 1250° C.–1000° C. for 7 hours or more when pulled by a CZ method, characterized in that the outside diameter of a circular region where laser scattering tomography defects are detected is within a range of 0–60% of the diameter of the grown crystal, and a method of producing this single crystal.

4. Fourth High-Quality Silicon Single Crystal and Method of Producing the Same (1) A high-quality silicon single crystal grown under such a condition that a temperature gradient in the vertical direction parallel with a pulling shaft of the crystal is smaller at the outer edge than at the center and is 2.6° C./mm or more at the center when the crystal stays in a temperature range of its solidifying point to 1250° C. while pulled by a CZ method, characterized in that the outside diameter of R-OSF is within a range of 0–60% of the diameter of the grown crystal, and a method of producing this single crystal; and (2) A method of producing a high-quality silicon single crystal characterized in that the single crystal is grown under such conditions that a temperature gradient in the vertical direction parallel with a pulling shaft of the crystal is smaller at the outer edge than at the center and is 2.6° C./mm or more at the center when the crystal stays a temperature range of its solidifying point to 1250° C. during growth, and that the outside diameter of R-OSF is within a range of 0–60% of the diameter of the grown crystal.

5. Fifth High-Quality Silicon Single Crystal and Method of Producing the Same (1) A high-quality silicon single crystal grown in such a state that the shape of a solid-melt interface between the single crystal and a melt is flat or upwardly convex when pulled by a CZ method, characterized in that the outside diameter of R-OSF is within a range of 0–60% of the diameter of the grown crystal; and (2) A method of producing a high-quality silicon single crystal characterized in that the single crystal is pulled in such a state that the shape of a solid-melt interface between the single crystal being grown and a melt is flat or upwardly convex at such a low rate as to allow the outside diameter of R-OSF occurring in the single crystal to be within a range of 0–60% of the diameter of the crystal. In this producing method, it is desirable to set the rotating speed of a crucible at 5 rpm or less, or/and the rotating speed of the single crystal at 13 rpm or more.

In this invention, the distribution of each type of defect may be detected through X-ray topography after immersing an as-grown wafer or specimen into an aqueous solution of copper nitrate to thereby deposit Cu thereon and then heat-treating it for 20 minutes at 900° C. Further, when the oxygen concentration is decreased, the distribution of OSF may not be observed satisfactorily in some cases under this condition. In such cases, X-ray topography may be used after charging an as-grown wafer or specimen into a furnace whose temperature has reached about 650° C., heating it up to 900° C. at a rate of 5° C./min, soaking it for 20 hours, thereafter heating it to 1000° C. at a rate of 10° C./min, and soaking it for 10 hours at that temperature. The density of dislocation clusters is detected by subjecting the surface of the wafer or specimen to Secco etching and observing its defects using an optical microscope. Further, laser scattering tomography defects are detected through laser scattering tomograpy.

BRIEF DESCRIPTION OF THE DRAWINGS

FIGS. 16(a) and 16(b) illustrate the temperature distributions of single crystals being grown and the behaviors of vacancies resulting from such temperature distributions.

FIGS. 17(a), 17(b), and 17(c) show how the concentration distribution of vacancies and that of interstitial Si atoms in the in-plane area of a single crystal change near the solid-melt interface and in a temperature range of the melting point to 1250° C. during single crystal growth.

FIG. 31 shows the results of examinations made as to Example 15.

BEST MODE FOR CARRYING OUT THE INVENTION

First to fifth high-quality silicon single crystals and methods of producing the same according to this invention will be described specifically on an itemized basis. Further, in the following description, the position where R-OSF occurs in the in-plane area of a wafer crystal is indicated as follows. When r=0, R-OSF occurs at the center of the crystal, and when r=R, R-OSF occurs at the outer edge of the crystal, where R is the distance (radius) from the center to the outer edge of the crystal, and r is the position where R-OSF occurs in the radial direction of the crystal. Note that the position of R-OSF is indicated in terms of its inside diameter.

1. First High-Quality Silicon Single Crystal

Concerning a first high-quality silicon single crystal, the inventors turned their attention to expanding denuded zones present next to R-OSF and near the outer region of R-OSF into a larger area of a wafer by improving the CZ method-based growing conditions of a single crystal, although R-OSF do occur in the in-plane area of the wafer. To implement this, the inventors examined how dislocation clusters occur in relation to the position and width of R-OSF occurring in a crystal grown under conventional conditions.

Figure 4:
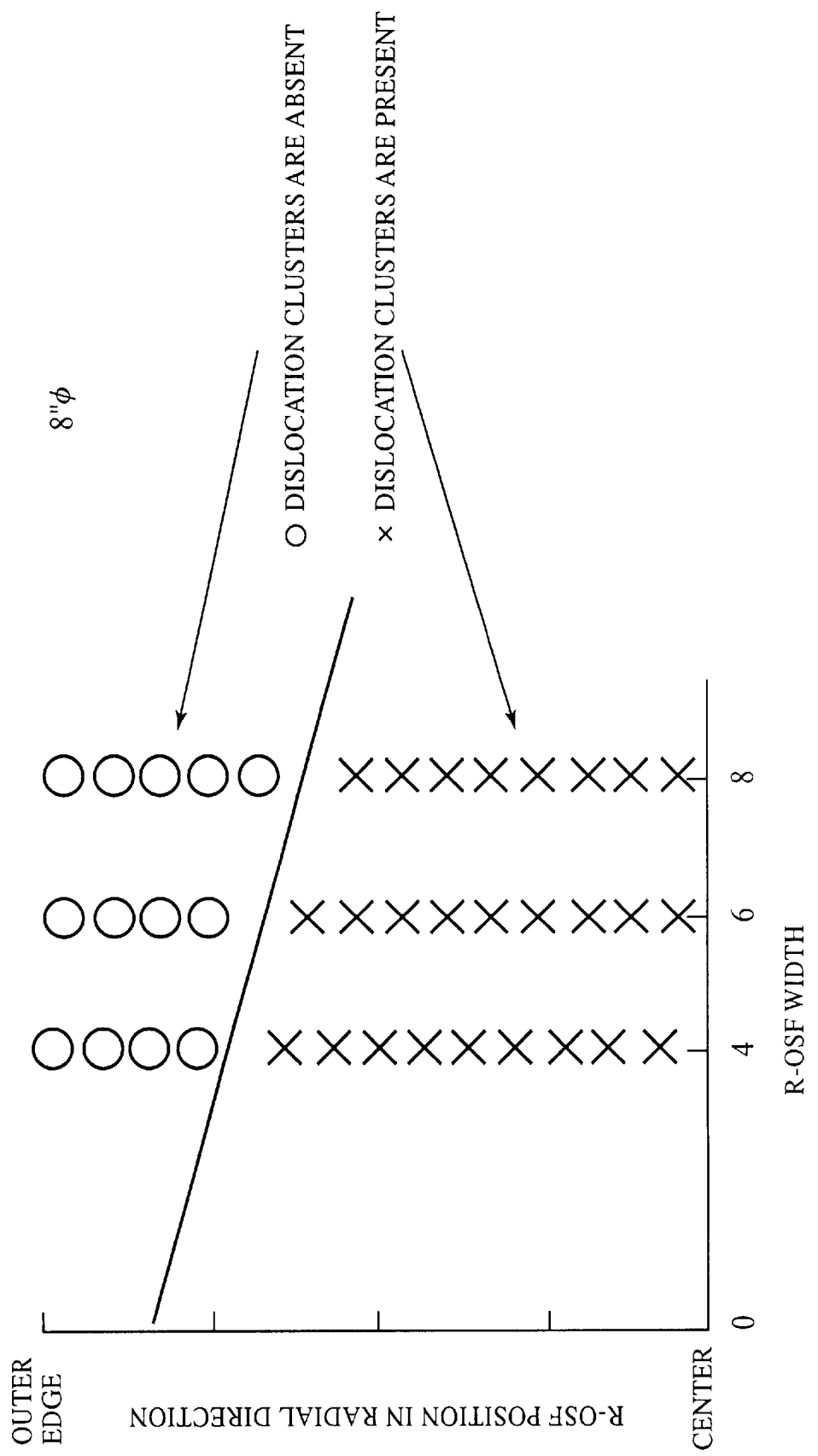
FIG. 4 schematically shows the relationship between the radial position and width of R-OSF and how dislocation clusters occur in an 8"-diameter crystal grown under conventional growing conditions, and FIG. 5 schematically shows the relationship between the radial position and width of R-OSF and how dislocation clusters occur in an 8"-diameter crystal grown under improved growing conditions.

FIG. 4 schematically shows the relationship between the radial position and width of R-OSF and how dislocation clusters occur in an 8"-diameter crystal grown under the conventional growing conditions (the axis of abscissa indicates the width of R-OSF in %). From the results of a number of examinations, it is apparent that when a crystal is grown under the conventional growing conditions, the R-OSF width is 8% or less of its radius. FIG. 4 shows that dislocation clusters are observed in the outer region of R-OSF when the R-OSF width is 8% of the radius of the grown crystal and R-OSF are located at r=⅔R. Therefore, when R-OSF occurs at positions closer toward the center than r=⅔R, dislocation clusters are observed in the outer region of R-OSF. Further, it is understood that more dislocation clusters tend to occur as the R-OSF width is decreased.

When the R-OSF width in the grown crystal is 8% or less of the radius, shrinking R-OSF toward the center can decrease the density of laser scattering tomography defects in the inner region of R-OSF. This contributes to improving time-zero dielectric breakdown (TZDB). However, dislocation clusters occurring in the outer region of R-OSF deteriorate characteristics, thus making the crystal unsuitable as a material for device substrates.

Next, examinations were made as to the R-OSF positions and widths and how dislocation clusters occur in a 6"-diameter crystal and an 8"-diameter crystal that were grown under the following improved growing conditions in examples to be described later, respectively.

Figure 5:
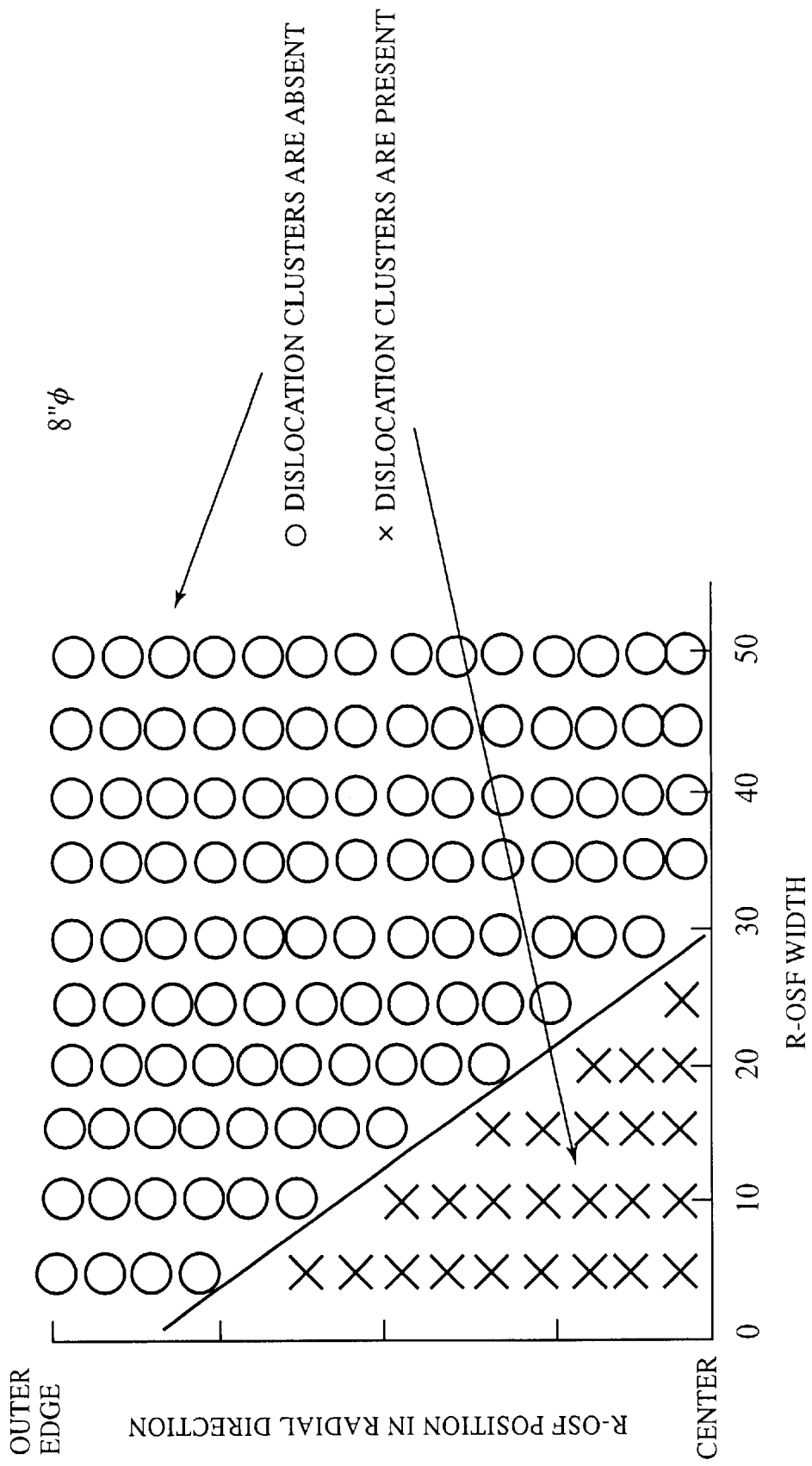

FIG. 5 schematically shows the relationship between the radial position and width of R-OSF and how dislocation clusters occur in the 8"-diameter crystal that was grown under the improved growing conditions (the axis of abscissa indicates the width of R-OSF in %). It is understood that the improved growing conditions can make the R-OSF width wider and the region free of dislocation clusters expands. For example, it is understood from FIG. 5 that when the R-OSF width becomes 30% of the diameter of the crystal, dislocation clusters do not occur no matter where R-OSF is located.

Figure 7:
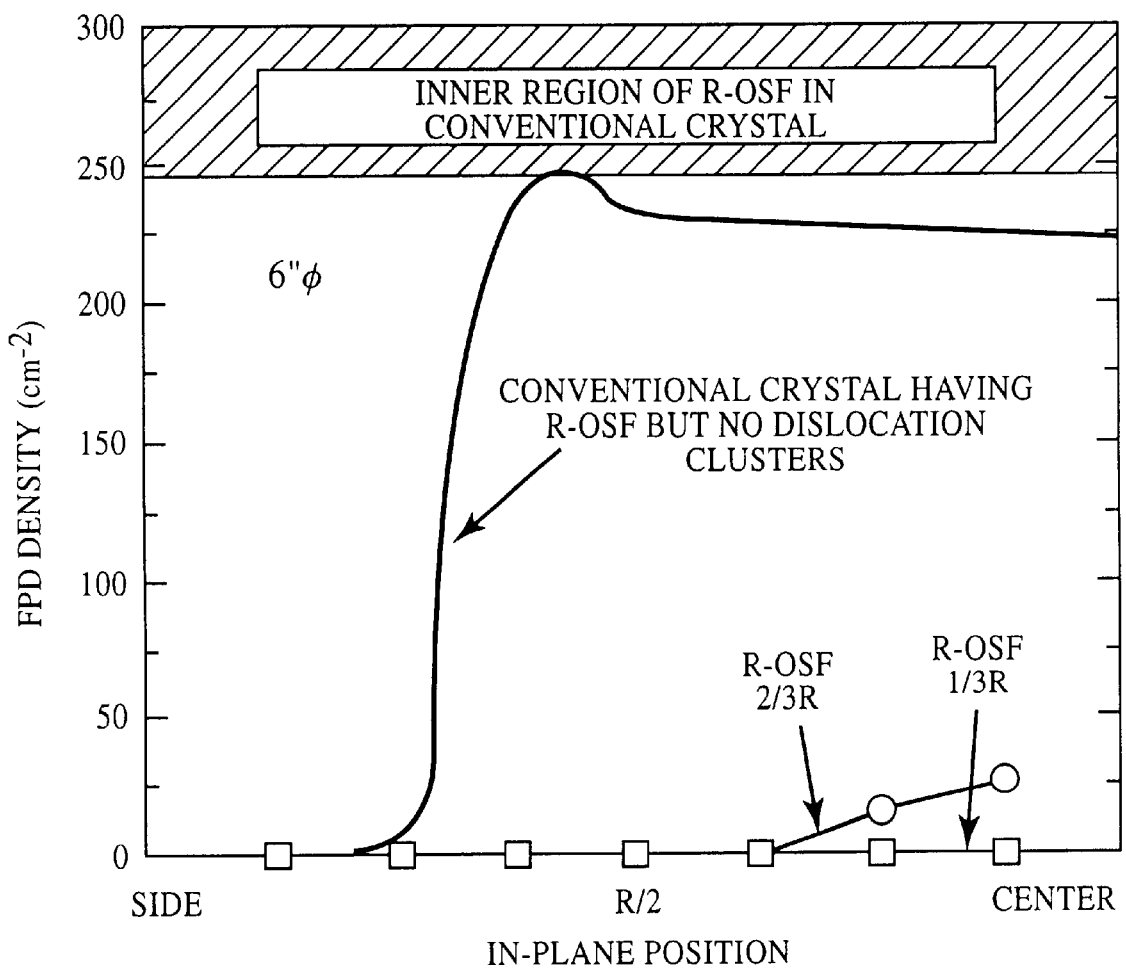
FIG. 7 shows the relationship between the in-plane R-OSF position and the FPD distribution density in an as-grown crystal that was grown in accordance with Example 1.

FIG. 7, which will be described later, shows the relationship between the in-plane R-OSF position and the FPD distribution density in an as-grown crystal that was grown in accordance with Example 1. That is, FIG. 7 shows the FPD density in an in-plane area of a wafer free of dislocation clusters in the case where the width of R-OSF was within a range of more than 8% to about 39% of the radius of the grown crystal (the width of R-OSF was 30 mm in the 6"-diameter crystal) and the R-OSF position was changed. As shown in FIG. 7, as the R-OSF width grows, FPD are sometimes observed around the center when the R-OSF position is $r=\frac{2}{3}R$. However, when the R-OSF position is changed to $r=\frac{1}{3}R$, there are no observable FPD.

Figure 10:
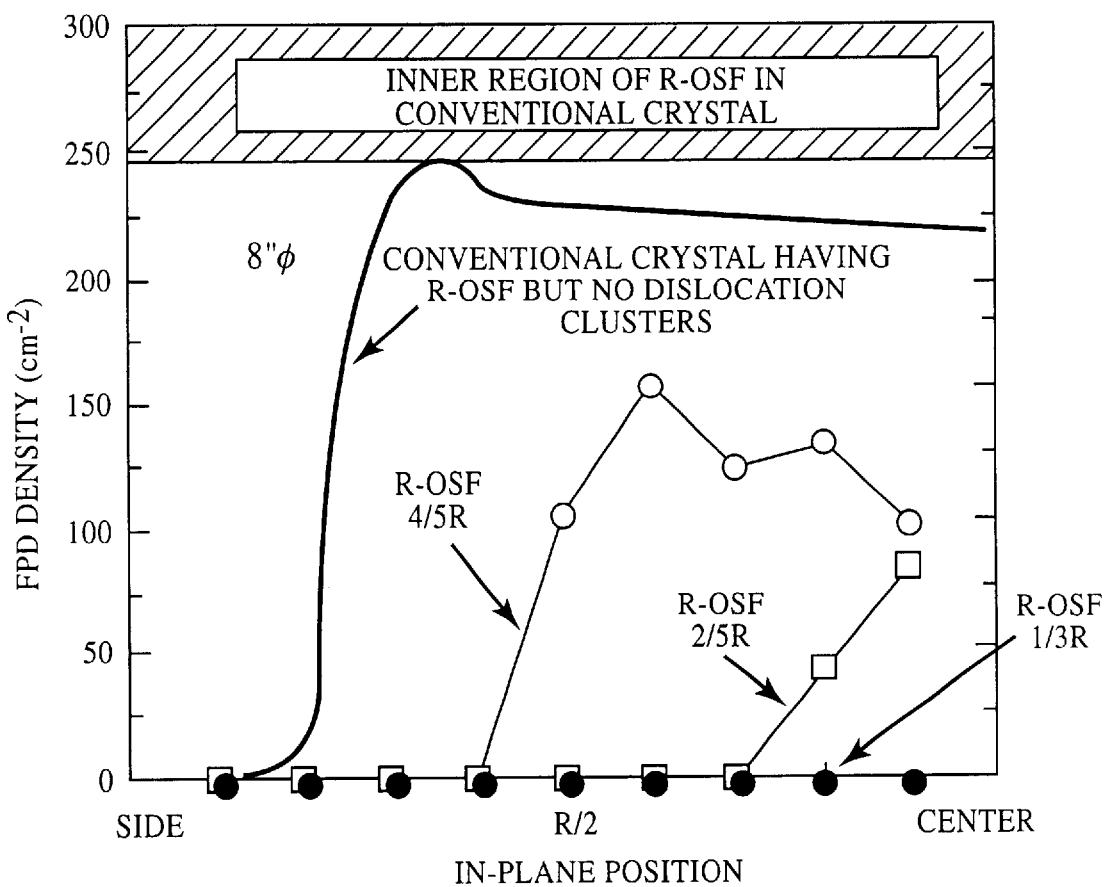
FIG. 10 shows the relationship between the in-plane R-OSF position and the FPD distribution density in an as-grown crystal that was grown in accordance with Example 3.

FIG. 10, which will be described later, shows the relationship between the in-plane R-OSF position and the FPD distribution density in an as-grown crystal that was grown in accordance with Example 3. Similarly to FIG. 7 described above, FIG. 10 shows the FPD density in an in-plane area of a wafer free of dislocation clusters in the case where the R-OSF width was about 39% of the radius of the grown crystal (the R-OSF width was 40 mm in the 8"-diameter crystal) and the R-OSF position was changed. As is apparent from FIG. 10 that as the R-OSF width grows, no FPD are observed in the inner region of R-OSF depending on the R-OSF position. Thus, increased R-OSF widths can eliminate dislocation cluster formation, and reduce the laser scattering tomography defect density in the inner region of R-OSF to an extremely small level, and even can eliminate the formation of laser scattering tomography defects by adding some other conditions.

According to the investigations made by the inventors, to eliminate grown-in defects from the in-plane area of a crystal without causing dislocation clusters and laser scattering tomography defects to occur in the in-plane area of a wafer, it is required that the R-OSF width be increased and that the R-OSF position be within a range of 0–80% of the diameter of the crystal.

That is, compared with the conventional crystal, R-OSF is located closer to the center of the in-plane area of the wafer, but it is wider so that denuded zones are expanded with no dislocation clusters present in the outer region of R-OSF, and in addition, laser scattering tomography defects are no longer observed in the inner region of R-OSF. Since grown-in defects that deteriorate device characteristics can be prevented from occurring in the whole in-plane area of a wafer in this way, the percent nondefective of devices can be greatly improved.

The reason why the R-OSF width is set at values exceeding 8% of the radius of the grown crystal in the first high-quality silicon single crystal is as follows. In the conventional example, dislocation clusters occur with the R-OSF position located at $r=\frac{2}{3}R$ when the R-OSF width is 8% or less, while when this invention is applied, dislocation clusters no longer appear even if the R-OSF width exceeds 8% and the R-OSF region is shrunk to be positioned at $r=\frac{2}{3}R$ or less. Further, the reason why the R-OSF position is set within a range of 0–80% of the diameter of the grown crystal is because within such a range, grown-in defects can be reduced to an extremely small degree or totally eliminated. For example, the smaller the value r, the less dense grown-in defects, with no grown-in defects detected when $r=\frac{1}{3}R$ or less. Therefore, in the first silicon single crystal of this invention, it is specified that grown-in defects are present "at a low density or absent," because its grown-in defects are reduced markedly compared with the conventional example in which the whole crystal is found inside R-OSF.

To produce the first high-quality silicon single crystal, it is required at the time of CZ method-based growth that the heat history of a single crystal during a period in which the crystal stays in a high-temperature range (from the melting point to 1200° C.) be controlled so as to make the concentrations of point defects that are introduced into an in-plane area of the crystal during that period uniform in such in-plane area. These point defects in the crystal are classified into vacancies and interstitial Si atoms. Vacancies are particularly relevant to R-OSF formation, and the position and width of R-OSF occurring in the in-plane area of a crystal coincide with the site and region where the vacancy concentration is within a certain limited range.

During single crystal growth, the in-plane temperature gradients of a crystal usually differ in the direction of the pulling shaft. Specifically, the crystal temperature drops faster toward the outer edge, resulting in larger temperature gradients toward the outer edge. In this case, vacancies introduced into the crystal diffuse toward the solid-melt interface in the direction of the pulling shaft and disappear in larger amounts with increasing temperature gradient, resulting in a markedly reduced concentration of the vacancies that remain as introduced into the crystal. As a result, when the temperature gradients in the direction of the pulling shaft differ, the concentrations of vacancies introduced into the in-plane area of the crystal are not uniform, resulting in lower vacancy densities toward the outer edge of the crystal. Therefore, by making the temperature gradients in the direction of the pulling shaft in the in-plane area of the crystal uniform, the in-plane vacancy concentrations can be made uniform.

Figure 6:
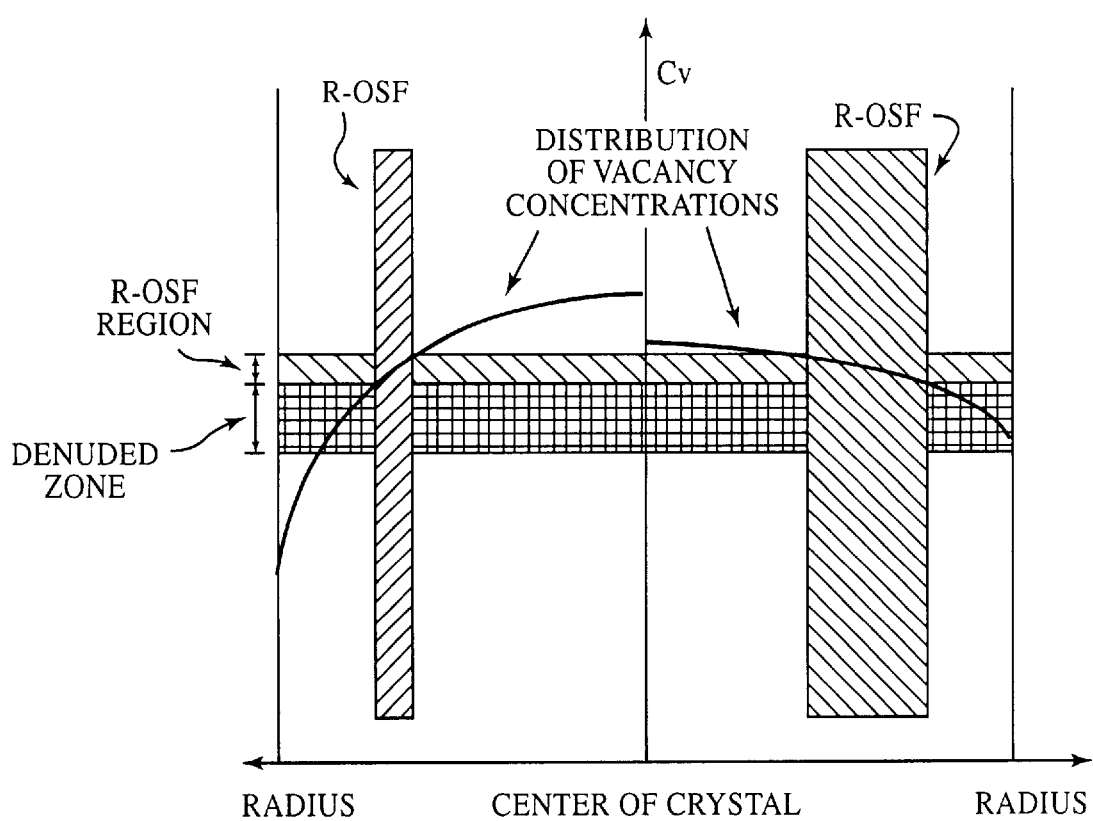
FIG. 6 schematically shows the relationship between the distribution of concentrations of vacancies introduced into an in-plane area of a crystal and the width of R-OSF formed in the crystal.

FIG. 6 schematically shows the relationship between the distribution of concentrations of vacancies introduced into an in-plane area of a crystal and the width of R-OSF formed in the crystal. The axis of ordinate in FIG. 6 indicates the vacancy concentration $C_V$ and the axis of abscissa the in-plane position of the crystal. Further, the left side of FIG. 6 indicates cases where vacancy concentrations fluctuate greatly from the in-plane center toward the outer edge, and the right side cases where vacancy concentrations are comparatively uniform. Since R-OSF occurs at a region where the vacancy concentration is within a limited range, the R-OSF width widens when a relatively uniform in-plane vacancy concentration is achieved as indicated by the right side of FIG. 6. As described earlier, the in-plane R-OSF width in the conventional crystal is kept at 8% or less of the radius of the grown crystal. This is because the vacancy concentration range coinciding with the R-OSF occurring region is limited within 8% of the radius of the grown crystal since the temperature gradients in the direction of the pulling shaft in the in-plane area of the crystal are not uniform under the conventional growing conditions.

By improving the growing conditions, e.g., by improving heating means, heat insulating members and the like for the hot zone of a single crystal producing apparatus, the temperature gradients in the direction of the pulling shaft in an in-plane crystal area are made uniform and, by doing so, the amounts of vacancies introduced into the in-plane area are made uniform. As a result, the vacancy concentration range within which R-OSF is formed can be increased, and hence the R-OSF width can be widened correspondingly. Further, the denuded zone formed closely in the outer region of R-OSF can also be expanded by making the amounts of vacancies introduced into the in-plane area uniform so that the vacancy concentration range within which the denuded zone is formed is increased. By doing so, regions free of grown-in defects such as laser scattering tomography defects and dislocation clusters that deteriorate device characteristics are expanded into the whole in-plane area of the crystal, whereby high-quality wafers excellent in device characteristics can be obtained.

First high-quality silicon single crystals of this invention were produced in two different diameters, 6" and 8", and the forms of R-OSF appearing in these crystals and the quality characteristics of these crystals were examined as Examples 1 to 4.

1-1. EXAMPLE 1

Figure 1:
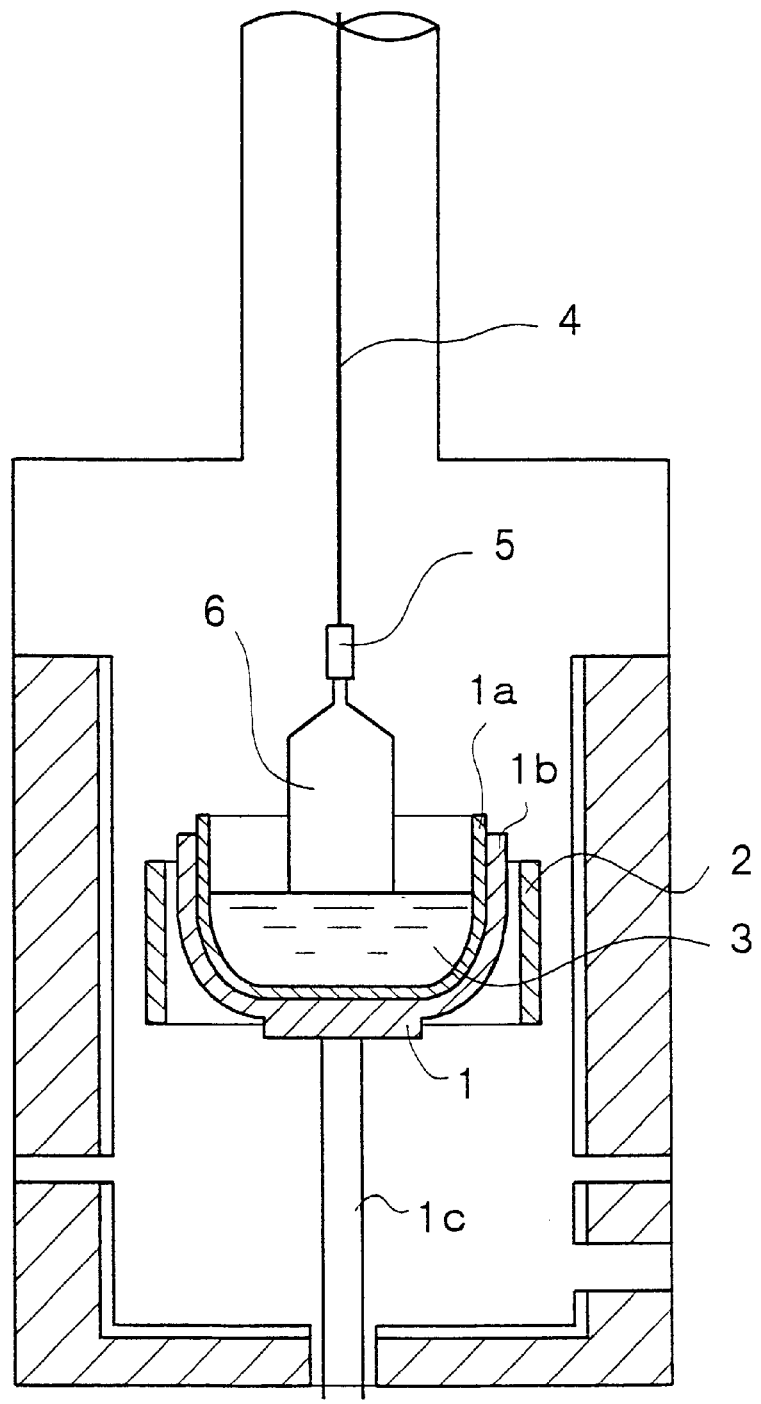
FIG. 1 is a schematic sectional view of a single crystal producing apparatus that is used for producing a single crystal by a normal CZ method.

A 6"-diameter single crystal was produced using the single crystal producing apparatus shown in FIG. 1. The crucible was charged with 60 kg of polysilicon that is a raw material for the preparation of a crystal, and boron was further added as a p-type dopant so as to obtain an electrical resistivity of 10 Ωcm.

After achieving a 10-torr Ar atmosphere within the chamber, the power of the heater is adjusted so as to melt all the raw material for the crystal. After stabilizing the melt within the crucible, the lower end of a seed crystal was immersed into the melt, and the single crystal was pulled while rotating the crucible and the pulling shaft.

In Example 1, it is an object to examine how the widths of R-OSF and a denuded zone change, or how the FPD density changes in accordance with the growing conditions. To do so, growing rate changing tests in which the growing rate of the crystal was gradually decreased were conducted by growing the crystal in a hot zone where the conventional temperature distribution in an in-plane area of a crystal was improved so that the amounts of vacancies introduced into the in-plane area of the crystal become uniform.

To carry out these tests, the power of the heater was adjusted when the single crystal growing process shifted to the body-growing step via the seed-constricting step and the shoulder-forming step, and the single crystal was pulled by a predetermined length under such a condition that R-OSF occur around the outer edge by increasing the pulling rate at the initial stage. When the single crystal was pulled to a length of 100 mm, the pulling rate was gradually slowed down, and the forms of R-OSF and a denuded zone, as well as the behavior of FPD formed in the inner region of R-OSF were examined.

The form of R-OSF was examined by splitting the as-grown crystal that was grown in accordance with Example 1 lengthwise, coating the split crystal with Cu, heat-treating it at 900° C. to thereby render visible its defective regions by type, and thereafter taking X-ray topographic pictures. The widths of R-OSF and the denuded zone were much wider than those of the conventional crystal. While the expected width of R-OSF circularly formed in the in-plane area was 30 mm on one side, the R-OSF width was expanded to a maximum of 40 mm, with a total width of 80 mm on both sides found at a site. That is, there was even a site where more than half (52%) the radius of the 6"-diameter crystal corresponded to the R-OSF width. It was also verified that even if R-OSF were caused to occur around the center of the crystal to thereby expand their outer region, no dislocation clusters were observed because the denuded zone expanded greatly.

FIG. 7 shows the relationship between the in-plane R-OSF position and the FPD distribution density in the as-grown crystal that was grown in accordance with Example 1. Note that Secco etching was effected to observe the in-plane R-OSF position. Further, the R-OSF width was controlled to 30 mm, which was on the order of 39% of the radius of the crystal. As is apparent from FIG. 7 that FPD were observed around the center of the crystal when the in-plane R-OSF position was r=⅔R, while no FPD were observed when the R-OSF position was changed to r=⅓R. Therefore, by controlling the width and in-plane position of R-OSF while adjusting the growing conditions, one can grow crystals in the in-plane area of which grown-in defects such as laser scattering tomography defects (FPD) and dislocation clusters are not observed.

Figure 8:
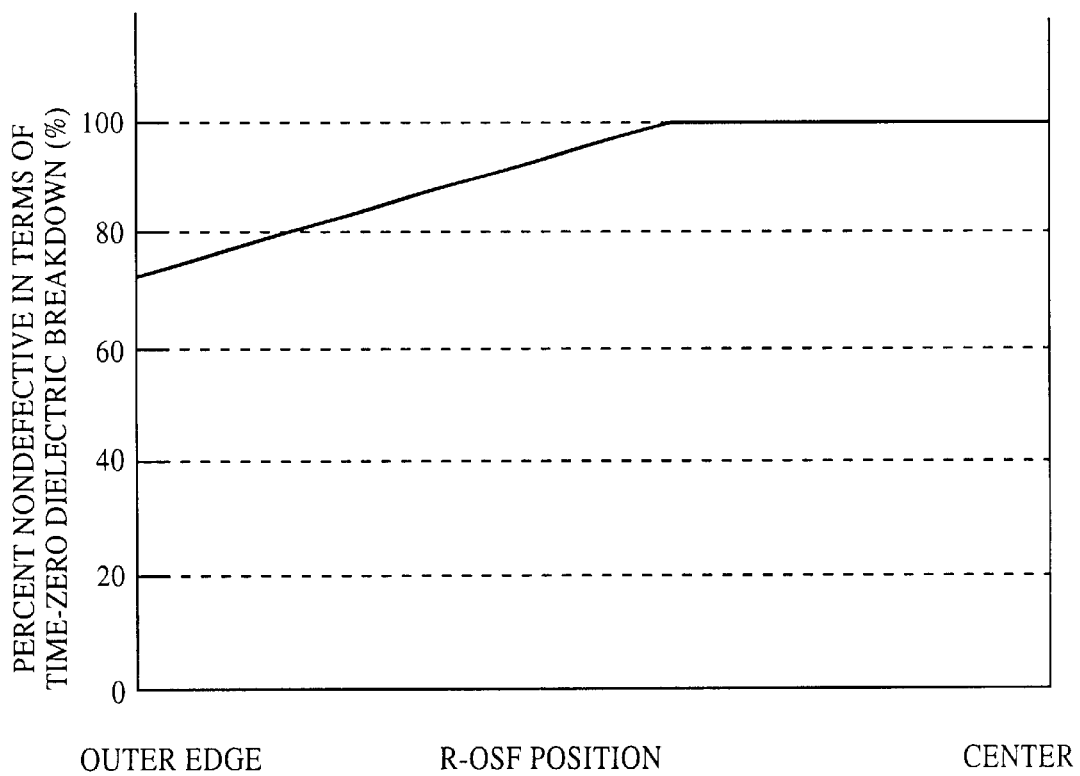
FIG. 8 shows the results of examinations made as to time-zero dielectric breakdown (TZDB) of wafers processed from the single crystal that was produced in accordance with Example 1.

FIG. 8 shows the results of examinations made as to time-zero dielectric breakdown (TZDB) of wafers processed from the single crystal that was produced in accordance with Example 1. That is, FIG. 8 shows an average percent nondefective at every R-OSF position that was varied from the center to the outer edge with the R-OSF width being 30 mm. It can be said from FIG. 8 that the percent nondefective in terms of TZDB in the in-plane crystal area was 95% or more in the case where the thickness of an oxide film was 25 nm, the applied voltage was 8 M/V, the R-OSF position was r=⅓R, and the FPD density was very small.

1-2. EXAMPLE 2

In Example 2, a 6"-diameter crystal was grown at such a pulling rate that the in-plane R-OSF position is r=⅓R, and how R-OSF, a denuded zone, and the FPD density change in accordance with the growing conditions was examined. To do so, the crystal was grown in the same hot zone as in Example 1 so that the amounts of vacancies introduced into an in-plane area of the crystal become uniform.

After stabilizing the melt within the crucible under the same conditions as in Example 1, the power of the heater was adjusted when the single crystal growing process shifted to the body-growing step via the seed-constricting step and the shoulder-forming step, and the single crystal was pulled by a predetermined length under such a condition that the pulling rate is high at the initial stage and thus R-OSF occurs around the outer edge. When pulled to a length of 100 mm, the single crystal was then grown at such a pulling rate that the in-plane R-OSF position is r=⅓R, and the behaviors of R-OSF, the denuded zone, and the FPD formed in the inner region of R-OSF were examined at different sites of the crystal.

The form of R-OSF and how grown-in defects occur were examined by applying Cu onto a wafer processed from the as-grown crystal that was grown in accordance with Example 2, heat-treating it at 900° C. to thereby render visible its defective regions by type, and thereafter taking X-ray topographic pictures. It was verified that the generated R-OSF had a width of 30 mm and its inside diameter was r=⅓R. It is understood from this that the widths of R-OSF and the denuded zone were greatly expanded compared with the conventional crystal.

Figure 9:
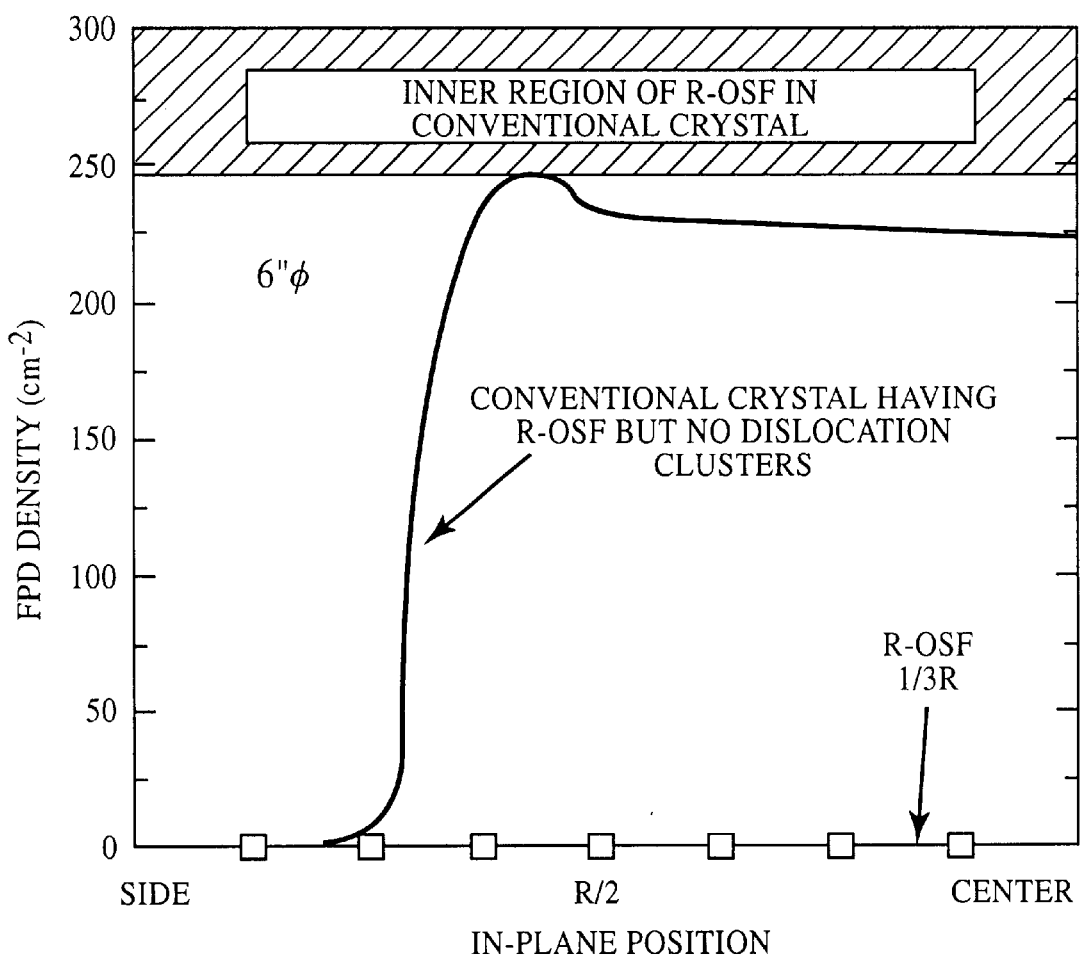
FIG. 9 shows the FPD distribution density in an as-grown crystal that was grown in accordance with Example 2.

FIG. 9 shows the FPD distribution density in the as-grown crystal that was grown in accordance with Example 2. Note that Secco etching was effected to observe the in-plane R-OSF position. Further, the R-OSF width was controlled to 30 mm, which was on the order of 39% of the radius of the crystal. When the in-plane R-OSF position was r=⅓R, no FPD were observed at all, nor were dislocation clusters observed, either.

1-3. EXAMPLE 3

An 8"-diameter single crystal was produced using the single crystal producing apparatus shown in FIG. 1. The crucible was charged with 120 kg of polysilicon that is a raw material for the preparation of a crystal, and boron was further added as a p-type dopant so as to obtain an electrical resistivity of 10 Ωcm. After achieving a 10-torr Ar atmosphere within the chamber, the power of the heater was adjusted so as to melt all the raw material for the crystal. After stabilizing the melt within the crucible, the lower end of a seed crystal was immersed into the melt, and the single crystal was pulled while rotating the crucible and the pulling shaft.

First of all, growing condition changing tests in which the pulling rate was gradually decreased were conducted in order to examine how the widths of R-OSF and a denuded zone change, or how the FPD density changes in accordance with the growing conditions similarly to Example 1.

To carry out these tests, the power of the heater was adjusted when the single crystal growing process shifted to the body-growing step via the seed-constricting step and the shoulder-forming step, and the single crystal was pulled by a predetermined length under such a condition that the pulling rate is high at the initial stage and thus R-OSF occurs around the outer edge. When the single crystal was pulled to a length of 100 mm, the pulling rate was gradually decreased, and the forms of R-OSF and the denuded zone, as well as the behavior of FPD formed in the inner region of R-OSF were examined.

The forms of R-OSF and the denuded zone were examined by splitting the as-grown crystal that was grown in accordance with Example 3 lengthwise, coating the split crystal with Cu, heat-treating it at 900° C. to thereby render visible its defective regions by type, and thereafter taking X-ray topographic pictures. The results were similar to those of Example 1 described previously, and the widths of R-OSF and the denuded zone were greatly expanded compared with the a conventional crystal. The R-OSF width was as wide as 40 mm on one side, totaling 80 mm on both sides. That is, nearly half (39%) of the radius of the 8"-diameter crystal corresponded to the R-OSF region.

FIG. 10 shows the relationship between the in-plane R-OSF position and the FPD distribution density in the as-grown crystal that was grown in accordance with Example 3. Note that Secco etching was effected to observe the in-plane R-OSF position. Further, the R-OSF width was controlled to 40 mm, which was on the order of 39% of the radius of the crystal. As is understood from FIG. 10 that FPD were observed around the center of the crystal when the R-OSF position was r=⅔R, while no FPD were observed when r=⅓R or less. Therefore, by controlling the width and in-plane position of R-OSF while adjusting the growing conditions, one can grow a crystal in the in-plane area of which laser scattering tomography defects (FPD) are present in a markedly smaller density than before or not observed, and grown-in defects such as dislocation clusters are not observed, either.

Figure 11:
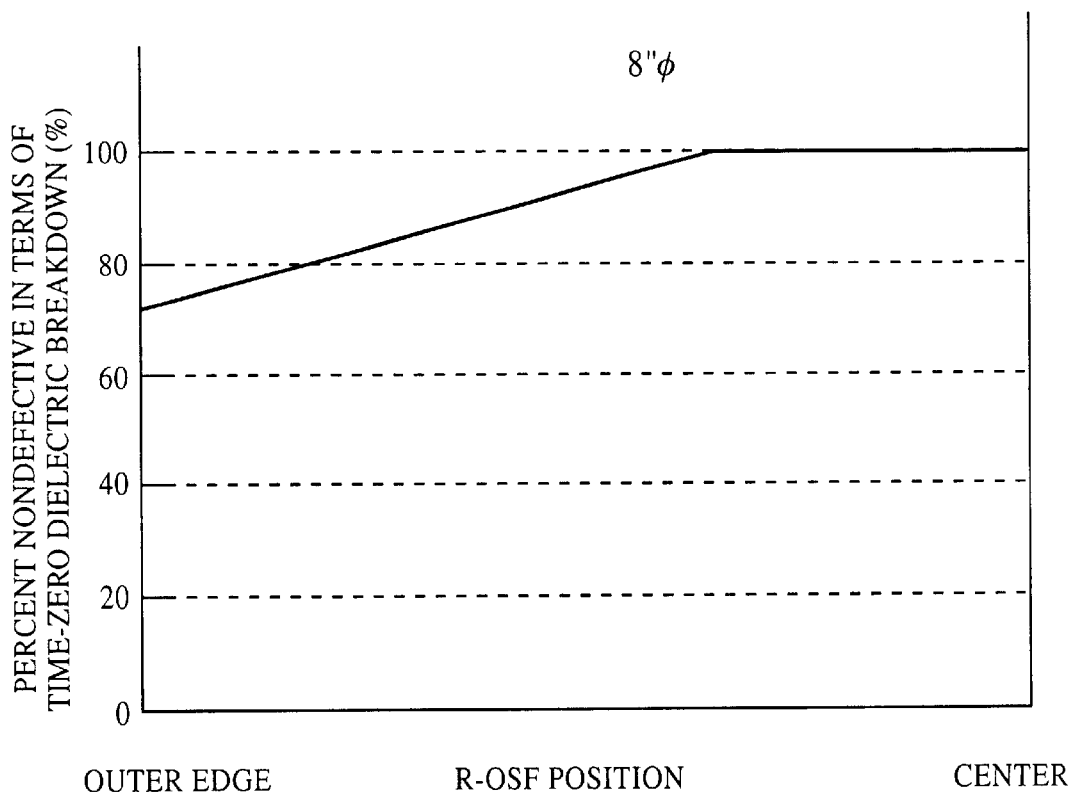
FIG. 11 shows the results of examinations made as to time-zero dielectric breakdown (TZDB) of wafers processed from the single crystal that was produced in accordance with Example 3.

FIG. 11 shows the results of examinations made as to time-zero dielectric breakdown (TZDB) of wafers processed from the single crystal that was produced in accordance with Example 3. That is, FIG. 11 shows an average percent nondefective at every R-OSF position that was varied from the center to the outer edge with the R-OSF width being 40 mm. It can be said from FIG. 11 that the percent nondefective in terms of TZDB in the in-plane crystal area was 95% or more in the case where the thickness of an oxide film was 25 nm, the applied voltage was 8 M/V, the R-OSF position was r=⅓R, and the FPD density was very small.

1-4. EXAMPLE 4

In Example 4, an 8"-diameter crystal was grown at such a pulling rate that the in-plane R-OSF position is r=⅓R, and how R-OSF, a denuded zone, and the FPD density change in accordance with the growing conditions was examined. To do so, the crystal was grown in the same hot zone as in Example 3 so that the amounts of vacancies introduced into an in-plane area of the crystal become uniform.

After stabilizing the melt within the crucible under the same conditions as in Example 3, the power of the heater was adjusted when the single crystal growing process shifted to the body-growing step via the seed-constricting step and the shoulder-forming step, and the single crystal was pulled by a predetermined length under such a condition that the pulling rate is high at the initial stage and thus R-OSF occurs around the outer edge. When pulled to a length of 100 mm, the single crystal was then pulled at such a rate that the in-plane R-OSF position is r=⅓R until the crystal grew to a length of 1000 mm. Thereafter, the behaviors of R-OSF, the denuded zone, and the FPD formed in the inner region of R-OSF were examined at different sites of the crystal.

It was verified that the R-OSF width was 40 mm and its inside diameter was r=⅓R after coating with Cu a wafer processed from the as-grown single crystal that was grown in accordance with Example 4, heat-treating it at 900° C. to thereby render visible its defective regions by type, and thereafter taking X-ray topographic pictures. Similarly to Example 3 described previously, it is understood that the R-OSF width and the denuded zone were greatly expanded compared with the conventional crystal, and that no dislocation clusters occurred.

Figure 12:
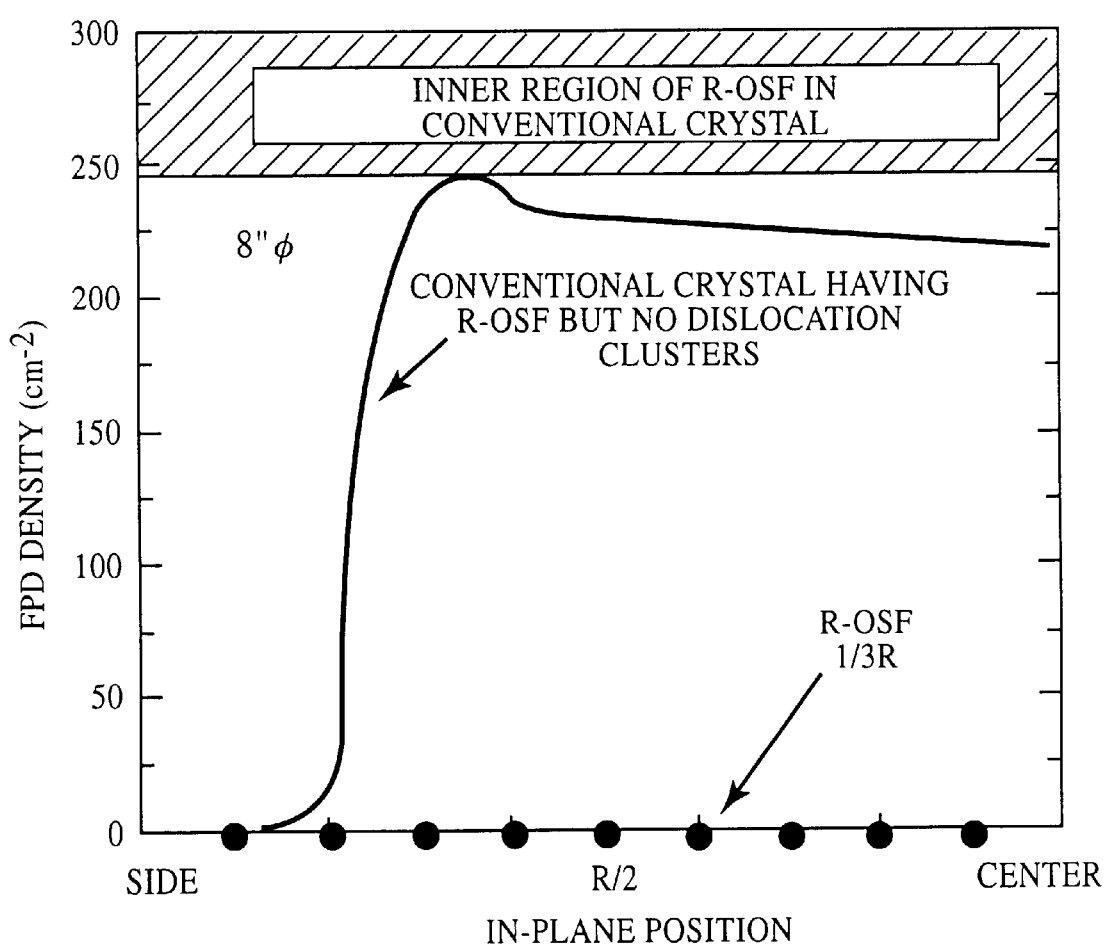
FIG. 12 shows the FPD distribution density in an as-grown crystal that was grown in accordance with Example 4.

FIG. 12 shows the FPD distribution density in the as-grown crystal that was grown in accordance with Example 4. Note that Secco etching was effected to observe the in-plane R-OSF position. Further, the R-OSF width was controlled to 40 mm, which was on the order of 39% of the radius of the crystal. When the in-plane R-OSF position was r=⅓R, neither FPD nor dislocation clusters were observed at all.

As described in the foregoing, according to the first high-quality silicon single crystal of this invention, the width of R-OSF occurring in its in-plane area can be expanded, and regions free of grown-in defects, such as laser scattering tomography defects and dislocation clusters, can also be expanded. Therefore, a semiconducting material excellent in device characteristics can be supplied. In addition, since the single crystal according to this invention is grown by achieving a uniform concentration of point defects introduced into the in-plane area of the crystal, single crystals of a large diameter and a long size can be produced, and thus the production cost can be reduced and the growing efficiency improved.

2. Second High-Quality Silicon Single Crystal

In inventing a second high-quality silicon single crystal, the inventors examined the behavior of R-OSF that appear in the in-plane area of a single crystal in the case where the heat history of each crystal site is changed by changing the pulling rate in the course of growing the single crystal.

Figure 13:
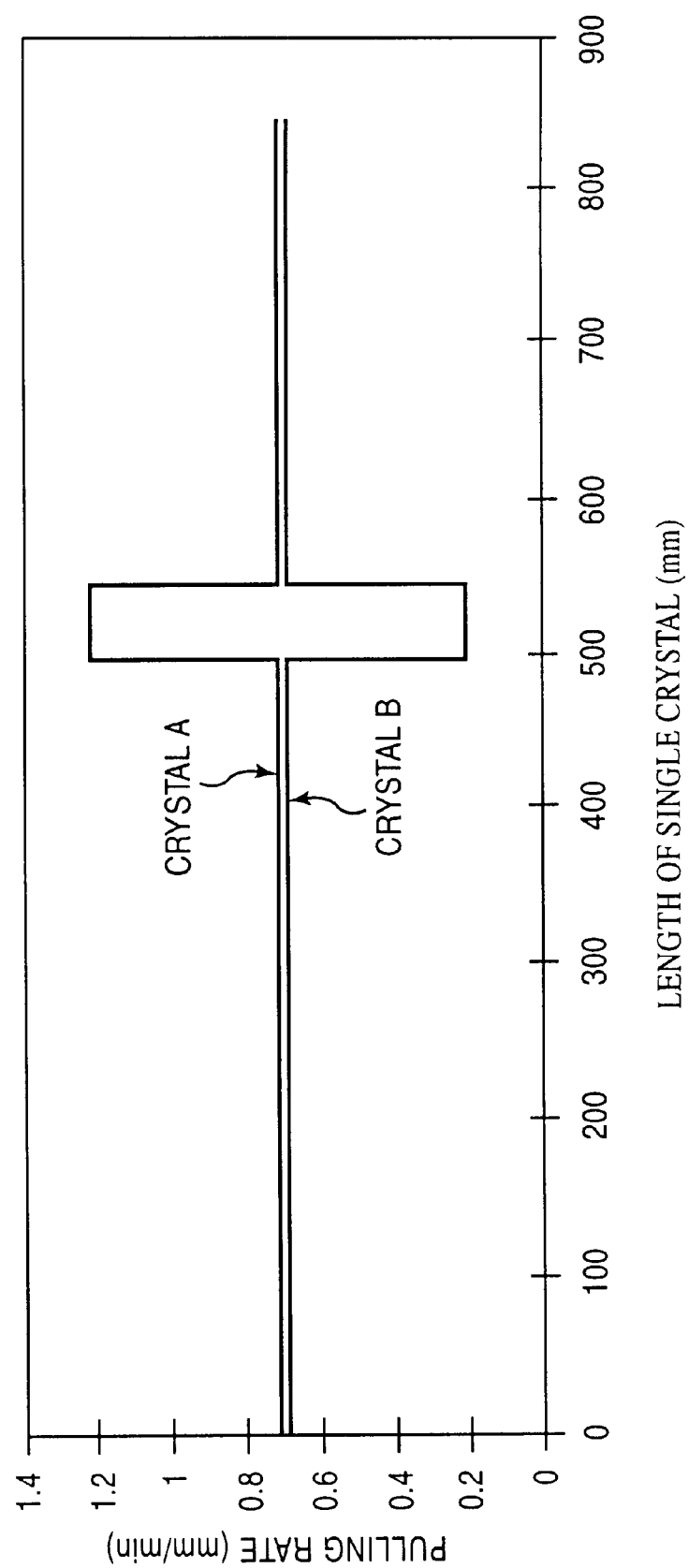
FIG. 13 shows a pulling rate changing pattern in the case where the pulling rate was changed in the course of growing single crystals.

FIG. 13 shows a pulling rate-changing pattern in the case where the pulling rate was changed in the course of growing single crystals. As shown in FIG. 13, a crystal A was grown to a length of 500 mm under such a condition that the initial pulling rate is 0.7 mm/min and R-OSF occur at r=½R. The crystal A was then grown to a length of 550 mm by increasing the pulling rate to 1.2 mm/min, and thereafter the pulling rate was dropped to 0.7 mm/min, at which pulling rate the crystal A was grown until it was subjected to a tail constricting step at a length of 850 mm.

On the other hand, a crystal B was grown to a length of 500 mm under such a condition that the initial pulling rate is 0.7 mm/min and R-OSF occurs at r=½R. The crystal B was then grown to a length of 550 mm by dropping the pulling rate to 0.2 mm/min, and thereafter the pulling rate was increased to 0.7 mm/min, at which pulling rate the crystal B was grown until it was subjected to a tail constricting step at a length of 850 mm.

Figure 14:
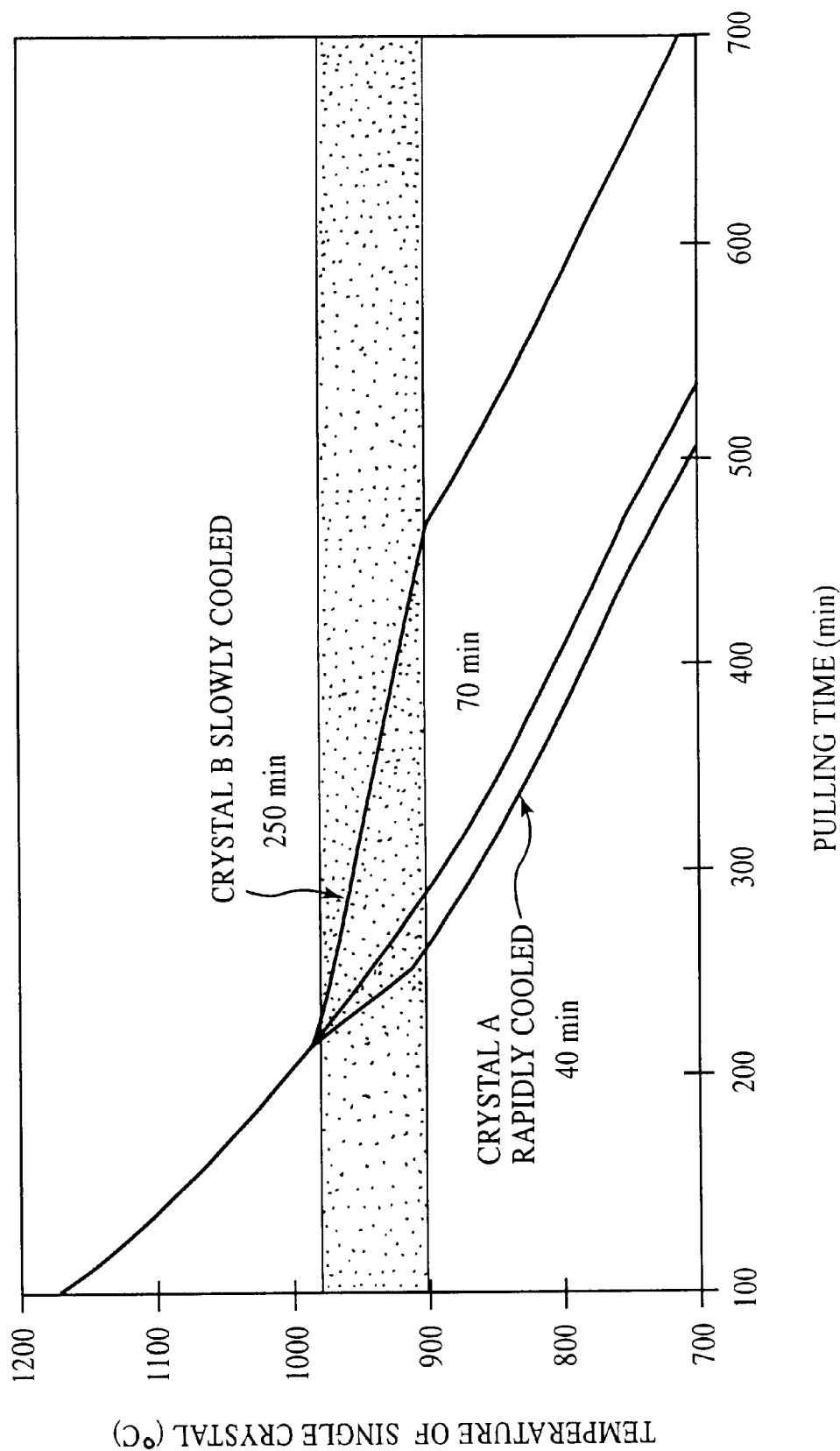
FIG. 14 shows the heat histories of crystals A and B whose pulling rates were changed in the course of their growth.

FIG. 14 shows the heat histories of the crystals A and B in which the pulling rates were changed in the course of their growth. As is apparent from FIG. 14, a site of the crystal A that is located at a position equal to or smaller than a crystal length of 500 mm (the position corresponding to a single crystal length of 350 mm in FIG. 14) is rapidly cooled compared with a crystal that was grown at a constant pulling rate of 0.7 mm/min while such crystal site stays in a predetermined temperature range (980–900° C. in FIG. 14). In contrast, a site of the crystal B that is located at a position equal to or smaller than 500 mm is slowly cooled compared with the crystal that was grown at a constant pulling rate of 0.7 mm/min while such crystal site stays in the predetermined temperature range.

In the above-described examinations of the heat histories, examinations were further made as to the behaviors of R-OSF corresponding to the cases where the crystal sites were cooled at a constant rate, rapidly, and slowly by selecting a high temperature range (1100° C.–1000° C.) and an intermediate temperature range (980° C.–900° C.) as the predetermined temperature ranges of the crystals A and B. As a result, R-OSF did occur at certain widths in the in-plane sites of both crystals that were cooled at the constant rate, respectively. In contrast, the site of the crystal A that was rapidly cooled while staying in the high temperature range (1100° C.–1000° C.) had R-OSF formed whose width was wider than the R-OSF formed in the sites that were cooled at the constant rate, but the site of the crystal A that was rapidly cooled while staying in the intermediate temperature range (980° C.–900° C.) exhibited no R-OSF.

On the other hand, the site of the crystal B that was slowly cooled while staying in the high temperature range (1100° C.–1000° C.) exhibited no R-OSF, but its site that was slowly cooled while staying in the intermediate temperature range (980° C.–900° C.) had R-OSF formed whose width was wider than the R-OSF formed in the sites that were cooled at the constant rate. Therefore, the R-OSF width fluctuated with different heat histories of the crystals in the high and intermediate temperature ranges, and the R-OSF behavior in the crystal A was completely opposite to that in the crystal B in terms of width.

While no clear theory has been established with respect to the above-described behavior, such behavior indicates that the width across which R-OSF occurs in the in-plane area of a wafer depends on the heat histories of a single crystal in the high and intermediate temperature ranges. Further, as single crystals tend to contain less oxygen, R-OSF may not appear conspicuously in some cases, as has been described earlier.

Moreover, to produce a high-quality silicon single crystal excellent in device characteristics, it is important that a uniform concentration of point defects introduced into an in-plane area of a crystal during CZ method-based growth is achieved in such in-plane area. Thus, as previously described, to produce the first high-quality silicon single crystal, temperature gradients in the direction of the pulling shaft are made uniform by improving the growing conditions, and the amounts of vacancies introduced into the in-plane area of the crystal are hence made uniform, whereby the R-OSF width is widened. However, differences in heat history during growth cause the R-OSF width to fluctuate. For example, in the case where the crystal site that stays in the high temperature range (1100° C.–1000° C.) during growth is slowly cooled, the R-OSF width becomes very narrow. On the other hand, in the case where the crystal site that stays in the intermediate temperature range (980° C.–900° C.) during growth is rapidly cooled, the R-OSF width sometimes becomes very narrow, too.

If this is true, it may not be enough, in some cases, to control the growing conditions only in terms of the width across which R-OSF occur in the in-plane area of a crystal as in the first high-quality silicon single crystal. To overcome this situation, it is necessary to propose the second high-quality silicon single crystal so that a high-quality wafer having satisfactory device characteristics can be produced by expanding regions free of grown-in defects such as laser scattering tomography defects and dislocation clusters which deteriorate device characteristics into the whole in-plane area of the crystal independently of the width of R-OSF occurring in the in-plane crystal area of the wafer.

The second high-quality silicon single crystal of this invention has been invented on the basis of the above-described viewpoint. It is a silicon single crystal grown by CZ method, and includes a silicon single crystal in which any of "the outside diameter of a region where R-OSF occurs," "the inside diameter of an oxygen precipitation-promoting region," and "the outside diameter of a ring-like region where the amount of oxygen precipitates is small" is in a range of 0–80% of the diameter of the grown crystal.

In the second high-quality silicon single crystal, the reason why "the outside diameter of a region where R-OSF occurs" or "the inside diameter of an oxygen precipitation-promoting region" is used as a reference of the R-OSF position is as follows. Since the width across which R-OSF occurs in the in-plane area of a wafer depends on the heat histories of a single crystal when the crystal stays in the high and intermediate temperature ranges, the R-OSF position is controlled by getting rid of these factors. Further, the reason why "the outside diameter of a ring-like region where the amount of oxygen precipitates is small" is used as a reference is because considerations are given to cases where R-OSF may not appear conspicuously as single crystals tend to contain less oxygen.

Furthermore, the reason why the R-OSF position is limited within the range of 0–80% of the diameter of the grown crystal is because within such a range, grown-in defects can be reduced to an extremely small level or eliminated.

To evaluate the quality of the second high-quality silicon single crystal, single crystals were produced in two different diameters, 6" and 8", and the forms of R-OSF appearing on these crystals and the quality characteristics of these crystals were examined as Examples 5 to 8. The results will be described below in comparison with the first high-quality silicon single crystal wafers.

2-1. EXAMPLE 5

A 6"-diameter single crystal was produced using the single crystal producing apparatus shown in FIG. 1. The crucible was charged with 60 kg of polysilicon that is a raw material for the preparation of a crystal, and boron was further added as a p-type dopant so as to obtain an electrical resistivity of 10 Ωcm. After achieving an Ar atmosphere within the chamber, the power of the heater was adjusted so as to melt all the raw material for the crystal. After stabilizing the melt within the crucible, the lower end of a seed crystal was immersed into the melt, and the single crystal was pulled while rotating the crucible and the pulling shaft.

In Example 5, it is an object to examine how the widths of R-OSF and a denuded zone change, or how the FPD density changes under such a condition that a site of a single crystal is slowly cooled while staying in the temperature range of 1100° C.–1000° C., compared with the conventional growing conditions. To do so, pulling rate changing tests were conducted by improving the conventional temperature distribution in an in-plane crystal area so that the amounts of vacancies introduced into the in-plane crystal area become uniform, and by growing the single crystal in a hot zone where the crystal can be slowly cooled while it stays in a predetermined temperature range.

Examinations were made as to the form of R-OSF by splitting the as-grown crystal that was grown in accordance with Example 5 lengthwise, coating the split crystal with Cu, heat-treating it at 900° C. to thereby render visible its defective regions by type, and thereafter taking X-ray topographic pictures. Compared with the conventional crystal, the R-OSF width and the denuded zone were greatly expanded. The R-OSF width fluctuated from a maximum of 40 mm to about 6 mm depending on the single crystal length. Even if R-OSF did occur in the in-plane crystal area, the outer region of R-OSF similarly expanded, and thus no dislocation clusters occurred. Further, even when R-OSF disappeared into the in-plane crystal area, no dislocation clusters occurred. That is, the silicon single crystal wafer of this invention can suppress the formation of grown-in defects by controlling where the outside diameter or the inside diameter of R-OSF is located without depending on the R-OSF width.

The FPD distribution density in the as-grown crystal that was grown in accordance with Example 5 was similar to that shown in FIG. 7 described previously. That is, FPD were observed around the center of the crystal when the in-plane R-OSF position was r=⅔R, while no FPD were observed when the R-OSF position was changed to r=⅓R.

The results of examinations made as to time-zero dielectric breakdown TZDB) of wafers processed from the single crystal that was produced in accordance with Example 5 was similar to those of FIG. 8 described previously.

Specifically, an average percent nondefective in terms of in-plane TZDB at the position where R-OSF were present was 95% or more in the case where the thickness of an oxide film was 25 nm, the applied voltage was 8 M/V, the R-OSF position was r=⅓R, and the FPD density was very small.

2-2. EXAMPLE 6

In Example 6, examinations were made as to how the widths of R-OSF, the oxygen precipitation-promoting region, or a denuded zone change in accordance with the growing conditions in the case where an 6"-diameter crystal was grown at such a growing rate that the R-OSF position becomes r=⅓R while maintaining such a growing rate almost constant during the body forming step in a hot zone of a growing furnace where the conventional in-plane temperature distribution within the crystal is improved so that the amounts of introduced point defects become uniform, and in which the conventional growing conditions are changed so that the crystal is slowly cooled while staying in the temperature range of 1100° C.–1000° C.

After stabilizing the melt within the crucible under the same conditions as in Example 5, the power of the heater was adjusted when the single crystal growing process shifted to the body-growing step via the seed-constricting step and the shoulder-forming step, and the single crystal was pulled by a predetermined length under such a condition that the pulling rate is high at the initial stage and thus R-OSF occurs around the outer edge. When pulled to a length of 100 mm, the single crystal was grown at such a pulling rate that the in-plane R-OSF position is r=⅓R, and examinations were then made as to the behaviors of R-OSF, the denuded zone, and the FPD formed in the inner region of R-OSF at different sites of the crystal.

The form of R-OSF and how grown-in defects occur were examined by coating with Cu onto a wafer processed from the as-grown crystal that was grown in accordance with Example 6, heat-treating it at 900° C. to thereby render visible its defective regions by type, and thereafter taking X-ray topographic pictures. It was found out that the R-OSF width was narrower but the oxygen precipitation-promoting region or the denuded zone was greatly expanded, compared with the conventional crystal. Further, it was also verified that even if the R-OSF region moved inward, no dislocation clusters occurred.

Figure 15:
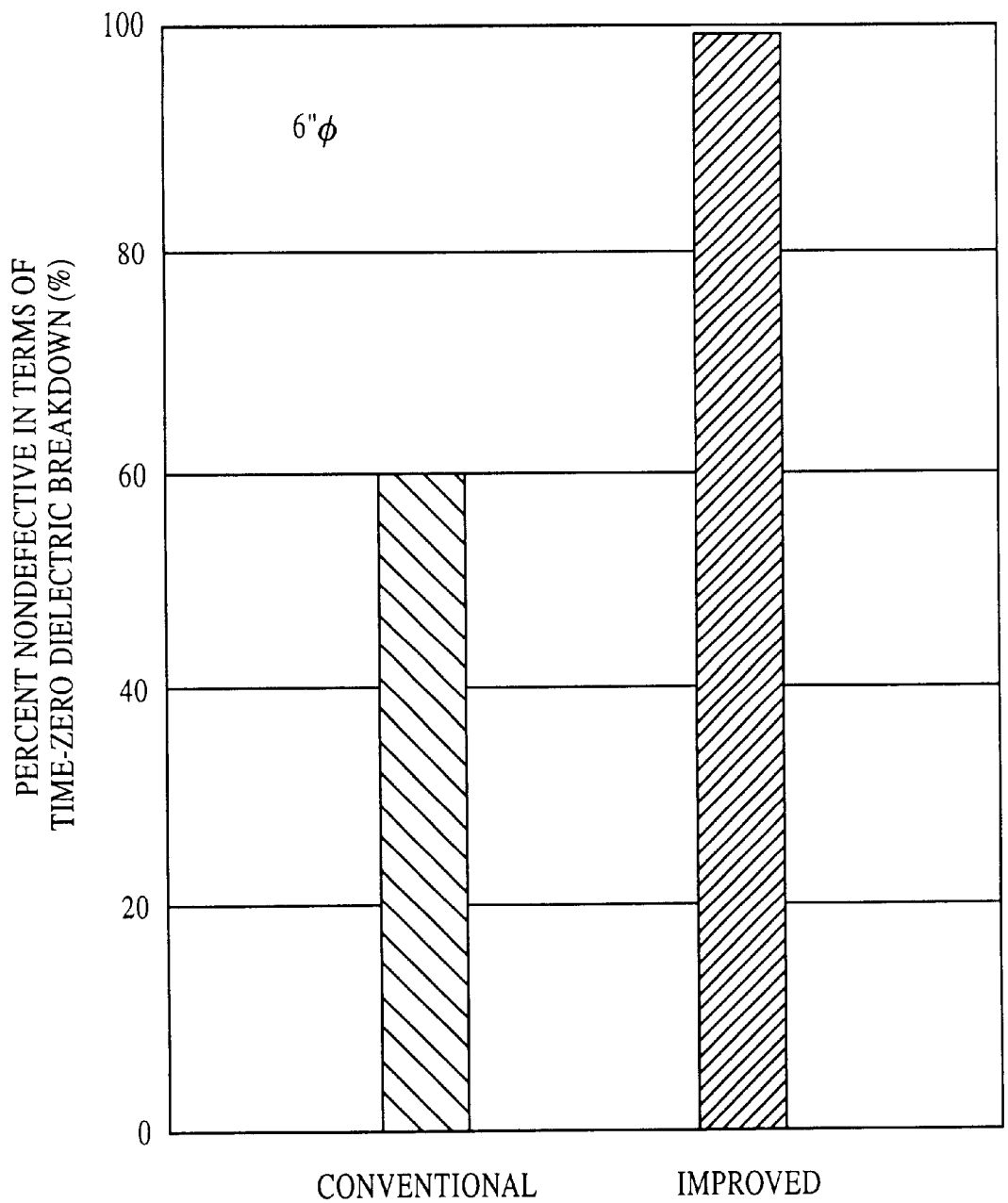
FIG. 15 shows the results of examinations made as to time-zero dielectric breakdown (TZDB) of wafers processed from a single crystal that was produced in accordance with Example 6.

The FPD distribution density in the as-grown crystal that was grown in accordance with Example 6 was similar to that of FIG. 9 described previously. Neither FPD nor dislocation clusters were observed when the R-OSF position was r=⅓R FIG. 15 shows the results of examinations made as to time-zero dielectric breakdown (TZDB) of the wafers processed from the single crystal that was produced in accordance with Example 6. The percent nondefective in terms of TZDB in the in-plane crystal area was 95% or more in the case where the thickness of an oxide film was 25 nm, the applied voltage was 8 M/V, the R-OSF position was r=⅓R and the FPD density was very small.

2-3. EXAMPLE 7

An 8"-diameter single crystal was produced using the single crystal producing apparatus shown in FIG. 1. The crucible was charged with 120 kg of polysilicon that is a raw material for the preparation of a crystal, and boron was further added as a p-type dopant so as to obtain an electrical resistivity of 10 Ωcm. After achieving an Ar atmosphere within the chamber, the power of the heater was adjusted so as to melt all the raw material for the crystal. After stabilizing the melt within the crucible, the lower end of a seed crystal was immersed into the melt, and the single crystal was pulled while rotating the crucible and the pulling shaft.

In Example 7, it is an object to examine how the widths of R-OSF and a denuded zone change, or how the FPD density changes in the case where the conventional growing conditions are changed so that a crystal is rapidly cooled while staying in the temperature range of 980° C.–900° C. To do so, pulling rate changing tests were conducted by improving the conventional temperature distribution in an in-plane crystal area so that the amounts of vacancies introduced into the in-plane crystal area become uniform, and by growing the single crystal in a hot zone where the crystal can be rapidly cooled while staying in a predetermined temperature range.

The form of R-OSF was examined by splitting the as-grown crystal that was grown in accordance with Example 7 lengthwise, coating the split crystal with Cu, heat-treating it at 900° C. to thereby render visible its defective regions by type, and thereafter taking X-ray topographic pictures. Compared with the conventional crystal, the R-OSF width and the denuded zone were greatly expanded. The R-OSF width fluctuated from a maximum of 40 mm to about 4 mm depending on the single crystal length. Even if R-OSF did occur in the in-plane crystal area, the outer region of R-OSF similarly expanded, and thus no dislocation clusters occurred. Further, even when R-OSF disappeared into the in-plane crystal area, no dislocation clusters occurred. That is, the silicon single crystal wafer of this invention can expand regions where no grown-in defects are observed into the in-plane crystal area by controlling where the outside diameter or the inside diameter of R-OSF is located.

The relationship between the in-plane R-OSF position and the FPD distribution density in the as-grown crystal that was grown in accordance with Example 7 was similar to that shown in FIG. 10 described previously. That is, it is understood that FPD were observed around the center of the crystal when the R-OSF position was r=⅔R, and no FPD were observed when r=⅓R or less. Therefore, by controlling the in-plane position of the outside diameter or the inside diameter of R-OSF while adjusting the growing conditions, one can grow a crystal in the in-plane area of which laser scattering tomography defects (FPD) are present at a markedly smaller density or not observed, and grown-in defects such as dislocation clusters are not observed.

When examinations were made as to time-zero dielectric breakdown (TZDB) of the wafers processed from the single crystal that was produced in accordance with Example 7, their results were similar to those of FIG. 15 described previously. The percent nondefective in terms of TZDB in the in-plane crystal area was 95% or more in the case where the thickness of an oxide film was 25 nm, the applied voltage was 8 M/V, the R-OSF position was r=⅓R, and the FPD density was very small.

2-4. EXAMPLE 8

In Example 8, examinations were made as to how R-OSF and a denuded zone change and how the FPD density changes in accordance with the growing conditions by growing an 8"-diameter single crystal at such a pulling rate that the in-plane R-OSF position is r=⅓R. To do so, the crystal was grown in a hot zone of the growing furnace where the conventional in-plane temperature distribution within the crystal is improved so that the amounts of introduced point defects become uniform and in which the conventional growing conditions are changed so that the crystal is rapidly cooled while staying in the temperature range of 980° C.–900° C.

After stabilizing the melt within the crucible under the same conditions as in Example 7, the power of the heater was adjusted when the single crystal growing process shifted to the body-growing step via the seed-constricting step and the shoulder-forming step, and the single crystal was pulled by a predetermined length under such a condition that the pulling rate is high at the initial stage and thus R-OSF occurs around the outer edge. When pulled to a length of 100 mm, the single crystal was grown to a length of 1000 mm at such a pulling rate that the in-plane R-OSF position is r=⅓R, and examinations were then made as to the behaviors of R-OSF, the denuded zone, and the FPD formed in the inner region of R-OSF at different sites of the crystal.

A wafer processed from the as-grown crystal that was grown in accordance with Example 8 was coated with Cu, heat-treated at 900° C. to thereby render visible its defective regions by type, and thereafter had X-ray topographic pictures taken. When comparisons were made with the conventional crystal, it was verified that the R-OSF width was narrower but the denuded zone was greatly expanded and that no dislocation clusters were formed even if R-OSF occurred in the in-plane crystal area.

The FPD distribution density in the as-grown crystal that was grown in accordance with Example 8 was similar to that of FIG. 12 described previously. When the R-OSF position was r=⅓R, no FPD were observed inside R-OSF and no dislocation clusters were observed outside R-OSF. Therefore, by adjusting the growing conditions, one can obtain a crystal in the in-plane area of which the densities of laser scattering tomography defects (FPD, COP) and dislocation clusters are extremely small.

Examinations were also made as to time-zero dielectric breakdown (TZDB) of the wafers processed from the single crystal that was produced in accordance with Example 8. Their results were similar to those in Example 7. That is, the percent nondefective in terms of TZDB in the in-plane crystal area was 95% or more in the case where the thickness of an oxide film was 25 nm, the applied voltage was 8 M/V, the R-OSF position was r=⅓R, and the FPD density was very small.

As described in the foregoing, according to the second high-quality silicon single crystal of this invention, the position where R-OSF occurs can be controlled and regions denuded of laser scattering tomography defects and dislocation clusters, which are grown-in defects, can be expanded, independently of the width of R-OSF occurring in its in-plane area as well as even when R-OSF do not appear conspicuously due to low oxygen contents of the crystal. Therefore, a semiconducting material excellent in device characteristics can be supplied efficiently.

3. Third High-Quality Silicon Single Crystal and Method of Producing the Same

In inventing third high-quality silicon single crystal wafers, the inventors made examinations as to how dislocation clusters occur in relation to the position and width of R-OSF occurring in a single crystal wafer that was grown under the conventional conditions.

According to the results of the above-described examinations, under the conventional growing conditions, dislocation clusters begin to grow in the outer region of R-OSF when the in-plane R-OSF position is r=⅔R, and dislocation clusters usually exist when r=½R or less. By the way, when the inner region of R-OSF narrows as r=½R or less, the density of laser scattering tomography defects occurring in the inner region can be decreased, and thus time-zero dielectric breakdown (TZDB) can be improved. If the formation of dislocation clusters can be suppressed at the same time, not only time-zero dielectric breakdown (TZDB) but also device characteristics can be improved.

As a result of further investigations made based on the above-described viewpoint, the inventors were successful in decreasing the density of grown-in defects in the whole in-plane crystal area by expanding a denuded zone free of dislocation clusters in the outer region of R-OSF compared with the single crystal wafer grown under the conventional conditions. Specifically, when a single crystal was grown based on the CZ method, the formation of dislocation clusters was suppressed by controlling the temperature distribution in the single crystal while the crystal stays in the temperature range of the solidifying interface temperature (melting point) to 1250° C. and the heat history of the single crystal in the temperature range of 1250° C.–1000° C. so that concentrations of vacancies and interstitial silicon (Si) atoms introduced into an in-plane area of the crystal become equal and uniform in the in-plane area as much as possible.

That is, finding out that laser scattering tomography defects occur in a region where the vacancy concentration exceeds the interstitial Si atom concentration, and dislocation clusters occur in a region where the interstitial Si atom concentration exceeds the vacancy concentration, the formation of grown-in defects was suppressed by minimizing differences between the vacancy concentration and the interstitial Si atom concentration in the in-plane crystal area of a wafer.

The third high-quality silicon single crystal of this invention has been accomplished on the basis of such findings. It is a silicon single crystal grown under such a condition that the crystal stays in a temperature range of 1250° C.–1000° C. for 7 hours or more when pulled by a CZ method, and is characterized in that any of "the outside diameter of R-OSF," "the inside diameter or the outside diameter of an oxygen precipitation-promoting region," "the outside diameter of a ring-like region where the amount of oxygen precipitates is small," and "the outside diameter of a circular region where laser scattering tomography defects are detected" is within a range of 0–60% of the diameter of the grown crystal.

In the third high-quality silicon single crystal, the reason why "the inside diameter or the outside diameter of an oxygen precipitation-promoting region" and "the outside diameter of a circular region where laser scattering tomography defects are detected" are used as references of the R-OSF position, in addition to "the outside diameter of R-OSF," is as follows. Since fluctuations in the width of R-OSF occurring in an in-plane area of a wafer and irregular behaviors of R-OSF appearing at one time and disappearing at another depend on the heat history of the crystal during growth, the R-OSF position is controlled by getting rid of these factors. Further, the reason why "the outside diameter of R-OSF" is used as a reference is because where its outside diameter is located remains unchanged even if the R-OSF width changes in dependence on the heat history. The reason why "the inside diameter or the outside diameter of an oxygen precipitation-promoting region" is used as a reference is because considerations are given for cases where the inside diameter of the oxygen precipitation promoting region cannot be used as a reference due to the fact that the inside diameter of the oxygen precipitation promoting region has disappeared into the in-plane crystal area. Further, the reason why "the outside diameter of a ring-like region where the amount of oxygen precipitates is small" is used as a reference is because considerations are given for cases where R-OSF may not appear conspicuously as single crystals tend to contain less oxygen.

Figure 2:
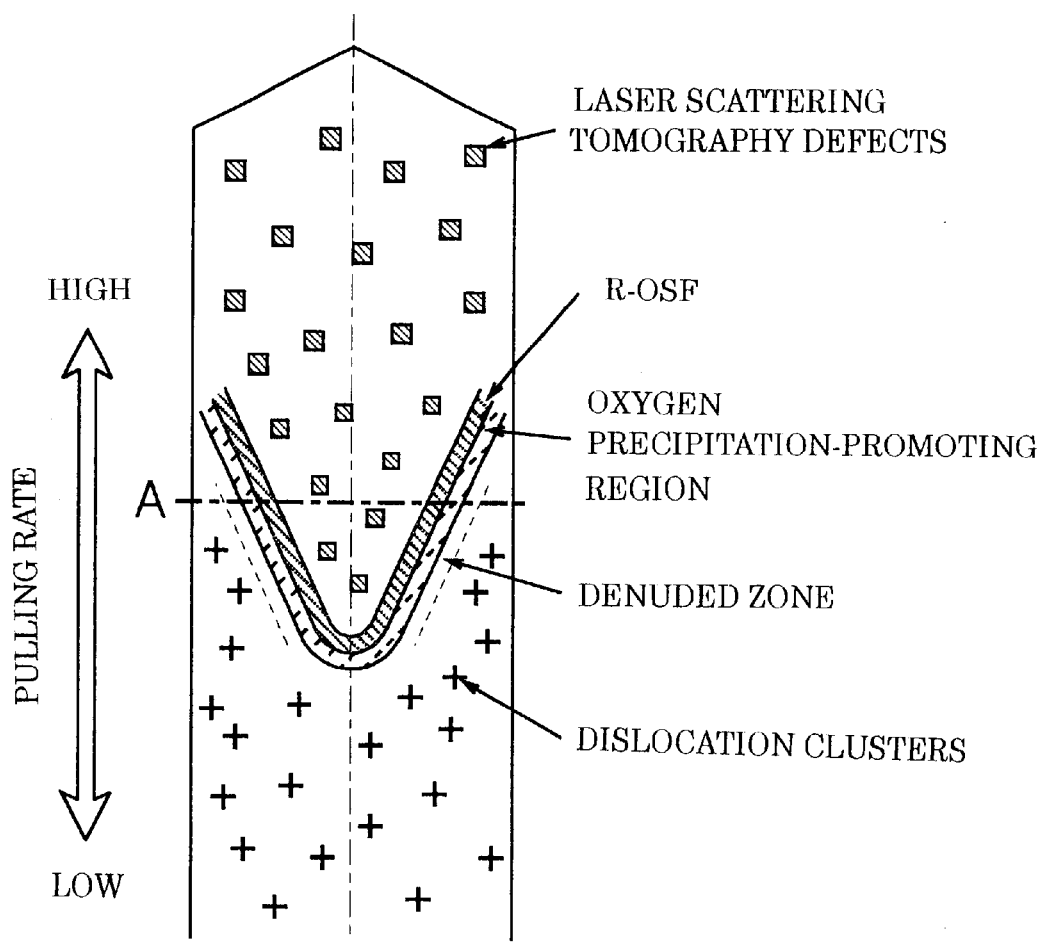
FIG. 2 schematically illustrates a generally observed relationship between the pulling rate during single crystal growth and the positions where crystal defects occur, and FIG. 3 schematically illustrates an example of a typical distribution of defects observed at an in-plane position A of the crystal of FIG. 2.

Furthermore, the reason why the R-OSF position is limited within the range of 0–60% of the diameter of the grown crystal is because within such a range, grown-in defects can be reduced to an extremely small level or eliminated. Usually, the growing rate is controlled so that R-OSF is located at a predetermined position with respect to the diameter of the crystal. To effect proper growing rate control, growing rate changing tests are conducted in accordance with a predetermined single crystal producing apparatus and growing conditions so that the relationship between the growing rate and the R-OSF position corresponding to FIG. 2 described previously can be grasped in advance.

In the third high-quality silicon single crystal, it is required that the heat history of the crystal while the crystal stays in the temperature range of 1250° C.–1000° C. be controlled during growth based on the CZ method so that concentrations of vacancies and interstitial silicon (Si) atoms introduced into an in-plane crystal area become as uniform as possible over the whole in-plane area. At that time, the temperature distribution of the single crystal being grown influences the concentration of vacancies introduced into the in-plane crystal area.

FIG. 16 illustrates the temperature distribution of a single crystal being grown and the behavior of vacancies resulting from such temperature distribution. FIG. 16(a) shows how a single crystal is being grown in the case where temperature gradients in the axial direction are large, and FIG. 16(b) how a single crystal is being grown in the case where the same temperature gradients are small. In the single crystal shown in (a) has large temperature gradients in the axial direction, and thus temperature drops are larger toward the outer edge of the crystal, and isotherms on the single crystal exhibit larger temperature gradients toward the outer edge. In contrast, the single crystal shown in (b) has small temperature gradients in the axial direction, and thus temperature gradients in the axial direction are small at the outer edge of the crystal with isotherms being either flat ideally, or convex toward the melt (hereinafter referred to simply as "downwardly convex").

Under large temperature gradients as shown in FIG. 16(a), vacancies that are introduced into the in-plane crystal area disappear in large amounts due to up-hil diffusion in which an axial diffusion of vacancies occur toward the solid-melt interface, and thus the concentration of vacancies held in the in-plane crystal area become small. In this case, concentrations of vacancies that are introduced into the in-plane crystal area are not the same due to the fact that temperature gradients in the axial direction differ in the radial direction. Thus, vacancy concentrations are lower toward the outer edge where there are marked temperature drops. On the other hand, under small temperature gradients as shown in FIG. 16(b), vacancy concentrations in the in-plane crystal area become uniform, and their concentration distribution in the radial direction is also stabilized.

FIG. 17 shows how the concentration distributions of vacancies and interstitial Si atoms in an in-plane area of a single crystal change near the solid-melt interface and in the range of the melting point to 1250° C. during single crystal growth. FIG. 17(a) shows the concentration distributions near the solid-melt interface; and FIGS. 17(b) and(c) show how the concentration distributions change in the temperature range of the melting point to 1250° C. In each drawing, the vacancy concentration is indicated by $C_V$ and the interstitial Si atom concentration by $C_I$.

As shown in FIG. 17(a), first, vacancies and interstitial Si atoms are introduced into an in-plane crystal area near the interface between solid and melt. In this case, both vacancies and interstitial Si atoms are introduced at thermal equilibrium concentrations at the solid-melt interface. Since the thermal equilibrium concentration of vacancies exceeds that of interstitial Si atoms, the vacancy concentration exceeds the interstitial Si atom concentration.

Next, when the temperature of the single crystal being grown is in the range of the melting point to 1250° C., the up-hil diffusion of vacancies in the axial direction and their concentration gradient diffusion in the radial direction are promoted, as shown in FIG. 17(b), because the diffusion coefficient of vacancies exceeds that of interstitial Si atoms. Further, vacancies diffuse more markedly in both axial and radial directions with decreasing growing rate. As a result, concentrations of vacancies in the in-plane crystal area are decreased due to their disappearance caused by their axial up-hil diffusion toward the solid-melt interface, and their concentrations are further decreased at the outer edge of the crystal by their concentration gradient diffusion in the radial direction. On the other hand, interstitial Si atoms remain in the in-plane crystal area and their concentrations do not drop so much at the outer edge of the crystal in the temperature range of the melting point to 1250° C. because their diffusion coefficient is smaller than the diffusion coefficient of vacancies and thus their axial up-hil diffusion occurs only to a small degree in such temperature range.

Therefore, when the growing rate is kept low, the vacancy concentration exceeds the interstitial Si atom concentration in the inner side of the crystal, and the latter may exceed the former at the outer edge of the crystal in some cases as shown in FIG. 17(c). From the previously described presumption that dislocation clusters would be an agglomerate of excessive interstitial Si atoms, drawn is a conclusion that dislocation clusters are formed in the outer edge region of the crystal where the interstitial Si atom concentration exceeds the vacancy concentration as described above as the crystal is gradually cooled (about 1000° C.).

Further, when the single crystal temperature is in the range of 1250° C.–1000° C., particularly, near 1250° C., as the growing process proceeds, the diffusion coefficient of interstitial Si atoms exceeds that of vacancies. Thus, by allowing the crystal to stay in this temperature range for a prolonged period, concentration gradient diffusion of interstitial Si atoms can be promoted at the outer edge of the crystal. Therefore, even if the interstitial Si atom concentration exceeds the vacancy concentration at the outer edge of the crystal as shown in FIG. 17(c) described above, if the single crystal is slowly cooled while it stays in the temperature range of 1250° C.–1000° C., diffusion of interstitial Si atoms in the radial direction can be encouraged to thereby decrease their concentrations, and thus the region where interstitial Si atoms are excessively present can be reduced. As a result, the formation of dislocation clusters in the outer edge region of the crystal can be suppressed.

In the third high-quality silicon single crystal, it is required that the crystal stay in the temperature range of 1250° C.–1000° C. for 7 hours or more while it is being pulled. In Example 9, which will be described later, at a site of a crystal that is slowly cooled under such a condition the crystal stays in the target high temperature range for 8 hours, the formation of dislocation clusters is suppressed, and a denuded zone outside R-OSF is greatly expanded. Further, it has been verified from the results of various tests that the formation of dislocation clusters is eliminated by causing the crystal to stay in the temperature range of 1250° C.–1000° C. for 7 hours or more.

It is as described earlier that in an in-plane crystal area of a wafer, laser scattering tomography defects occur in the region where the vacancy concentration exceeds the interstitial Si atom concentration and that dislocation clusters occur in the region where the interstitial Si atom concentration exceeds the vacancy concentration. By the way, in an in-plane crystal region where differences between the vacancy concentration and the interstitial Si atom concentration are small, both types of point defects are re-combined and disappear, so that grown-in defects are no longer formed in such crystal in-plane region. In order to form such a region where differences between the vacancy concentration and the interstitial Si atom concentration are small, it is required that concentrations of vacancies introduced into the in-plane crystal area be not only uniform but also approximated to the concentration distribution of interstitial Si atoms.

To achieve the above-described concentration distribution, it is required that the temperature gradient in the axial direction be small at the outer edge by making the isotherms of a single crystal flat or downwardly convex while the crystal stays in the temperature range of the solidifying interface temperature (melting point) to 1250° C., as shown in FIG. 16(b) described previously. As a result of this arrangement, the concentration distribution of vacancies held in the in-plane crystal area becomes uniform in the whole in-plane area due to their up-hil diffusion occurring in this temperature range. On the other hand, axial up-hil diffusion of interstitial Si atoms occurs only to a small degree and their concentrations do not drop so much at the outer edge because their diffusion coefficient is smaller than the diffusion coefficient of vacancies in the temperature range of the solidifying interface temperature (melting point) to 1250° C., and thus differences between the vacancy concentration and the interstitial Si atom concentration can be decreased. Therefore, in growing a silicon single crystal wafer of this invention, it is desirable to make the isotherms in the single crystal flat or downwardly convex in the temperature range of the solidifying interface temperature (melting point) to 1250° C.

In the silicon single crystal wafer of this invention, the formation of dislocation clusters appearing outside R-OSF can be suppressed and thus regions free of grown-in defects can be expanded by improving the growing conditions as described above. As a result, regions where laser scattering tomography defects and dislocation clusters, which deteriorate device characteristics, occur can be driven out of the in-plane area of the wafer, and thus one can obtain high-quality silicon single crystal wafers that can exhibit excellent characteristics.

To evaluate the third high-quality silicon single crystal, 8"-diameter silicon single crystals were produced, and the form of R-OSF and how crystal defects occur were examined based on Examples 9 to 12.

3-1. EXAMPLE 9

An 8"-diameter single crystal was produced using the single crystal producing apparatus shown in FIG. 1. The crucible was charged with 120 kg of polysilicon that is a raw material for the preparation of a crystal, and boron was further added as a p-type dopant so as to obtain an electrical resistivity of 10 Ωcm. After achieving an Ar atmosphere within the chamber, the power of the heater was adjusted so as to melt all the raw material for the crystal. After stabilizing the melt within the crucible, the lower end of a seed crystal was immersed into the melt, and the single crystal was pulled while rotating the crucible and the pulling shaft.

In Example 9, in order to examine how the behavior of dislocation clusters in their formation changes in accordance with the growing conditions, the crystal was grown to a body length of 500 mm at a predetermined growing rate under such a condition that R-OSF is located at r=⅔R and thus dislocation clusters are located in the outer region of R-OSF. When the single crystal pulling process shifted to the body-growing step via the seed-constricting step and the shoulder-forming step, the single crystal was pulled by a predetermined length while adjusting the pulling rate and the power of the heater so that the diameter of the crystal can be maintained.

When the single crystal was pulled to a length of 500 mm, the crystal growing process was stopped for a predetermined time interval, and the crystal was slowly cooled in each of the temperature ranges during growth. Thereafter, the crystal growing process was resumed, and shifted to the tail-constricting step when the single crystal was pulled to a length of 1000 mm. Through these process steps, how these process steps affect the behavior of dislocation clusters in their formation was examined. For purposes of comparison, a single crystal that was grown at a constant pulling rate without stoppage was also prepared as a comparative example.

Figure 18:
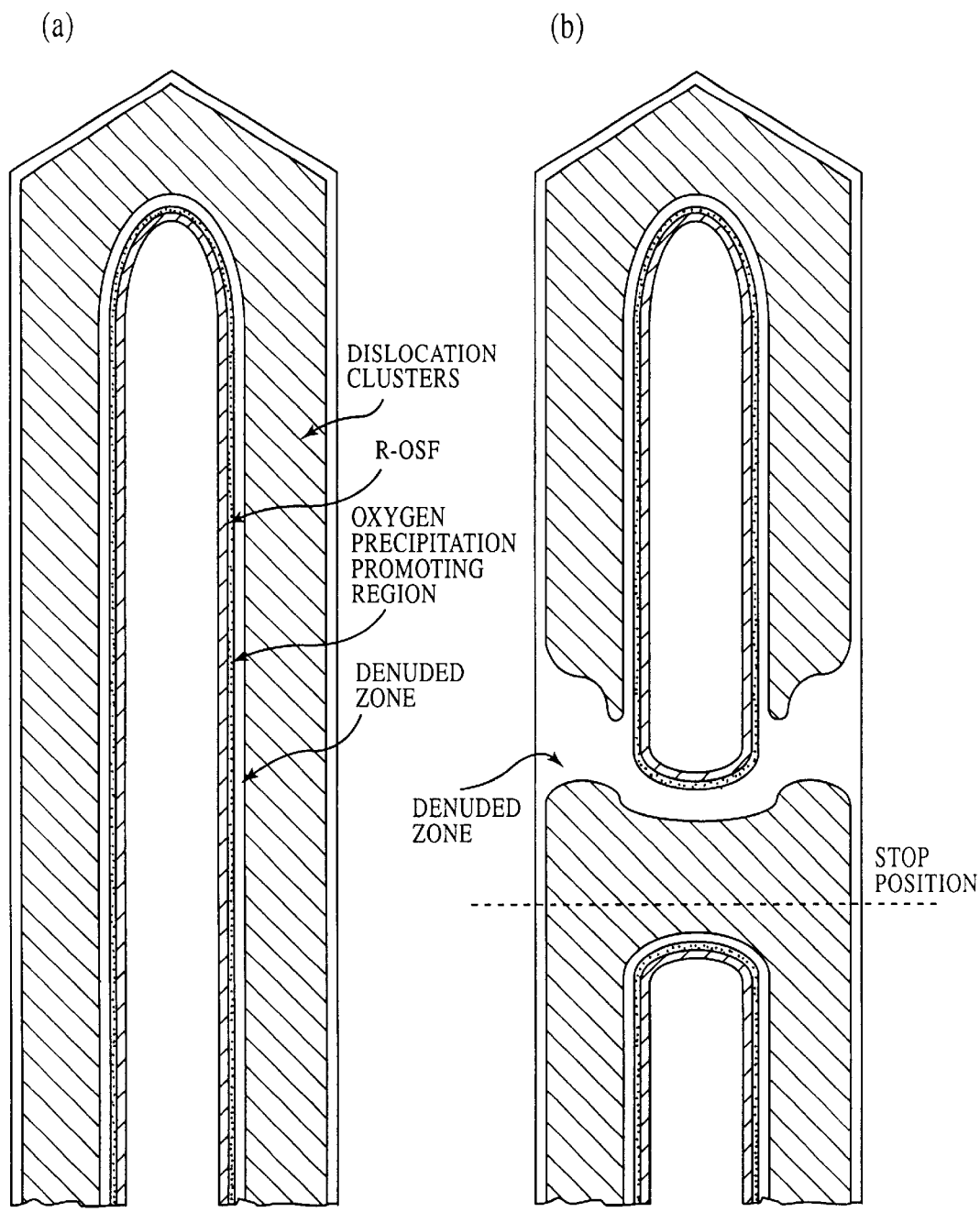
FIGS. 18(a), 18(b) and 19 schematically show the results of observations made through X-ray topography as to single crystals that were pulled in accordance with Examples 9 and 10 after the single crystals were split lengthwise in the as-grown state, coated with Cu, and heat-treated at 900° C. to thereby render their defective regions visible by type, respectively.

FIG. 18 schematically shows the results of observations made through X-ray topography as to the single crystals pulled in Example 9 after splitting the single crystals in the as-grown state lengthwise, coating the split crystals with Cu, and heat-treating them at 900° C. to thereby render visible their defective regions by type. FIG. 18(a) indicates the comparative example, and FIG. 18(b) the example of the invention obtained through 8 hours of stoppage. In the example of the invention, it is understood that the formation of dislocation clusters was suppressed at the site that was slowly cooled in the temperature range of 1200° C.–1050° C. and that the denuded zone outside R-OSF was greatly expanded, compared with the comparative example.

According to the examination results, the more prolonged the stoppage of the crystal growth, the wider the width across which the formation of dislocation clusters is suppressed, and thus the area where the denuded zone occupies is increased. By controlling the growing conditions in this way, the density at which dislocation clusters occur in the in-plane crystal area can be markedly reduced.

3-2. EXAMPLE 10

In Example 10, how the width across which dislocation clusters are formed changes was examined in the case where an 8"-diameter crystal was grown at an almost constant pulling rate using an improved hot zone where R-OSF is located at r=⅔R and the temperature of the crystal can stay in the range of 1250° C.–1000° C. for 10 hours. To do so, the crystal was pulled to a length of 100 mm while adjusting the pulling rate and the power of the heater so that the diameter of the crystal is maintained under the same conditions as in Example 9. Then, while maintaining the pulling rate constant, the single crystal was pulled to a length of 1000 mm, after which the process shifted to the tail-constricting step.

Figure 19:
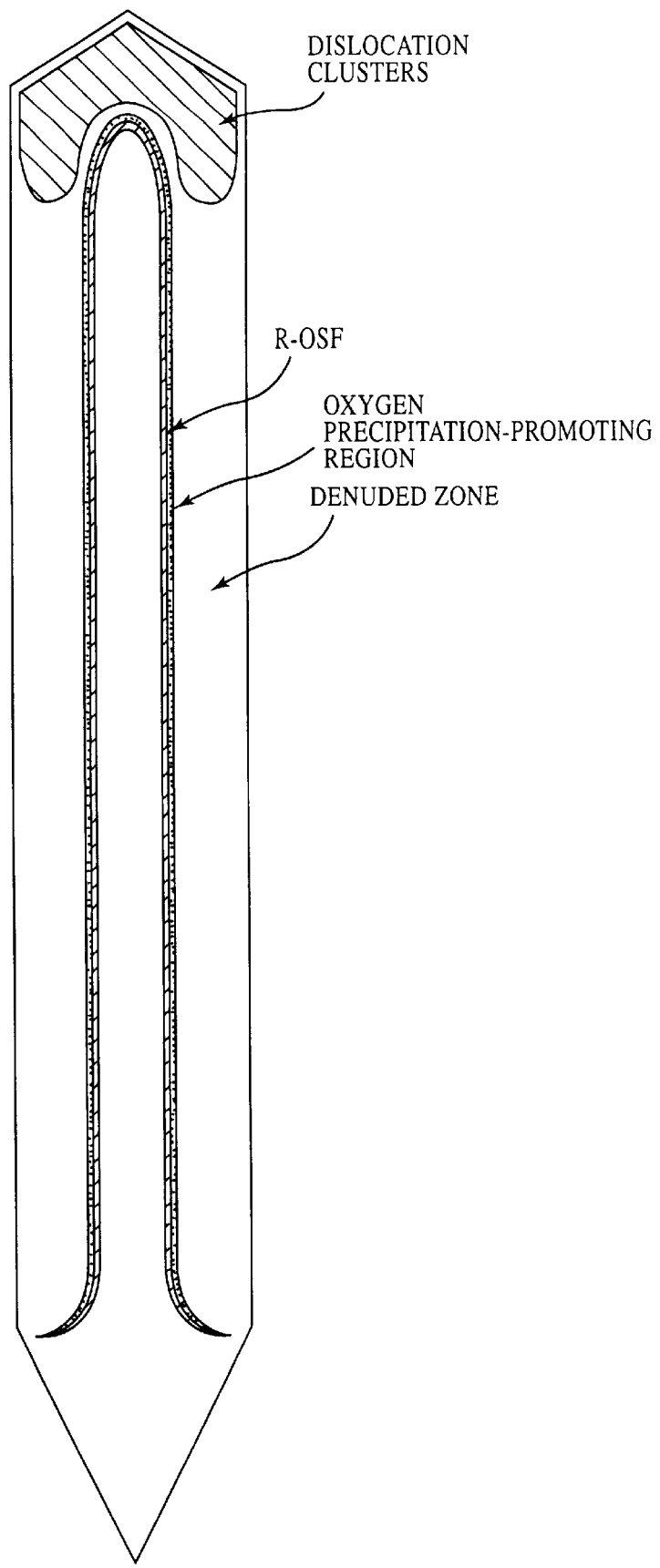

FIG. 19 schematically shows the results of observations made through X-ray topography as to the single crystal pulled in Example 10 after splitting the single crystal in the as-grown state lengthwise, coating the split crystal with Cu, and heat-treating it at 900° C. to thereby render visible its defective regions by type. It is understood that dislocation clusters outside R-OSF disappeared and the denuded zone was greatly expanded, compared with the previously described comparative example.

Figure 20:
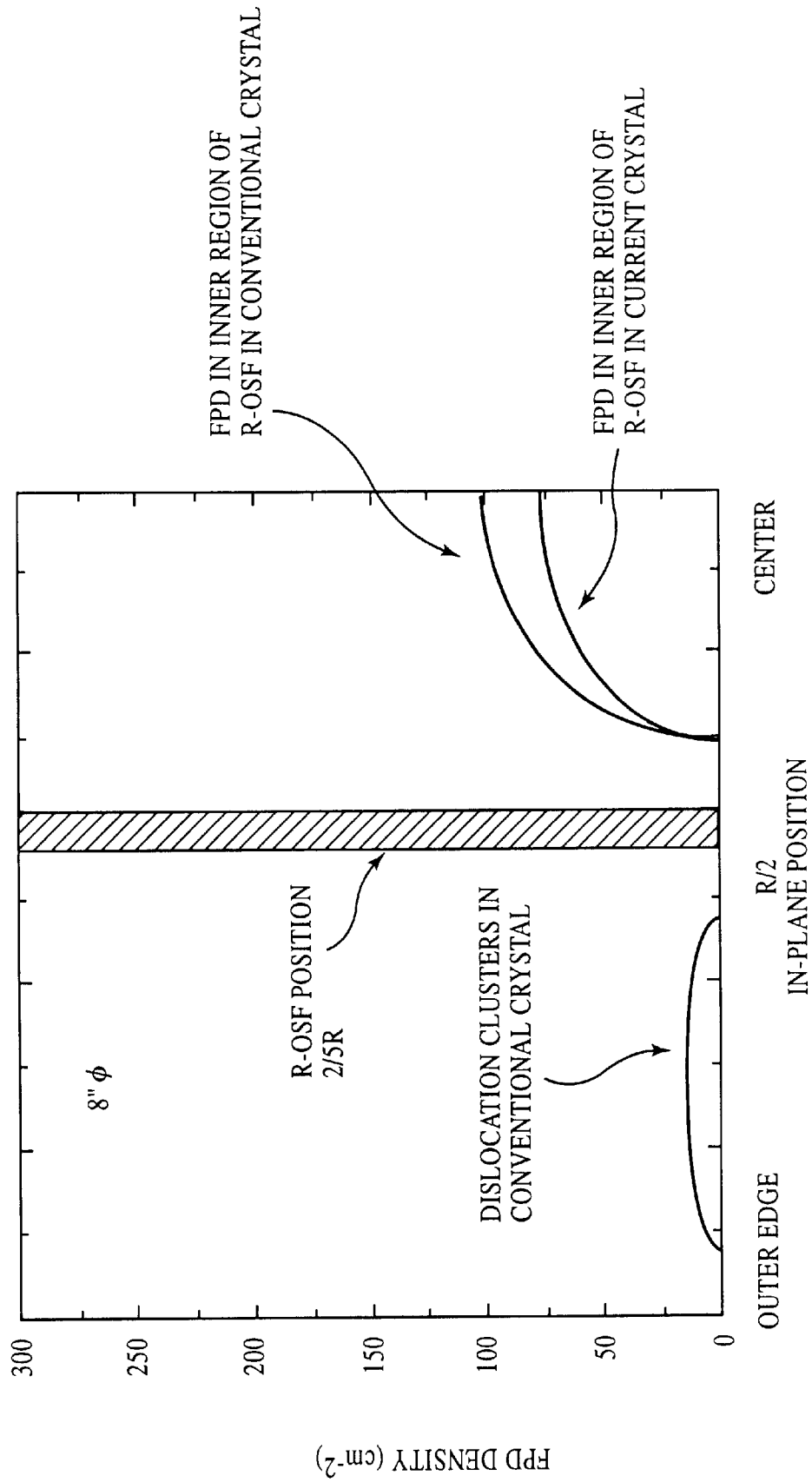
FIG. 20 shows the results of observations made through Secco etching as to the FPD distribution density in the as-grown crystal that was grown in accordance with Example 10.

FIG. 20 shows the results of observations made through Secco etching as to the FPD distribution density in the as-grown crystal that was grown in accordance with Example 10. In the conventional growing method in which the crystal is not slowly cooled while staying in the temperature range of 1250° C.–1000° C., dislocation clusters usually occur outside R-OSF. In contrast, under the growing conditions of Example 10, the crystal free of dislocation clusters in its in-plane area can be obtained. On the other hand, it is understood that the FPD density can be reduced in the inner region of R-OSF in accordance with the growing conditions of Example 10.

Figure 21:
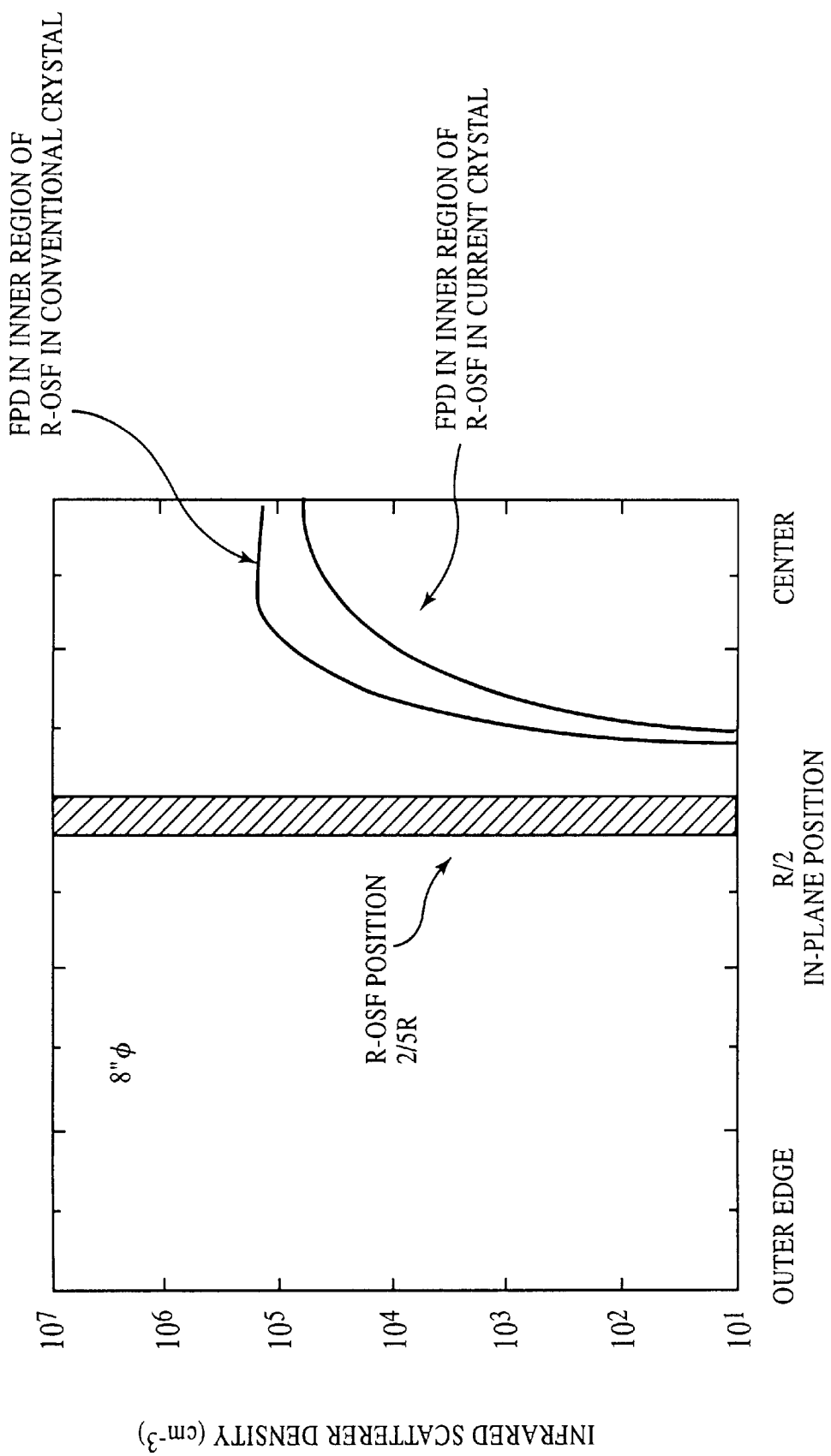
FIG. 21 shows the results of measurements made through infrared scattering tomography as to the distribution density of laser scattering tomography defects in the as-grown crystal that was grown in accordance with Example 10.

FIG. 21 shows the results of measurements made through infrared scattering tomography as to the distribution density of laser scattering tomography defects in the as-grown crystal that was grown in accordance with Example 10. It is apparent from the results shown in FIG. 20 that the R-OSF position can be grasped by measurements through infrared scattering tomography.

3-3. EXAMPLE 11

In Example 11, how the formation of laser scattering tomography defects, R-OSF or a denuded zone changes was examined in the case where an 8"-diameter crystal was grown at an almost constant pulling rate under such a condition that the R-OSF position is r=¼R, using an improved hot zone where a uniform temperature distribution is achieved within the crystal in the temperature range of the melting point to 1250° C. so that the amounts of introduced vacancies become uniform and in which the crystal can stay in the temperature range of 1250° C.–1000° C. for 10 hours. The crystal was pulled to a length of 100 mm while adjusting the pulling rate and the power of the heater so that the diameter of the crystal is maintained under the same conditions as in Example 9. Then, while maintaining the pulling rate constant, the single crystal was pulled to a length of 1000 mm, after which the process shifted to the tail-constricting step.

Figure 22:
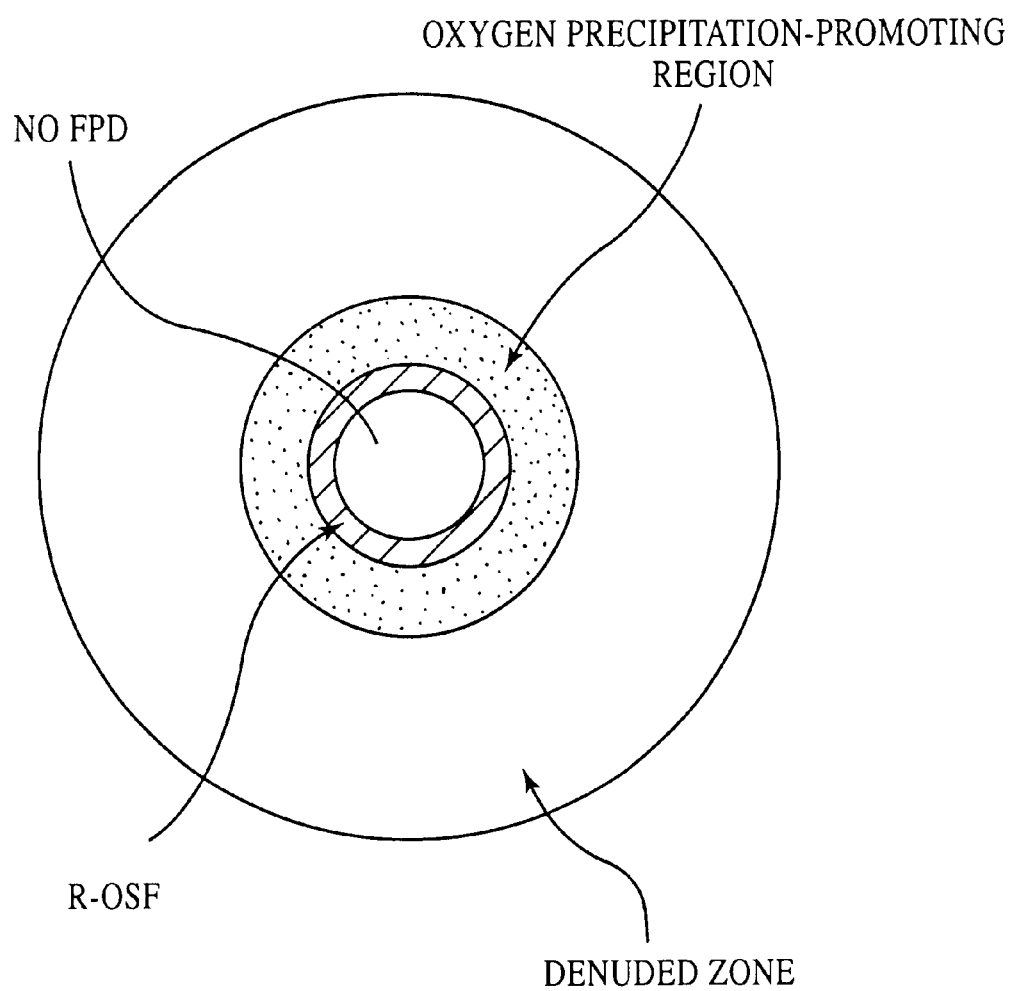
FIG. 22 schematically shows the results of observations made through X-ray topography as to a single crystal that was pulled in Example 11 after the single crystal was sliced in the as-grown state, coated with Cu, and heat-treated at 900° C. to thereby render its defective regions visible by type.

FIG. 22 schematically shows the results of observations made through X-ray topography as to the single crystal pulled in Example 11 after the single crystal was sliced in the as-grown state, coated with Cu, and heat-treated at 900° C. to thereby render visible its defective regions by type. No dislocation clusters occurred and the denuded zone was greatly expanded despite the fact that R-OSF did occur at r=¼R in the inner side of the in-plane crystal area. Further, when the R-OSF position was r=¼R, no FPD derived from laser scattering tomography defects were observed even in the inner region of R-OSF. Therefore, it is understood that the densities of laser scattering tomography defects (FPD, COP) and dislocation clusters can be reduced in the in-plane crystal area by controlling the growing conditions.

Figure 23:
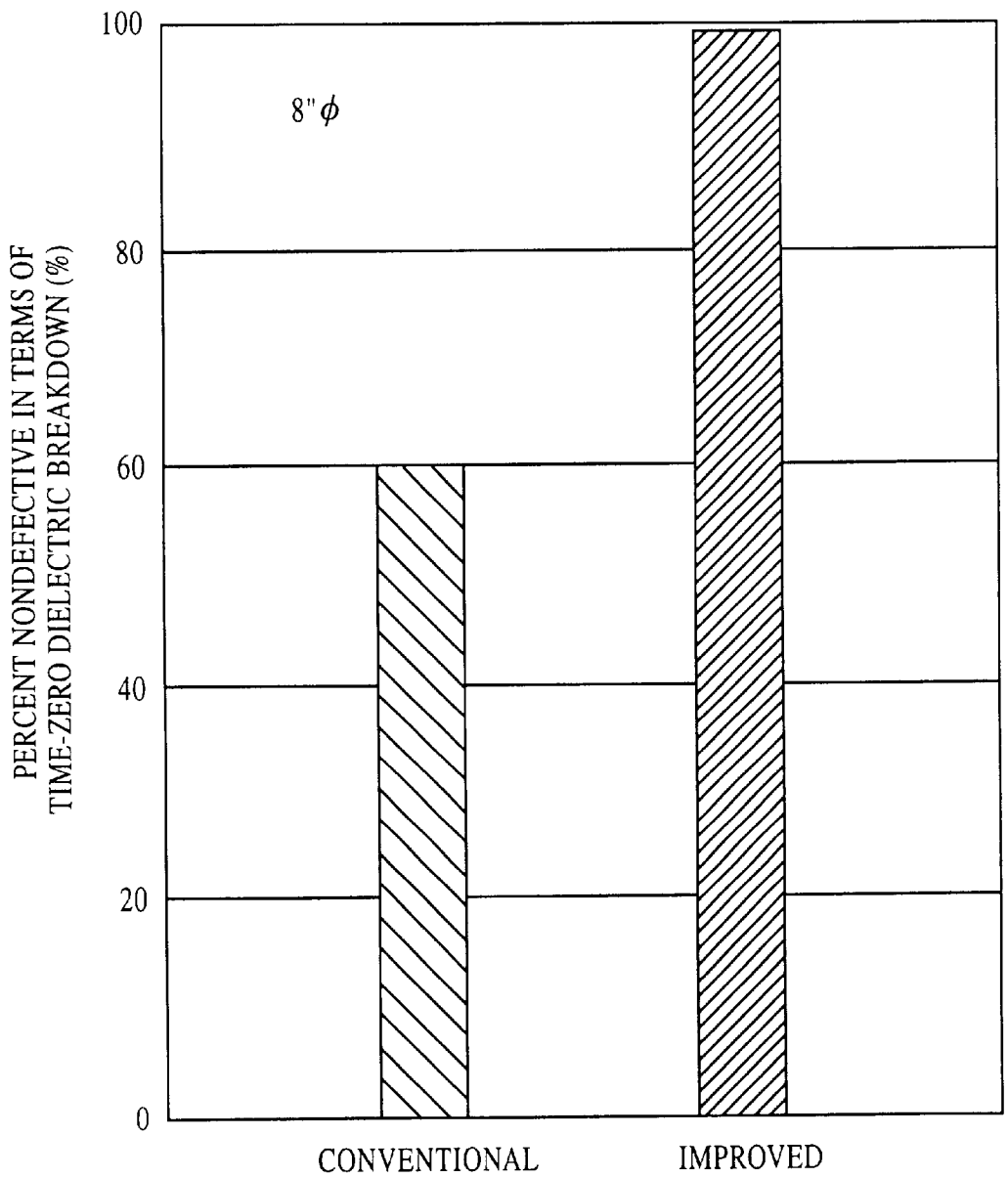
FIG. 23 shows the results of examinations made as to time-zero dielectric breakdown (TZDB) of wafers processed from the single crystal that was pulled in Example 11.

FIG. 23 shows the results of examinations made as to time-zero dielectric breakdown (TZDB) of the wafers processed from the single crystal that was pulled in Example 11. The percent nondefective in terms of TZDB in the in-plane crystal area was 95% or more in the case where the thickness of an oxide film was 25 nm, the applied voltage was 8 M/V, the position of R-OSF was r=¼R, and the FPD density was extremely small.

3-4. EXAMPLE 12

In Example 12, how the formation of laser scattering tomography defects, R-OSF or a denuded zone changes was examined in the case where an 8"-diameter crystal was grown at an almost constant pulling rate under such a condition that R-OSF die out from the in-plane crystal area, using an improved hot zone where a uniform in-plane temperature distribution within the crystal is achieved in the temperature range of the melting point to 1250° C. so that the amounts of vacancies introduced become uniform and where the crystal can stay in the temperature range of 1250° C.–1000° C. for 10 hours. The crystal was pulled to a length of 100 mm while adjusting the pulling rate and the power of the heater so that the diameter of the crystal is maintained under the same conditions as in Example 9. Then, while maintaining the pulling rate constant, the single crystal was pulled to a length of 1000 mm, after which the process shifted to the tail-constricting step.

Figure 24:
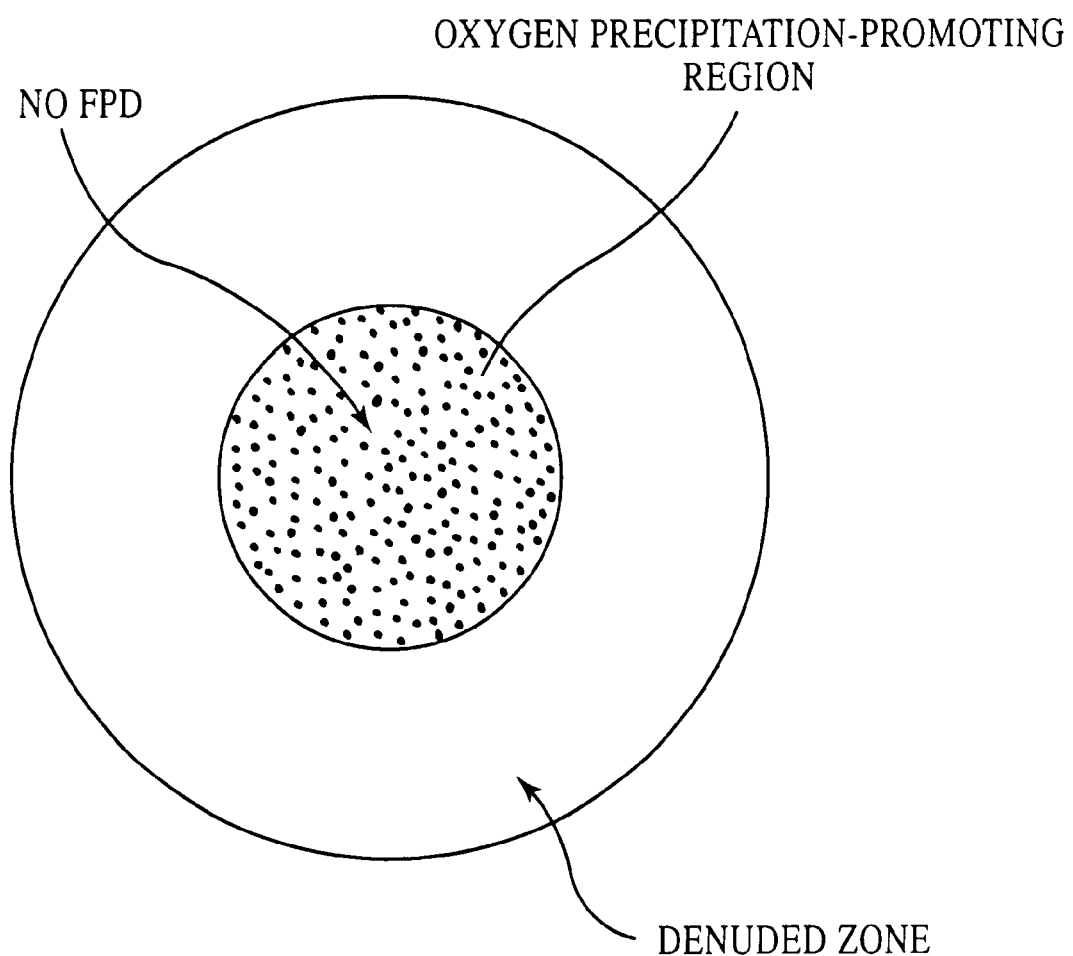
FIG. 24 schematically shows the results of observations made through X-ray topography as to a single crystal that was pulled in Example 12 after the single crystal was sliced in the as-grown state, coated with Cu, and heat-treated at 900° C. to thereby render its defective regions visible by type.

FIG. 24 schematically shows the results of observations made through X-ray topography as to the single crystal pulled in Example 12 after the crystal was sliced in the as-grown state, coated with Cu, and heat-treated at 900° C. to thereby render visible its defective regions by type. R-OSF died out into the center of the in-plane crystal area. Although the oxygen precipitation-promoting region appeared, no dislocation clusters occurred and the denuded zone was greatly expanded. Further, no FPD derived from laser scattering tomography defects were observed by the dying out of R-OSF. Therefore, controlling the growing conditions can reduce the density of grown-in defects.

In Example 12, another crystal was grown at such a pulling rate that the oxygen precipitation-promoting region dies out from the in-plane area of the crystal. In this case, although not shown in the drawing, the denuded zone occupied the whole in-plane crystal area, from which the oxygen precipitation-promoting region was extinct.

From examinations made as to time-zero dielectric breakdown (TZDB) of wafers processed from the single crystals that were pulled in Example 12, results similar to those of Example 3 were obtained. That is, the percent nondefective in terms of TZDB in the in-plane crystal area was 95% or more in the wafers where R-OSF were extinct inward under the conditions that the thickness of an oxide film was 25 nm and the applied voltage was 8 M/V.

As described in the foregoing, according to the third high-quality silicon single crystal and the method of producing the same of this invention, regions free of laser scattering tomography defects and dislocation clusters, which are grown-in defects, can be expanded into the in-plane area of a wafer by controlling the R-OSF position while adjusting the single crystal growing conditions. Therefore, a semiconducting material excellent in device characteristics can be supplied.

4. Fourth High-Quality Silicon Single Crystal and Method of Producing the Same

Figure 3:
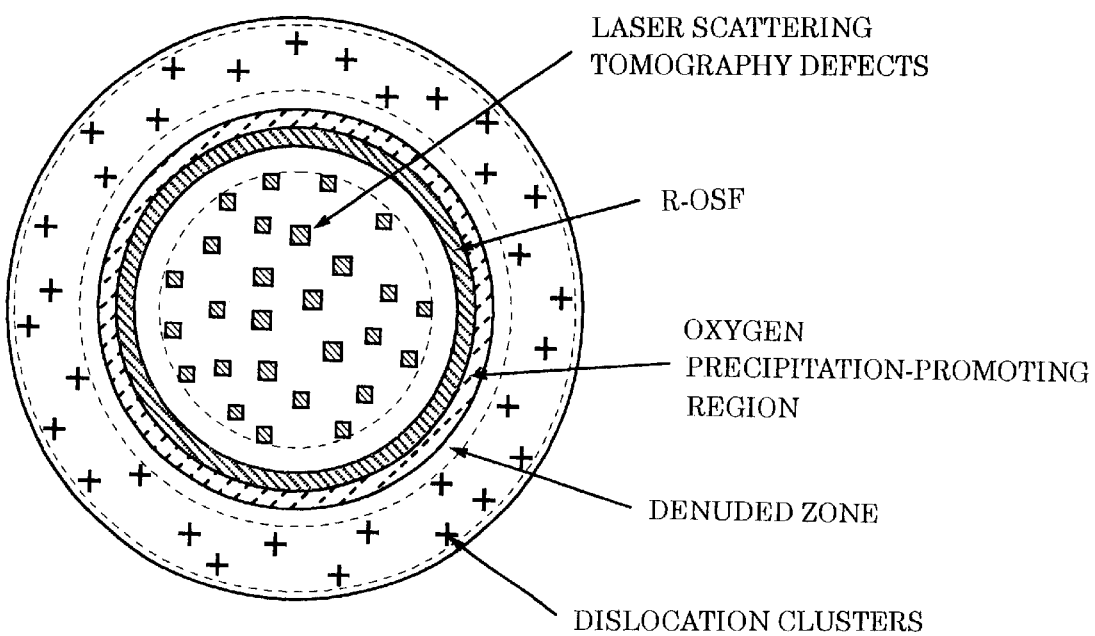

As described earlier, it is known as the R-OSF phenomenon that the radius of R-OSF continuously expands outward with increasing pulling rate and shrinks inward to disappear with decreasing pulling rate during single crystal growth. Here, the R-OSF distribution that is shown in function of the pulling rate in FIG. 2 described previously is V-shaped, and the denuded zones are present so as to be inscribed in R-OSF and closely outside R-OSF in narrow ranges, respectively, as shown in FIG. 3 described previously. Now, if one can find such growing conditions that the V-shaped form opens as wide as possible upward or becomes flat if possible and that the R-OSF so re-shaped is located at an appropriate position in a wafer, then a single crystal capable of supplying wafers containing minimal defects must be produced. It is assumed that the R-OSF position is greatly affected by the cooling rate after solidification or the temperature gradients in the direction of the pulling shaft, in addition to the above-described pulling rate.

On the basis of these assumptions, in inventing a fourth high-quality silicon single crystal, attention was paid to positively changing the temperature distribution within a solidified single crystal. That is, the single crystal being pulled should be cooled not simply naturally but by controlling the cooling conditions. However, since it is difficult to actually measure the temperature distribution within the single crystal being pulled, it is calculated by a heat transfer analysis simulation method.

Figure 25:
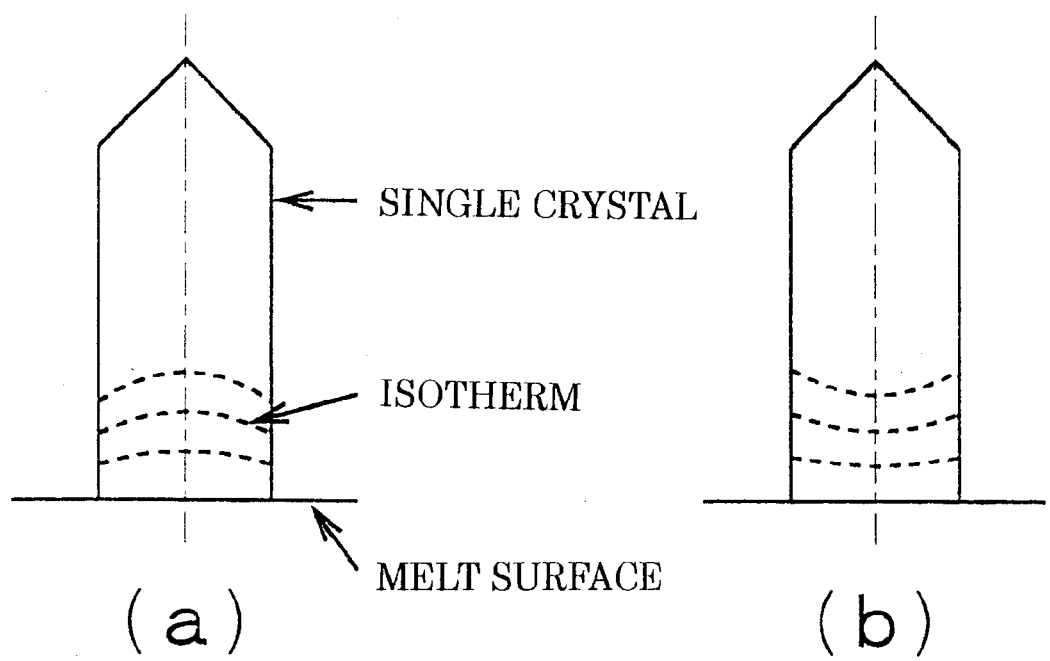
FIGS. 25(a) and 25(b) schematically illustrate the temperature distributions in in-plane areas of single crystals that are being pulled.

FIG. 25 schematically illustrates the temperature distribution within a single crystal that is being pulled. Since the single crystal being pulled is usually cooled from its surface, there are larger temperature drops at the surface than at the inner side as shown in FIG. 25(a). That is, assuming a surface of a wafer that is horizontal with respect to a vertical pulling shaft, its temperature is high at the center and low at the outer edge. If the solidification process proceeds at a horizontal plane that is substantially the same as the melt surface, then the temperature of the crystal on the horizontal plane immediately after solidification must be the same at the center and the outer edge. Therefore, assuming a temperature distribution in the vertical direction parallel with the pulling shaft at a position slightly distant from the solid-melt interface of a single crystal that is being grown, the temperature gradient is larger at the outer edge than at the center.

In contrast, by growing a single crystal under various conditions while changing the method of cooling its surface during pulling so that its inside temperature distribution is different from that which is usual, the distribution of defects in wafers obtained from this single crystal was examined. The examinations revealed the following.

(i) When the temperature distribution within a single crystal is changed in the course of cooling the single crystal while the crystal temperature at the center stays from the temperature immediately after solidification (1412° C.) to 1250° C., the R-OSF width can be expanded even if the outside diameter of R-OSF remains the same.

(ii) When the R-OSF width expands, so do the oxygen precipitation promoting region and the denuded zone immediately outside R-OSF.

(iii) The temperature distribution during pulling that contributes to expanding the R-OSF width must satisfy such a requirement that the temperature gradient in the vertical direction parallel with the pulling shaft of a single crystal be smaller at the outer edge than at the center; i.e., as shown in FIG. 25(b), the temperature must be higher at the outer edge than at the center on a horizontal plane in the crystal or in a surface of a wafer.

(iv) To make the temperature gradient smaller at the outer edge than at the center of a crystal, the hot zone, i.e., the method of cooling a single crystal portion being pulled must be changed. To obtain a single crystal having less defects, the temperature gradients in the vertical direction of the whole single crystal must be made larger than those of the conventional example, and hence the pulling rate must be increased.

Although the presence of R-OSF is not necessarily so important a factor in view of the trends toward lower temperature fabrication of devices and lower oxygen content in crystals as described earlier, to know the location of R-OSF would give a guidance for determining the growing conditions of a single crystal. From this viewpoint, the inventors decided to select such growing conditions as to expand a denuded zone as much as possible from the relationship between the R-OSF position and the temperature distribution within a crystal that is being pulled. In this case, since the R-OSF width changes, the detectable outside diameter of R-OSF in each of wafers sliced from obtained single crystals was measured. Through these measurements, the inventors were able to clarify the influence of the outside diameter of R-OSF and the temperature distribution within a single crystal being pulled upon the distribution of defects, and thus accomplished the fourth high-quality silicon single crystal.

That is, a method of producing the fourth high-quality silicon single crystal is characterized in that a silicon single crystal is grown under such conditions that a temperature gradient in the vertical direction parallel with a pulling shaft of the crystal is smaller at the outer edge than at the center and is 2.6° C./mm or more at the center when the single crystal stays in a temperature range of its solidifying point to 1250° C. during growth, and that the outside diameter of R-OSF is within a range of 0–60% of the diameter of the grown crystal.

Why does a denuded zone expand when the temperature distribution during cooling is changed? The following answers this question. First, the melt undergoes a change to a solid crystal through solidification when pulled at the time of single crystal growth. Since such a change takes place from a liquid phase in which atoms are randomly arranged to a solid phase in which atoms are neatly arranged, in the solid phase near the solid-melt interface, there are vacancies created by atoms that should exit missing and interstitial atoms created by superfluous Si atoms entering a crystal lattice in large amounts. Since a liquid in which inter-atomic distance is large undergoes a change in state to a solid, it is presumed that there would be more vacancies created by missing atoms than interstitial atoms in the crystal immediately after solidification. As the portion that is grown into a single crystal after solidified by pulling moves away from the solid-melt interface, atoms and vacancies move and diffuse or vacancies and interstitial atoms are combined together, etc., so that these vacancies and interstitial atoms disappear one after another, causing atoms in the crystal to be neatly arranged. However, some of these vacancies and interstitial atoms do remain in the crystal.

Of the vacancies and interstitial atoms introduced into the crystal in the solidification process, the former outnumbers the latter. Both can move around within the crystal quite freely while the crystal temperature is high, with vacancies moving or diffusing faster than interstitial atoms. And it is assumed that the number of these vacancies and interstitial atoms is reduced while disappearing in the course of their diffusion, their diffusion to the surface, their combination and the like, which are based chiefly on the temperature gradient.

First, the saturation limit concentrations of vacancies and interstitial atoms in a high-temperature crystal become smaller at lower temperatures, respectively. Thus, even if both of them are present in equal amounts, one at lower temperatures has higher concentrations and the other at higher temperatures has lower concentrations as the actual effect. A single crystal that is being grown has temperature gradients in the vertical direction, and actual concentration differences attributable to these temperature gradients cause diffusion to occur from the low-temperature side to the high-temperature side, i.e., from the upper side of a single crystal being grown to the solid-melt interface, and thus the number of vacancies and interstitial atoms decreases with decreasing temperature. Further, since vacancies are created when atoms constituting a crystal lattice are missing and interstitial atoms are created when superfluous atoms are present in the lattice, when both of them collide, they are combined with each other to disappear, making the crystal lattice perfect.

The temperature gradients in the direction of the vertical axis of a crystal being grown little change even if the pulling rate is changed. That is, at the same temperature gradient, vacancies diffuse toward the solid-melt interface in the same amount per unit time. Hence, when the pulling rate is increased, the crystal temperature decreases, leaving excessive vacancies undiffused, and even if vacancies disappear at an increased pace through their diffusion to the surface and their combination with interstitial atoms, the undiffused vacancies do remain in the crystal as defects, and it is assumed that these undiffused vacancies would be the cause of laser scattering tomography defects. On the other hand, when the pulling rate is decreased, vacancies diffuse and disappear sufficiently, but interstitial atoms, which diffuse more slowly than vacancies, are left undiffused while the crystal temperature is decreasing, and thus these undiffused interstitial atoms cause dislocation clusters to occur. It is hence assumed that these phenomena would be responsible for the fact shown in previously described FIG. 2 that laser scattering tomography defects mainly result when the pulling rate is high and dislocation clusters mainly result when the pulling rate is low.

However, when a single crystal is grown at intermediate pulling rates, for example, as shown in previously described FIG. 3, laser scattering tomography defects distribute around the center and dislocation clusters near the outer edge with R-OSF, an oxygen precipitation promoting region, and denuded zones existing in between. In the case of a normal single crystal pulling and growing method, the temperature gradient in the direction of the vertical axis is larger at the surface than at the center of the single crystal as shown in FIG. 25(*a*). This means that temperature gradient-based diffusion takes place faster at the surface than at the center, and since vacancies diffuse faster, the concentration of interstitial atoms becomes relatively higher with decreasing pulling rate, and hence dislocation clusters begin to appear. At this point in the process, a relatively large amount of vacancies still exists around the center where the temperature gradients are small, and thus they remain as laser scattering tomography defects. In the region between them, vacancies balance with interstitial atoms in number, allowing them to be combined together to rid the crystal of sources of defects. Thus, it is assumed that this is why a denuded zone is formed. According to one theory, OSF is formed by the nucleation of oxygen precipitates, and the fact that the oxygen precipitation promoting region circumscribes R-OSF supports this theory.

If a denuded zone is formed at a position where vacancies balance with interstitial atoms in number during a period in which vacancies and interstitial atoms can move easily, i.e., while the crystal temperature is high and thus they can diffuse fast, then the position at which vacancies balance with interstitial atoms moves outward when the pulling rate is high due to an insufficient reduction of diffusing vacancies, and the same position nears the center when the pulling rate is low due to the decreased number of vacancies, and thus a region where dislocation clusters occur would expand near the outer edge. Here, if it is supposed that oxygen precipitation occurs more easily by consuming vacancies at the place where vacancies slightly outnumber interstitial atoms than at the position where they balance in number, it could result that oxygen precipitates and R-OSF occur in a region that is inwardly adjacent to a denuded zone.

If the formation of a denuded zone is dependent on the fact that vacancies balance with interstitial atoms in number, and if such balancing is governed by the temperature gradients in the vertical direction of a crystal in a high temperature range immediately after solidification as described above, then it is assumed that to expand a denuded zone, the pulling rate may be adjusted so that the temperature gradient in the direction of the vertical axis of a single crystal being pulled is the same both at the center and the outer edge. However, in actuality, when exactly the same temperature gradient is achieved in the whole in-plane crystal area, dislocation clusters tend to appear around the outer edge of a wafer as long as the condition that almost all laser scattering tomography defects around the center disappear is satisfied. Thus, to decrease grown-in defects in the whole wafer, the single crystal must be grown under limited conditions. The reason for this is assumed as follows. Since vacancies and interstitial atoms disappear upon reaching the surface of a single crystal, their concentrations are low near the surface of the single crystal, and thus it is assumed that horizontal concentration diffusion is taking place from the inside to the surface. In this case also, since the vacancies diffuse faster than interstitial atoms, the concentration of interstitial atoms becomes relatively high, and thus dislocation clusters tend to occur at the surface. Therefore, if the temperature gradient in the vertical direction is made smaller at the surface than at the center, then disappearing vacancies due to their diffusion to the surface can be saved, and hence the formation of dislocation clusters near the surface can be suppressed.

In applying the method of producing the fourth high-quality silicon single crystal to the growing of a single crystal, the temperature distribution within the single crystal is controlled in such a temperature range that the single crystal is cooled to 1250° C. after solidification. The reason why the temperature range is limited to 1250° C. is because when the crystal is cooled to temperatures below this, temperature distribution control is no longer effective in expanding a denuded zone.

In such a temperature range that a single crystal being grown is cooled to 1250° C. after solidification, the temperature gradient in the vertical direction at the center of the single crystal is controlled to be 2.6° C./mm or more. This is because the R-OSF width is hard to increase at temperature gradients below 2.6° C./mm and thus regions free of grown-in defects cannot be expanded. This point is considered important in the sense that giving precedence to the disappearance of vacancies expands the R-OSF width by temperature gradient-dependent vertical diffusion over their diffusion toward the surface of the crystal. This temperature gradient is allowed to be large from the viewpoint of suppressing the formation of grown-in defects. However, under large temperature gradients, cooling means must be further improved, and unsatisfactory dislocations occur due to distortions caused by shrinkages at short distances derived from the improved cooling, and thus the temperature gradient may actually be increased to about 6.0° C./mm at most. Note that the temperature gradient is desirably in a range of 3.5–4.5° C./mm.

Further, in the method of producing the fourth high-quality silicon single crystal, the temperature gradient in the vertical direction parallel with the central axis is made smaller at the outer edge than at the center of a crystal as far as a single crystal portion that is cooled to 1250° C. from the solidifying point during pulling is concerned. In the case of the normal growth, the temperature gradient is larger at the outer edge than at the center in this temperature range during the pulling of a single crystal. That is, the solid-melt interface of a single crystal being grown is substantially flush with the melt surface and thus has the same temperature as the melt surface, and hence at positions vertically equidistant from the melt surface, the crystal temperature is lower at the outer edge than at the center.

In contrast, in the method of producing the fourth high-quality silicon single crystal, the temperature gradient at the outer edge is made smaller than at the center, and thus at positions vertically equidistant from the melt surface, the crystal temperature is higher at the outer edge than at the center. In other words, the temperature gradient in the vertical direction parallel with the pulling shaft of the crystal is smaller at a desired position on a plane orthogonal to the pulling shaft than at any position along a line connecting the center to that desired position. The reason why the temperature gradient in the vertical direction is made smaller at the outer edge than at the center is because doing so can expand the R-OSF width observed in wafers. When the temperature gradient at the outer edge exceeds that at the center, the R-OSF width cannot be expanded.

The outside diameter of R-OSF detected on a plane perpendicular to the growth axis taken out of a single crystal, i.e., on a surface of a wafer is set within a range of 0–60% of the diameter of the grown crystal. While such outside diameter of R-OSF changes in accordance with the growing rate, the growing rate for obtaining the same outside diameter of R-OSF differs depending on the temperature conditions of a single crystal being pulled and the hot zone design for a single crystal being grown. In view of this, how the outside diameter of R-OSF changes is examined experimentally by changing the pulling rate using growing equipment, and a single crystal is grown at such a rate that the outside diameter falls within the above-described range.

When the pulling rate is so high that the outside diameter of R-OSF exceeds 60%, a region where laser scattering tomography defects occur remains around the center of a single crystal. Further, when the pulling rate is continuously decreased, the outside diameter of R-OSF is gradually reduced, finally, to 0%. If the pulling rate is further decreased from such level that the outside diameter of R-OSF is 0%, dislocation clusters begin to occur. To avoid the above inconvenience, a single crystal is to be grown at such a pulling rate that the outside diameter of R-OSF is within the range of 0–60% of its diameter.

To achieve a temperature gradient in the vertical direction of 2.6° C./mm or more at the center of a single crystal and a temperature gradient that is smaller at the outer edge than at the center during the pulling of a single crystal, the upper portion of the single crystal being pulled must be cooled forcibly, not naturally, and its surface that is located at a predetermined distance from the melt surface must be heat-insulated or heated. By cooling the upper portion, the central portion of the single crystal immediately after solidification is cooled by heat conduction, while its outer edge portion can have higher temperatures than around its center by heat insulation or heating. Any method may be used in forcibly cooling the upper portion of the single crystal during pulling. Means of purging a cool ambient gas or nearing a cooled object to a site to be cooled, etc. may be applied. For example, if a method in which the upper portion of a single crystal is covered with a water-cooled sleeve that is concentric with the single crystal is employed, and when the lower end of the sleeve is located at a predetermined distance from the melt surface, then the crystal surface portion extending from the melt surface to the lower end of the sleeve is heat-insulated by radiation from the melt surface and by heat from the heater for heating the crucible. As a result, as far as any of horizontal planes that are as high as such heat-insulated crystal surface portion are concerned, lower temperatures can be achieved at the center due to the heat conduction that is based on the cooling of the upper portion of the single crystal.

The temperature distribution within a single crystal in this case is obtained by actual temperature measurements on the surface of the single crystal and by calculations based on the heat transfer analysis simulation method. As this heat transfer analysis method, a simulation method used for the normal silicon single crystal growth may be applied. In such a case, the design of a hot zone, i.e., a portion to be cooled that is above the melt surface for achieving the above-described temperature distribution within the single crystal is determined, after which data is gathered, e.g., by actually measuring the temperature while inserting a thermocouple into the single crystal that is being grown, or by measuring the surface temperature of the single crystal being pulled, and the gathered data is corrected. By doing so, a more correct temperature distribution can be estimated.

Note that in order to set the outside diameter of R-OSF at 60% or less by effecting the cooling control for controlling the distribution of temperature gradients in the vertical direction of the single crystal being grown, the pulling rate must be particularly higher than in the normal growth in which no cooling control is effected. This indicates that a single crystal having less defects can be grown at higher pulling rates.

To evaluate the fourth high-quality silicon single crystal, 8"-diameter silicon single crystals were produced and the form of R-OSF and how crystal defects occur were examined based on Examples 13 and 14.

4-1. EXAMPLE 13

Figure 26:
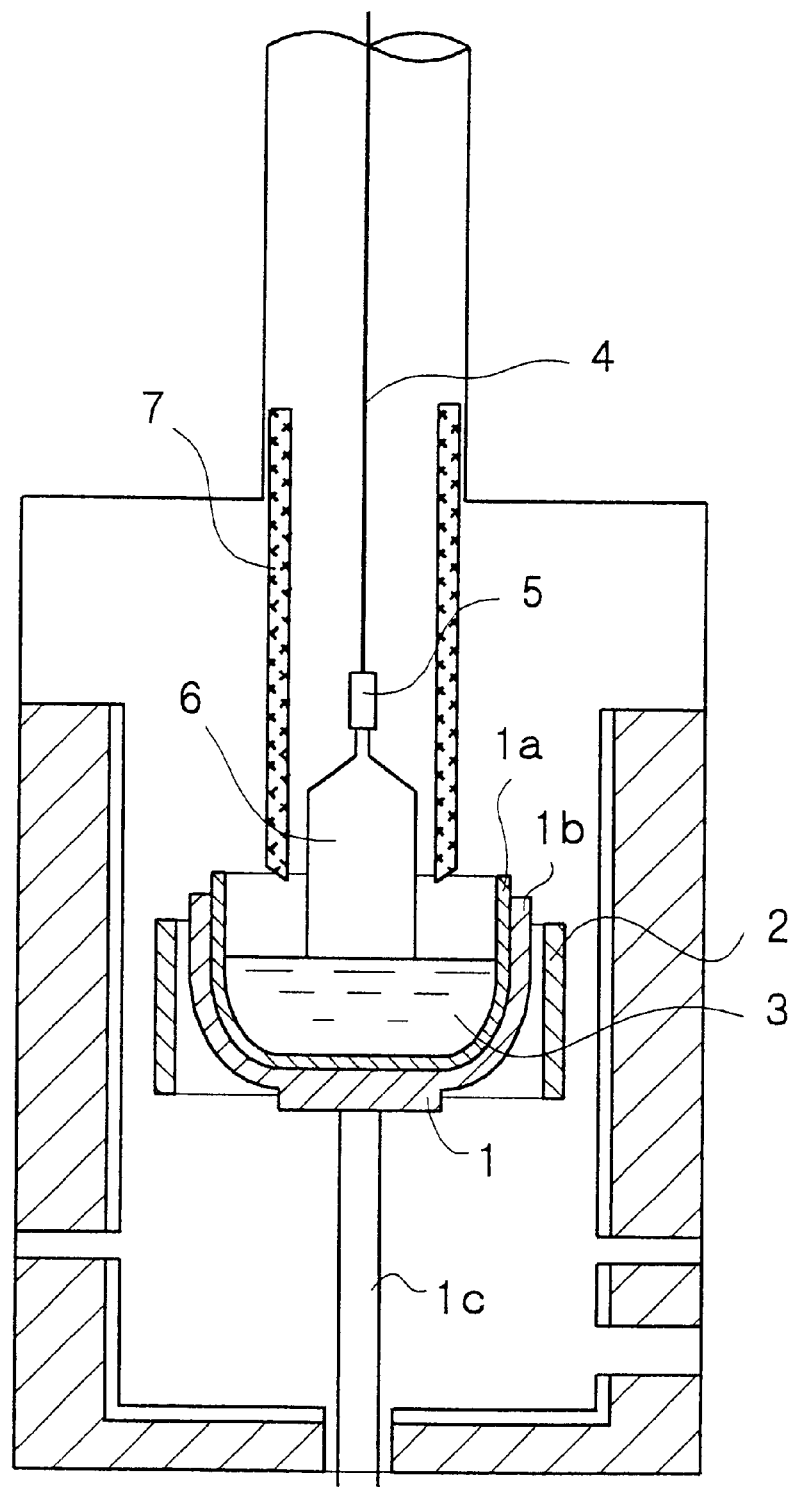
FIG. 26 schematically shows a cross section of a single crystal producing apparatus used in Example 13.

An 8"-diameter single crystal was produced using a single crystal producing apparatus. The crucible was charged with 120 kg of polysilicon that is a raw material for the preparation of a crystal, and boron was further added as a p-type dopant so that the crystal has an electrical resistivity of about 10 Ωcm. FIG. 26 schematically shows a cross section of the single crystal producing apparatus used. This single crystal producing apparatus is equipped with a double-walled stainless steel cooling sleeve 7 so that the upper portion of a single crystal 6 pulled thereby can be cooled. The lower end of the sleeve 7 is closed and thus its inside can be water-cooled. The sleeve 7 is disposed on the apparatus so as to be vertically movable coaxial with the central axis of the single crystal to be pulled. The inside diameter of the cooling sleeve 7 is 240 mm with respect to the 8"-diameter silicon single crystal.

After evacuating the apparatus to achieve an Ar atmosphere therein and melting the silicon within the crucible using a heater 2, a seed crystal was pulled while brought into contact with a melt 3. Then, the growing process proceeded to the seed-constrictinng step, the shoulder-forming step, and to the body-growing step. The cooling sleeve 7 had its lower end located at a distance of 150 mm from the melt surface. After growing the single crystal to a predetermined diameter, the current of the heater 2 was adjusted to set the pulling rate at 1.5 mm/min, and the growing process was thereafter continued. When the shoulder entered the cooling sleeve 7, it was started to slow down the pulling rate. Since the melt 3 within the crucible was reduced as the single crystal 6 grew, the crucible 1 was elevated to maintain the melt surface at the same level at all times. While the single crystal was being grown to a body length of 800 mm, the pulling rate was successively dropped to a level of 0.5 mm/min, and the single crystal was grown by an additional length of 200 mm at such pulling rate, after which the tail-constricting step was performed to terminate the growing process. As to the single crystal being pulled between the melting point and 1250° C., the following temperature gradients were obtained from the calculations made by heat transfer analysis simulations. The temperature gradient was in the range of 3.8–4.0° C./mm at the center of the crystal, and in the range of 3.2–3.7° C./mm at the outer edge, and they little changed even when the pulling rate was changed. Examinations were made through X-ray topography as to the defect distribution after splitting the obtained single crystal lengthwise along its central axis, cutting therefrom a 1.4 mm-thick slice including the central axis, immersing the slice into a 16%-by-weight aqueous solution of copper nitrate to thereby deposit Cu thereon, and heating the resultant slice at 900° C. for 20 minutes and then cooling the heated slice.

Figure 27:
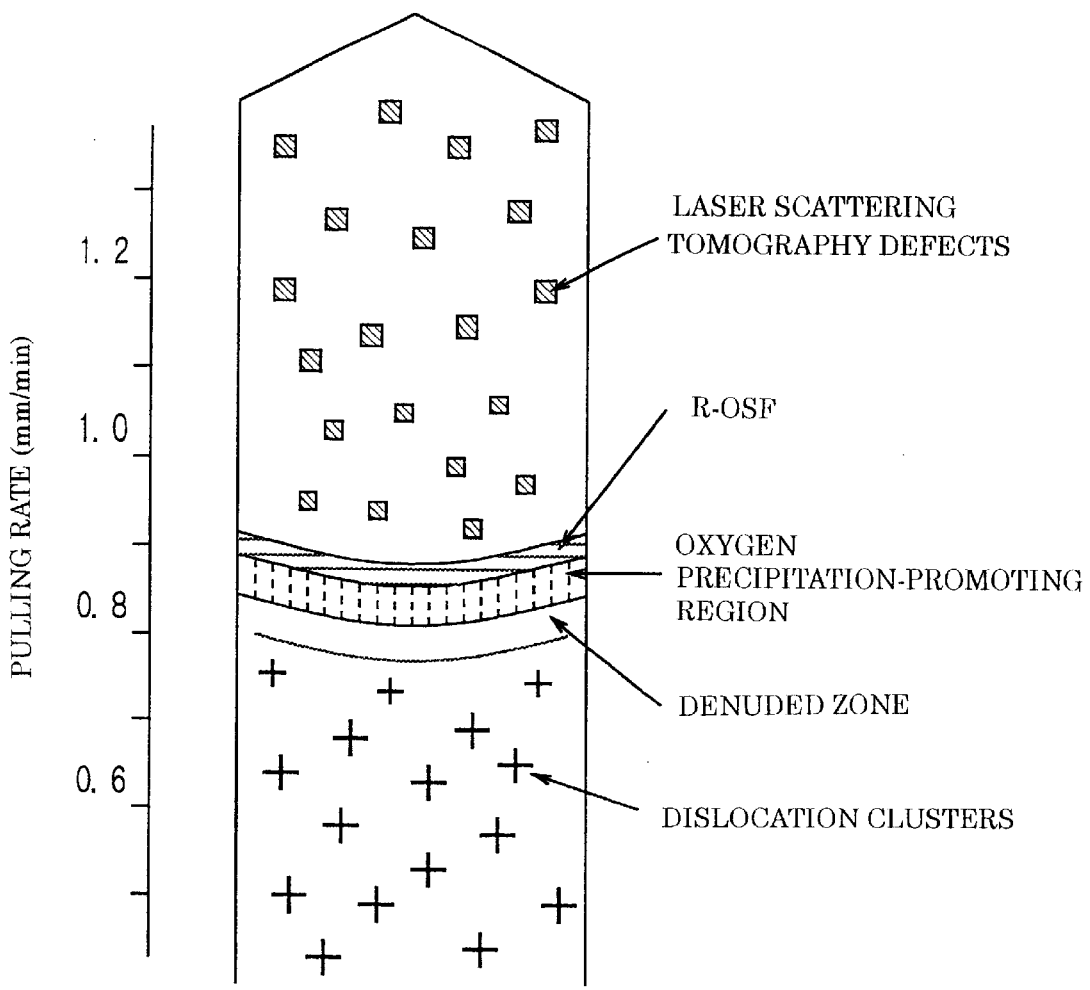
FIG. 27 shows the results of examinations made as to the defect distribution in accordance with Example 13.

FIG. 27 shows the results of the examinations made as to the defect distribution in Example 13. FIG. 27 schematically shows the defect distribution in function of the pulling rate during growth. If a wafer is taken from a plane perpendicular to the central axis of a normally grown single crystal, the outside diameter of R-OSF is 60% of the diameter of the crystal when the pulling rate is 0.87 mm/min, and is shorter when the pulling rate is lower. When the crystal was pulled at a rate of 0.87 mm/min in Example 13, the inner region of R-OSF remained around the center. However, the density of laser scattering tomography defects in this portion was ⅓ or less compared with the wafer obtained by the conventional method. At pulling rates that were 0.85 mm/min or less, R-OSF almost disappeared. Further, at pulling rates below 0.79 mm/min, dislocation clusters began to occur from the vicinity of the outer edge of the single crystal.

It is understood that a single crystal capable of supplying wafers having an extremely small level of laser scattering tomography defects and dislocation clusters can be grown by making the temperature gradient in the vertical direction of the single crystal being grown smaller at the outer edge than at the center and by controlling the pulling rate.

4-2. EXAMPLE 14

An 8"-diameter silicon single crystal was grown by the single crystal producing apparatus shown in FIG. 26 and used in Example 13. The cooling sleeve and its location were exactly the same as in Example 13. The single crystal having a body length of 1000 mm was grown from 120 kg of polysilicon material under such conditions that the temperature gradient is smaller at the outer edge than at the center as in Example 13 and that the pulling rate after forming the shoulder is almost constant at 0.82–0.83 mm/min. The temperature gradient of the single crystal being pulled while the crystal stayed in the temperature range of the melting point to 1250° C. was 3.9–4.0° C./mm at the center of the crystal and 3.3–3.5° C./mm at the outer edge according to the results of heat transfer analysis simulations.

For purposes of comparison, another 8"-diameter single crystal was grown. Although the same single crystal producing apparatus was used, the conventional method was applied and the cooling sleeve 7 was thus removed this time. The pulling rate was set at 0.47 mm/min so that R-OSF appear around the outer edge similarly to the conventional crystal. The temperature gradient of this single crystal being grown while the crystal stayed in the temperature range of the melting point to 1250° C. was 2.0–2.1° C./mm at the center of the crystal and 1.8–1.9° C./mm at the outer edge according to the results of heat transfer analysis simulations.

The outside diameter of R-OSF was detected and measured by the same technique as in Example 13 as to wafers taken at three positions, i.e., the upper portion, the middle portion, and the lower portion, from the two kinds of single crystals obtained. Further, examinations were made through laser scattering tomograpy and Secco etching as to the density of laser scattering tomography defects and the density of dislocation clusters in specimens taken at three positions, i.e., the center, the position that is ½ the diameter, and the outer edge from each wafer, respectively. Still further, as to wafers taken at positions adjacent to those wafers whose defect distributions were examined, time-zero dielectric breakdown (TZDB) for an oxide film thickness of 25 nm was measured and their percent nondefective was obtained after subjecting each of such wafers to a predetermined heat treatment and the like and thereafter giving it a gate structure of a device.

The results of these examinations are collectively indicated in Table 1. The density of laser scattering tomography defects and that of dislocation clusters are indicated in terms of the average of the measurements at the three positions of each wafer. As is apparent from Table 1, the wafers obtained from the single crystal that was grown in accordance with the method specified by this invention are of high quality with less grown-in defects such as laser scattering tomography defects and dislocation clusters and with a higher percent nondefective in terms of TZDB compared with the wafers obtained from the single crystal that was grown by the conventional producing method.

TABLE 1

| Temperature gradient in vertical direction | Position in single crystal | Ratio of outside diameter of R-OSF (%) | Average density of laser scattering tomography defects (number of scatterers/cm$^3$) | Average density of dislocation clusters (number of clusters/cm$^3$) | Percent nondefective in terms of initial oxide film withstand voltage | Remarks |
|---|---|---|---|---|---|---|
| Large at center and small at outer edge | Upper | 0 | 0 | 0 | 96.4 | Example of this invention |
| | Middle | 0 | 0 | 0 | 95.2 | |
| | Lower | 0 | 0 | 0 | 95.7 | |
| Small at center and large at outer edge | Upper | 41 | $3.4 \times 10^4$ | $5.0 \times 10^3$ | 70.3 | Comparative example |
| | Middle | 38 | $2.8 \times 10^4$ | $6.2 \times 10^3$ | 72.1 | |
| | Lower | 40 | $3.1 \times 10^4$ | $5.3 \times 10^3$ | 71.5 | |

As described in the foregoing, according to the fourth high-quality silicon single crystal and the method of producing the same, a high-quality single crystal of a large diameter and a long size in which grown-in defects such as dislocation clusters and laser scattering tomography defects are minimized can be produced by a CZ method at a higher pulling rate, i.e., at a higher level of productivity. Wafers produced from the thus obtained single crystal contain less harmful defects which deteriorate device characteristics and hence can be effectively adapted to larger scale integration and size reduction of the devices.

5. Fifth High-Quality Silicon Single Crystal and Method of Producing the Same

When a silicon single crystal is grown from a melt by CZ method, in view of the diffusing behavior of vacancies and interstitial Si atoms introduced into the crystal from the solid-melt interface, the following hypothesis can be established. Laser scattering tomography defects would be formed if the crystal is cooled with excessive vacancies, and dislocation clusters would result if the crystal is cooled with excessive interstitial Si atoms. Further, if the crystal is cooled with vacancies and interstitial Si atoms balancing in number, both types of defects would disappear and R-OSF and an oxygen precipitation-promoting region would be formed adjacent to where these types of defects would have disappeared. From this hypothesis, the following can be inferred. As disclosed in the previously described Japanese Unexamined Application Laid-Open No. 8-330316(1996), what would be required is that the average temperature gradient in the direction of the pulling shaft within a single crystal immediately after solidification be almost the same both at the center and at the outer edge or become gradually smaller from the center to the outer edge. However, the same Japanese Unexamined Application Laid-Open No. 8-330316 (1996) does not refer to any specific means for achieving such a temperature distribution within the single crystal during pulling.

In inventing a fifth high-quality silicon single crystal and a method of producing the same, the inventors first investigated the possibility of disposing a heat-shielding body or the like for cooling or heat-insulation around the crystal being grown in order to change the temperature gradients in the direction of the pulling shaft within the silicon single crystal immediately after solidification. However, in view of problems, such as contamination and interference with operation, encountered when a foreign object is moved closer to the melt surface, the above attempt was not so effective as expected. As a next attempt, examinations were made as to how effective it would be to change the rotating speed of the single crystal and that of the crucible during pulling which is the technique employed in the normal single crystal growth. It was found out from the examination results that a single crystal capable of supplying wafers containing an extremely small level of laser scattering tomography defects and dislocation clusters can be produced by controlling the rotating speed of the crucible or of the single crystal or of both and by limiting the pulling rate.

Figure 28:
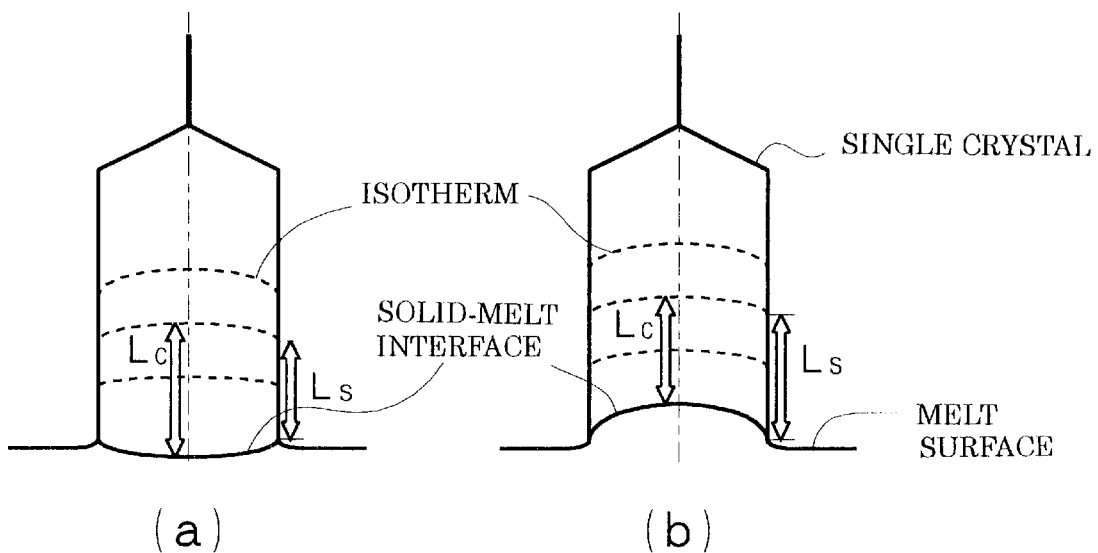
FIGS. 28(a) and 28(b) schematically show the solid-melt interfaces of single crystals that are being pulled.

FIG. 28 schematically shows the solid-melt interfaces of single crystals that are being pulled. The single crystal that is being pulled releases much of latent heat of solidification from its surface, and thus its surface is cooled faster than its inside. Hence, the surface temperature is higher than the inside temperature, and the solidifying interface or the solid-melt interface usually tends to be upwardly convex with the temperature higher at the center of the single crystal than at the surface. The temperature distribution within the crystal is such that the temperature is higher at the center on a plane perpendicular to the pulling shaft, i.e., as schematically shown in FIG. 28(a). Here, the temperature on the solid-melt interface is maintained at a predetermined value, which is the solidifying point of silicon. Now, assuming the distances from the solid-melt interface to an isotherm having the same temperature difference ($\Delta T$) in the direction of the pulling shaft within the single crystal, a distance (Lc) at the center is greater than a distance (Ls) at the surface. That is, the temperature gradient in the direction of the pulling shaft at the center of the single crystal Gc ($=\Delta T/Lc$) is smaller than the temperature gradient in the same direction at the surface Gs ($=\Delta T/Ls$).

In contrast, supposing that the single crystal would be cooled under the same conditions immediately after pulling, if the solid-melt interface is made further upwardly convex than isotherms within the single crystal as shown in FIG. 28(b), then Ls becomes greater than Lc, and thus Gc must be made greater than Gs. If Gc$\geq$Gs can be satisfied immediately after solidification, then it would be possible, as will be described later, to expand the angle of the V-shaped distribution of R-OSF that is so shaped in function of the pulling rate as previously described with reference to FIG. 2. Thus, methods of achieving this state were studied.

The solid-melt interface tends to be further upwardly convex with increasing single crystal pulling rate. This is because the faster the pulling rate, the slower the release of latent heat of solidification at the center of the single crystal than at the surface, and thus the temperature difference increases between the center and the outer edge. However, an upwardly convex solid-melt interface can be obtained by increasing the pulling rate, but this is not enough in that the number of laser scattering tomography defects is increased. On the other hand, when the pulling rate is decreased, the solid-melt interface becomes flat or downwardly convex. This is because lower pulling rates allow the crystal to release its latent heat of solidification sufficiently, thereby preventing heat from resting at the center, and thus Ls tends to increase. However, a mere reduction in pulling rate is not enough because dislocation clusters begin to occur.

During single crystal growth, the crucible is rotated, generally, at about 5–15 rpm and the single crystal at about 15–30 rpm in order to, e.g., achieve a temperature distribution symmetrical with respect to the center over the solid-melt interface, reduce erratic temperature fluctuations due to heat convection, and homogenize impurities and addition elements. Since the melt within the crucible is heated by a heater from its outer edge, upward natural convection occurs near the side wall of the crucible and downward convection at the center. When the crucible is rotated, such movements of the melt within the crucible are restrained.

However, when the crucible is rotated faster, an upwardly convex solid-melt interface is harder to obtain, and thus it was found out that it was desirable to rotate the crucible as slowly as possible. When the single crystal is rotated, forced convection, or a cock-run flow results. This forced convection is an upward flow occurring at the center of the crucible, and a relatively high-temperature melt hits the middle of the single crystal and flows from the middle to the outer edge, thereby increasing the temperature of the solid-melt interface at the center and hence making the solid-melt interface being further upwardly convex.

Thus, by making the solid-melt interface flat or upwardly convex while combining the rotating speed of the crucible and that of the single crystal in such a pulling rate range that the outside diameter of R-OSF is sufficiently small, a temperature distribution such as shown in FIG. 28(b) is achieved. It has been verified that by such a method, a single crystal capable of supplying wafers having an extremely small level of grown-in defects such as laser scattering tomography defects and dislocation clusters can be produced. By further defining the producing condition limits, the method of producing the fifth high-quality silicon single crystal has been accomplished.

The method is characterized by pulling a single crystal in such a state that the shape of a solid-melt interface between the single crystal being grown and a melt is flat or upwardly convex at such a low rate that the outside diameter of R-OSF occurring in the crystal is within a range of 0–60% of the diameter of the crystal. In this producing method, it is desirable that the rotating speed of the crucible be 5 rpm or less, or/and the rotating speed of the single crystal be 13 rpm or more.

Now, let us think about why a denuded zone is expanded by selecting an appropriate pulling rate when the temperature gradients in the direction of the pulling shaft within a single crystal immediately after solidification are substantially the same at the center and at the outer edge of the crystal, or become gradually smaller from the center to the outer edge. First, the melt undergoes a change to a solid crystal through solidification when pulled at the time of single crystal growth. Such a change takes place from a liquid phase in which atoms are randomly arranged to a solid phase in which atoms are neatly arranged, and thus in the solid phase near the solid-melt interface, there are vacancies created by atoms that should exist missing and interstitial atoms created by superfluous Si atoms entering a crystal lattice in large amounts. It is presumed that there would be more vacancies created by missing atoms than interstitial atoms in the crystal immediately after solidification. As the portion grown into a single crystal after solidified by pulling moves away from the solid-melt interface, atoms and vacancies move and diffuse or vacancies and interstitial atoms are combined together, etc., so that these vacancies and interstitial atoms disappear, causing atoms in the crystal to be neatly arranged. However, due to the decreased moving and diffusing rates caused by temperature drops, some of these vacancies and interstitial atoms do remain in the crystal.

Of the vacancies and interstitial atoms introduced in the solidification process, the former outnumbers the latter, and both can move around within the crystal quite freely while the crystal temperature is high. It is assumed that vacancies move or diffuse faster than interstitial atoms. Here, the saturation limit concentrations of vacancies and interstitial atoms allowed to be present in a high-temperature crystal are smaller at lower temperatures, respectively. Thus, even if both of them are present in equal amounts, one at lower temperatures has higher concentrations and the other at higher temperatures has lower concentrations as the actual effect. A single crystal being grown has temperature gradients in the vertical direction, and actual concentration differences attributable to these temperature gradients cause diffusion to occur against the temperature gradients from the low-temperature side to the high-temperature side, i.e., from the upper side of the single crystal being grown to the solid-melt interface, and thus the number of vacancies and interstitial atoms decreases with decreasing temperature. Since vacancies are created when atoms constituting a crystal lattice are missing and interstitial atoms are created when superfluous atoms are present in the lattice, when both of them collide, they are combined with each other to disappear, and thus the crystal lattice tends to become perfect.

Temperature gradients in the direction of the vertical axis of a crystal being grown little change even if the pulling rate is changed as long as the design of a hot zone, i.e., a portion to be cooled of the single crystal being pulled is the same. Vacancies and interstitial atoms diffuse and they combine and disappear actively in the temperature range of the solidifying point (1412° C.) to approximately 1250° C., and it is assumed that their combination and disappearance caused by their diffusion do proceed even at temperatures lower than the above although their diffusion rate is decreased. At the same temperature gradient in the same temperature range, vacancies diffuse toward the solid-melt interface against the temperature gradient in substantially the same amount per unit time. Hence, when the pulling rate is increased, the crystal temperature decreases, leaving undiffused those vacancies that outnumber interstitial atoms, and even if vacancies continue to disappear to some extent through their diffusion to the surface and their combination with interstitial atoms, the undiffused vacancies do remain in the crystal as defects. It is assumed that these undiffused vacancies would be the cause of laser scattering tomography defects. This is equivalent to a portion in which the pulling rate is high in FIG. 2 described previously. On the other hand, when the pulling rate is low, which is equivalent to the lower portion in FIG. 2, vacancies diffuse and disappear sufficiently, but interstitial atoms, which diffuse more slowly than vacancies, are left undiffused while the crystal temperature decreases with vacancies relatively running short, and thus these undiffused interstitial atoms that are superfluous in the end cause dislocation clusters. Hence, laser scattering tomography defects mainly result in a rapidly grown single crystal portion where the pulling rate is high and dislocation clusters mainly result in a slowly grown single crystal portion where the pulling rate is low. A wafer sliced from a crystal portion located in between includes both of these crystal portions.

In the normal single crystal pulling and growing method, the temperature gradient at the center Gc is larger than the temperature gradient at the surface Gs as has been described with reference to FIG. 28($a$). That is, the concentrations of vacancies and interstitial atoms drop faster at the surface than at the center due to their temperature gradient-based diffusion. However, since vacancies diffuse very much faster than interstitial atoms, the distribution of vacancy concentrations becomes analogous to isotherms within the crystal on a surface of a wafer that is perpendicular to the pulling shaft, while concentrations of interstitial atoms are distributed almost uniformly on a plane that is perpendicular to the pulling shaft. Further, defects such as vacancies and interstitial atoms disappear upon reaching the surface of a crystal, and thus their concentrations are low at the surface, so that their temperature gradient-based diffusion to the surface are also occurring in addition to their temperature gradient-based diffusion.

Figure 29:
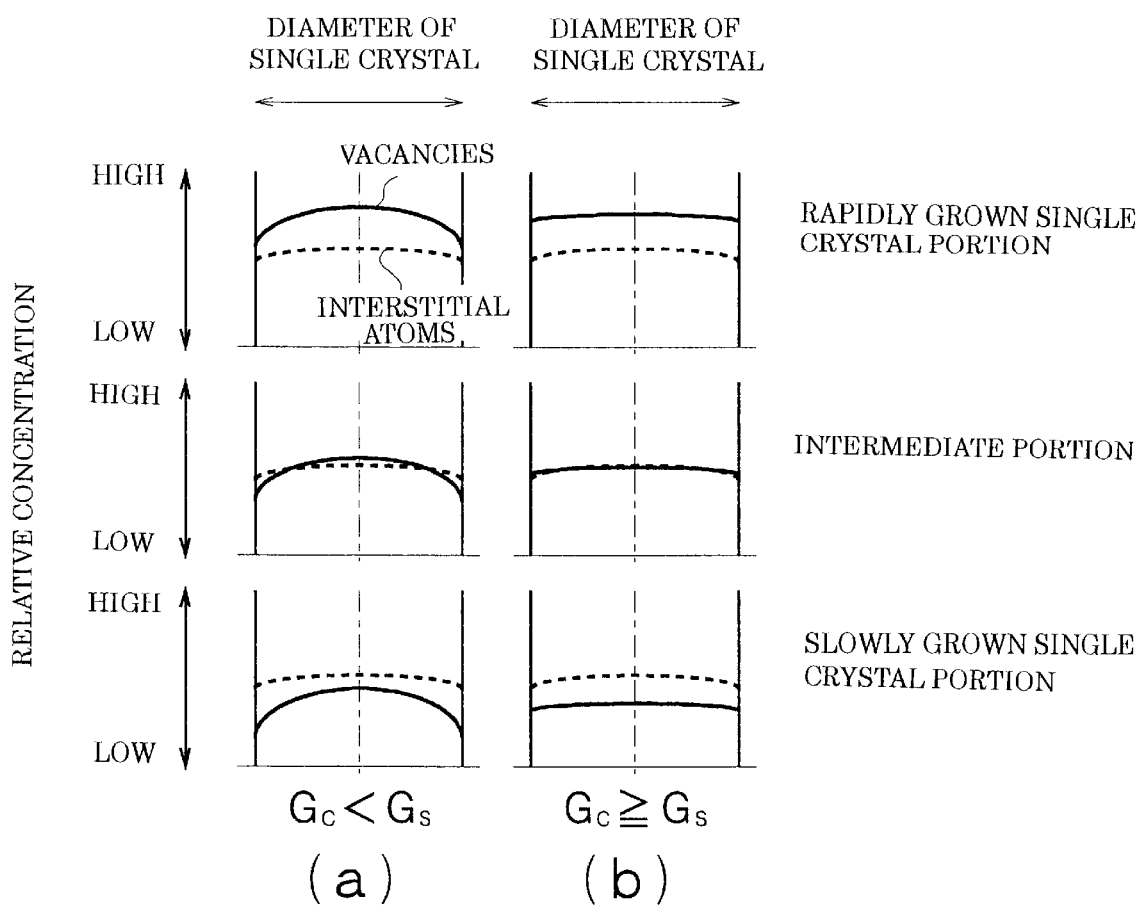
FIGS. 29(a) and 29(b) illustrate the relationship between the temperature gradients at the center and at the surface in a single crystal that is being pulled and the densities of vacancies and interstitial atoms.

FIG. 29 illustrates the relationship between the temperature gradients at the center and at the surface in a single crystal being pulled and the densities of vacancies and interstitial atoms. In the above-described normal single crystal pulling and growing method, the same relationship is presumed to be as schematically shown in FIG. 29($a$). Even if there are differences in concentration between vacancies and interstitial atoms, when the pulling rate is high, vacancies are excessive and thus results a rapidly grown single crystal in which laser scattering tomography defects tend to occur in the whole in-plane area, while when the pulling rate is low, interstitial atoms are excessive and thus results a slowly grown single crystal in which dislocation clusters tend to occur in the whole in-plane area.

However, at intermediate pulling rates, the crystal temperature decreases with the vacancy concentration being close to the interstitial atom concentration, but their concentration distributions are different due to different temperature gradients in the direction of the pulling shaft and different diffusion rates, and thus, as indicated by the middle portion in FIG. 29($a$), vacancies exceed interstitial atoms at the center of the crystal, while vacancies run short at a portion near the surface. That is, laser scattering tomography defects are mainly distributed around the center, and dislocation clusters near the surface around the outer edge. In the middle portion between the surface and the center, vacancies balance with interstitial atoms in number, and thus both are combined together to disappear. As a result, formed is a denuded zone free of any of these types of grown-in defects that occur in the rapidly grown single crystal and the slowly grown single crystal, with R-OSF occurring at substantially the same place. Nucleation of oxygen precipitates accounts for the formation of R-OSF. The fact that an oxygen precipitation-promoting region exists next to R-OSF seems to support such account. Although grown-in defects such as laser scattering tomography defects and dislocation clusters are not present in R-OSF or in the oxygen precipitation-promoting region, when oxygen precipitates are formed, vacancies and the like are assumed to form the nucleation of these precipitates. Thus, vacancies remaining in these regions in small amounts would be lost through oxygen precipitation. Thus, it is presumed that the fact that the distribution of vacancy concentrations exhibits a larger difference than that of interstitial atom concentrations across the radius of a single crystal, i.e., between the center and the surface would contribute to bringing about such a V-shaped distribution of FIG. 2 that the diameters of R-OSF and the denuded zone are reduced as the pulling rate is decreased.

As described in the foregoing, if the formation of a denuded zone is dependent on the fact that vacancies balance with interstitial atoms in number, and if such balancing is governed by temperature gradients in the vertical direction of a crystal in a high temperature range immediately after solidification as described above, then it is assumed that to expand the denuded zone, the pulling rate may be adjusted in such a manner that temperature gradients in the direction of the vertical axis in a single crystal being pulled are the same in size in a plane perpendicular to the pulling shaft, i.e., in the in-plane area of a wafer. However, vacancies and interstitial atoms diffuse toward the surface of the crystal in addition to their temperature gradient-based diffusion, and thus when the temperature gradients in the direction of the pulling shaft are made the same both at the center and at the surface, the vacancy concentration at the surface is reduced excessively, so that it is desirable that the temperature gradient in the direction of the pulling shaft at the surface be smaller than at the center.

In the fifth high-quality silicon single crystal, the shape of the solid-melt interface is made flat of upwardly convex as a means for keeping the temperature gradient in the direction of the pulling shaft equal both at the center of the crystal and at its surface or slightly smaller at the surface, in addition to decreasing the pulling rate so that R-OSF is positioned toward the center of a wafer. By doing so, the distribution of vacancy concentrations is further flattened to be close to that of interstitial atom concentrations as shown in FIG. 29($b$), and by further selecting an appropriate pulling rate, a single crystal in which a denuded zone is expanded can be obtained.

In the method of producing the fifth high-quality silicon single crystal, it is required to select such a pulling rate that the outside diameter of R-OSF observed in a wafer is within a range of 0–60% of the diameter of the crystal. During such a pulling operation, the method also requires that the average temperature gradient in the direction of the pulling shaft be equal at the center of the single crystal and at the surface or be smaller at-the surface than at the center while the temperature of the crystal being grown stays in the range of the solidifying point to about 1250° C. As a result, a silicon single crystal having an extremely small level of grown-in defects such as laser scattering tomography defects and dislocation clusters can be obtained. When the pulling rate is so decreased as required by the method, the solid-melt interface usually tends to be flat or even downwardly convex. However, in order to obtain the above-described temperature distribution within a single crystal, the shape of the solid-melt interface of the single crystal that is being grown must be flat or upwardly convex.

In the method of producing the fifth high-quality silicon single crystal, the pulling rate at the time of single crystal growth is such that the outside diameter of R-OSF observed on a wafer is within a range of 0–60% of the diameter of the single crystal. While such outside diameter of R-OSF changes in accordance with the pulling rate, the pulling rate for obtaining the same outside diameter of R-OSF differs depending on the temperature conditions of a single crystal being pulled and the hot zone design for a single crystal being grown. In view of this, how the outside diameter of R-OSF changes is examined experimentally by changing the pulling rate using growing equipment, and a single crystal is grown at such a pulling rate that the outside diameter falls within the above-described range.

When the pulling rate is so high that the outside diameter of R-OSF exceeds 60%, a region where laser scattering tomography defects occur remains around the center of a single crystal. Further, when the pulling rate is continuously decreased, the outside diameter of R-OSF is gradually reduced, finally, to 0%. If the pulling rate is further decreased from such a level that the outside diameter of R-OSF is 0%, dislocation clusters begin to occur. To avoid the above inconvenience, a single crystal is to be grown at such a pulling rate that the outside diameter of R-OSF is within the range of 0–60% of its diameter. The specific pulling rate range differs depending on the structure of a single crystal producing apparatus to be used, or the structure of a hot zone in particular. Therefore, it is desirable to select a proper value through actually growing single crystals, taking wafers from the grown single crystals, and observing R-OSF in the wafers.

The single crystal is supposed to be pulled in such a state that the shape of the solid-melt interface is flat or upwardly convex. Although the shape of the solid-melt interface cannot always be checked during pulling, it can be checked by observing the single crystal after grown. For example, the crystal after completely pulled is split lengthwise, heat-treated at 800° C. for 4 hours and at 1000° C. for 16 hours when its oxygen content is high, or heat-treated by heating it up to 900° C. at a rate of 5° C./min while charged into a furnace of about 650° C., soaking it for 20 hours, thereafter heating it to 1000° C. at a rate of 10° C./min, and soaking it at the same temperature for 10 hours when its oxygen content is low, thereby causing precipitates of oxygen to be formed in the crystal. Thereafter, striations indicating the shape of the solid-melt interface can be observed through X-ray topography.

The reason why the shape of the solid-melt interface is made flat or upwardly convex is because by arranging so, the temperature gradient in the direction of the pulling shaft can be smaller at the surface than at the center of a single crystal immediately after solidification. Further, the surface of the single crystal immediately after pulled is heated by radiation from the melt surface and the heater, and hence the temperature gradient in the vertical direction may become smaller at the surface than at the center in some cases when the pulling rate is decreased. In such cases, the solid-melt interface may be flat.

The crucible must be rotated during single crystal growth in order to obtain a single crystal of a predetermined shape through uniform heating by the heater. However, its rotating speed is set at 5 rpm or less in this invention. This is because, when the rotating speed of the crucible is increased, it becomes difficult to implement ultra-low imperfection in the whole in-plane area of a wafer. When the crucible is rotated, the fluidity of the melt within the crucible is restrained. Thus, when its rotating speed exceeds 5 rpm, it is assumed that flows of melt such as to achieve a flat or upwardly convex solid-melt interface would be disturbed.

To compare the effects of the rotating speed of the crucible, examinations were made as to how the distribution of defects changes by changing the rotating speed of the crucible and by continuously changing the pulling rate when an 8"-diameter single crystal was grown by melting 120 kg of polysilicon, i.e., a raw material into which boron, a p-type dopant, was added so as to obtain an electrical resistivity of 10 Ωcm, using a single crystal producing apparatus.

Figure 30:
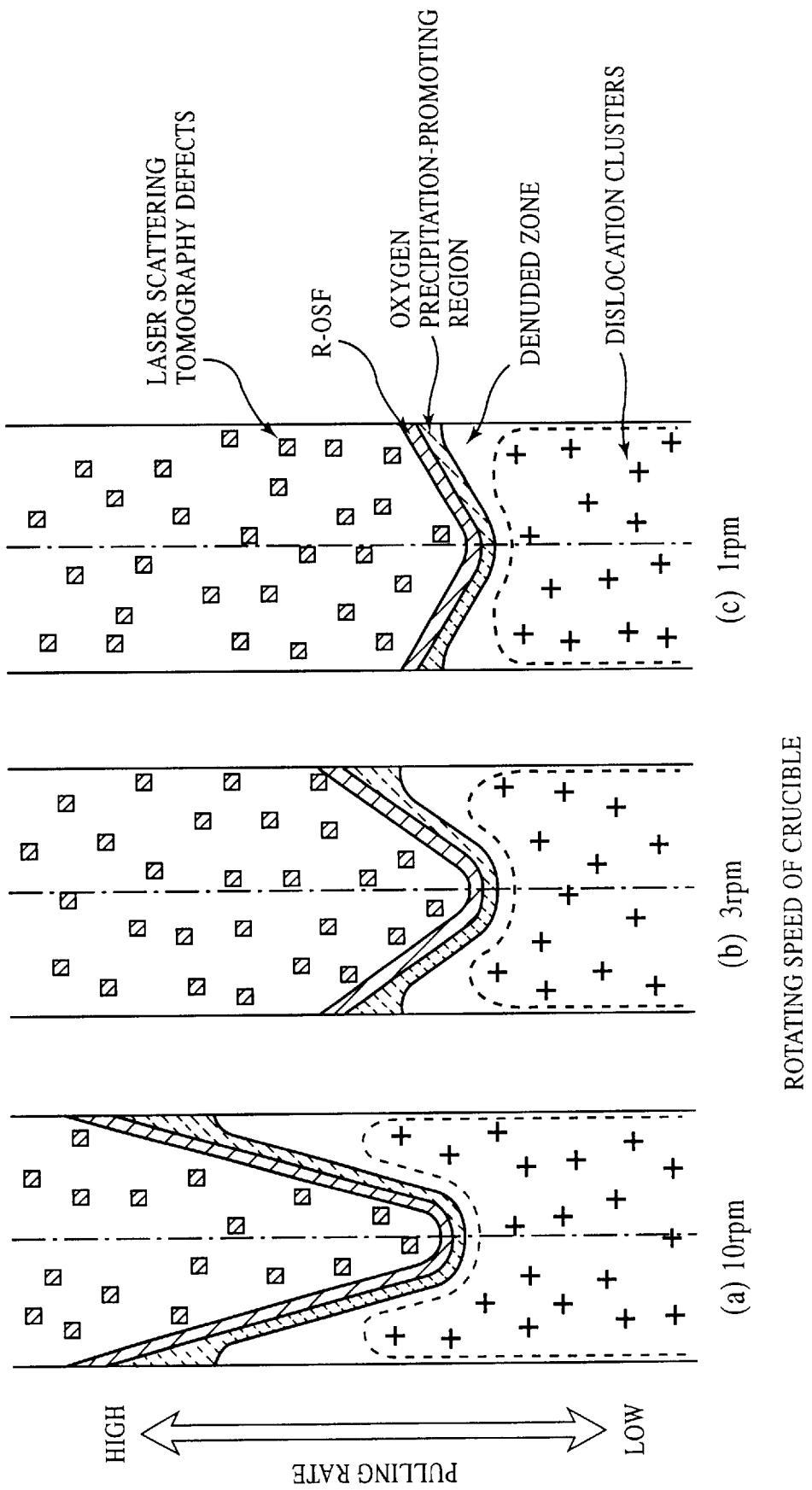
FIGS. 30(a), 30(b), and 30(c) show the results of examinations made as to the defect distribution in the case where the rotating speed of a crucible is varied at levels of 10 rpm, 3 rpm and 1 rpm.

FIG. 30 shows the results of the examinations made as to the distributions of defects in the case where the rotating speed of the crucible was varied at levels of 10 rpm, 3 rpm and 1 rpm. In the case of FIG. 30, the single crystal was rotated at a constant speed of 20 rpm, and after forming the shoulder, the single crystal was grown to a length of about 50 mm at a pulling rate of 0.7 mm/min, after which the pulling rate was continuously decreased to 0.3 mm/min to grow the single crystal to a length of about 1000 mm. As to the thus obtained single crystal, FIG. 30 shows schematically the distributions of its defects in its vertical cross section parallel with the pulling shaft. The defects were observed at the center of the obtained crystal. The distributions of defects in wafers when the pulling rate was varied can be inferred from these results.

In the case where the crucible was rotated at 10 rpm as shown in FIG. 30($a$), R-OSF moved from the outer edge to the center as the pulling rate was decreased, so that laser scattering tomography defects that tend to be easily formed in the inner side of R-OSF were reduced, but dislocation clusters, in turn, began to occur at the outer edge. That is, no matter how the pulling rate was varied, wafers free of grown-in defects, such as laser scattering tomography defects or dislocation clusters, could not be obtained. In contrast, in the case where the crucible was rotated at 3 rpm such as shown in FIG. 30($b$), wafers almost free of grown-in defects could be obtained if the pulling rate was decreased to decrease the outside diameter of R-OSF. Further, when the crucible was rotated at 1 rpm as shown in FIG. 30($c$), a single crystal capable of providing wafers free of grown-in defects could be produced in such a wide pulling rate range as to reduce the outside diameter of R-OSF or eliminate R-OSF.

As described in the foregoing, the rotating speed of the crucible is set at 5 rpm or less as the upper limit, while its lower limit is not particularly specified, and it may be 0 rpm.

A single crystal that is being pulled must be rotated at a rotating speed of 13 rpm or more. This is required to cause an upward flow of forced convection at the center of the crucible and a downward flow near the crucible wall. By this fluidity of the melt, the high-temperature upward flow of the melt hits the central portion of the crucible, i.e., the middle portion of the lower surface of the crystal being grown, thereby allowing the solid-melt interface to be maintained upwardly convex. When the single crystal is rotated at speeds below 13 rpm, the single crystal that can provide wafers that are free of defects in their whole in-plane area cannot be obtained. On the other hand, when the single crystal is rotated too fast, a wafer region having an extremely low level of defects decreases, and the growing rate of the crystal also decreases. The reason for this is assumed to be that the upward flow passes near the solid-melt interface so fast that the interface does not become upwardly convex satisfactorily. Therefore, it is desirable that the single crystal be rotated at 30 rpm at most. That is, the crystal is rotated at 13 rpm or more. Its desirable range is between 15 and 30 rpm.

The design of the cooled portion of a single crystal that is pulled from the melt, i.e., the design of a hot zone is not particularly limited. However, while the crystal stays in the temperature range of the solidifying point to about 1250° C., it is desirable that the temperature gradient in the direction of the pulling shaft is not large at the surface of the crystal, and thus it is preferable that the surface of the single crystal immediately above the melt surface be of such a structure that radiation from the crucible wall or the heater is not particularly shielded.

5-1. EXAMPLE 15

An 8"-diameter silicon single crystal was grown while changing the rotating speed of the crystal and that of the crucible using the single crystal producing apparatus shown in FIG. 1. The crucible was charged with 120 kg of polysilicon that is a raw material, into which boron, a p-type dopant, was added so that the crystal has an electrical resistivity of about 10 Ωcm.

FIG. 31 shows the results of examinations made as to Example 15. It shows the measurements of the pulling rate and the rotating speeds of the crystal and the crucible at which the single crystal was grown. The R-OSF position was observed through X-ray topography as to wafers that were taken at the upper, middle, and lower portions of the single crystal, immersed into a 16%-by-weight aqueous solution of copper nitrate to have Cu deposited thereon, and heated at 900° C. for 20 minutes and thereafter cooled. Further, the density of laser scattering tomography defects and the density of dislocation clusters were examined through laser scattering tomograpy and Secco etching, respectively. Further, as to wafers taken at positions adjacent to those wafers whose defect distributions were examined, time-zero dielectric breakdown (TZDB) for an oxide film thickness of 25 nm was measured and their percent nondefective was obtained after subjecting each of such wafers to a predetermined heat treatment and the like and thereafter giving it a gate structure of a device.

The results of these examinations are collectively indicated in FIG. 31. The density of laser scattering tomography defects and that of dislocation clusters were indicated in terms of the average of the measurements at five arbitrary positions of each wafer. As is apparent from these results, the wafers obtained from the single crystal that was grown in accordance with the method specified by this invention were of high quality with less grown-in defects such as laser scattering tomography defects and dislocation clusters and with a higher percent nondefective in terms of TZDB compared with the wafers obtained from the single crystal that was grown by the conventional producing method.

As described in the foregoing, according to the fifth high-quality silicon single crystal and the method of producing the same, a high-quality single crystal of a large diameter and a long size in which grown-in defects such as dislocation clusters and laser scattering tomography defects are minimized can be produced by CZ method in a good yield. Wafers obtained from the thus produced single crystal contain less harmful defects which deteriorate device characteristics and hence can be effectively adapted to larger scale integration and size reduction of the devices.

Industrial Applicability

In the high-quality silicon single crystals and the methods of producing the same of this invention, the position where R-OSF occur can be controlled in accordance with the single crystal pulling conditions, and at the same time, a high-quality single crystal of a large diameter and a long size in which grown-in defects such as dislocation clusters and laser scattering tomography defects are minimized can be produced in a good yield. Wafers obtained from the thus produced single crystals are denuded of harmful defects that deteriorate device characteristics and hence can be effectively adapted to larger scale integration and size reduction of the devices.

Therefore, the high-quality silicon single crystals and the methods of producing the same according to this invention can be utilized in the field of producing silicon single crystals for the preparation of semiconductor.

What is claimed is:

1. A silicon single crystal grown by a Czochralski method, characterized in that the width of ring-like extending oxidation-induced stacking faults exceeds 8% of the radius of said grown crystal and dislocation clusters are absent.

2. A silicon single crystal grown by a Czochralski method, characterized in that the width of ringlike extending oxidation-induced stacking faults exceeds 8% of the radius of said grown crystal, the inside diameter of said ring-like extending oxidation-induced stacking faults is within a range of 0–80% of the diameter of said grown crystal, and grown-in defects are absent.

3. A silicon single crystal grown by a Czochralski method, characterized in that the outside diameter of a region where ring-like extending oxidation-induced stacking faults occur are within a range of 0–80% and within a range of 0–33% of the diameter of said grown crystal, respectively, and dislocation clusters are absent.

4. A silicon single crystal grown by a Czochralski method, characterized in that the inside diameter of a ring-like oxygen precipitation promoting region is within a range of 0–80% of the diameter of said grown crystal, the inside diameter of a region where ring-like extending oxidation-induced stacking faults occur which is the inner side of said oxygen precipitation promoting region is within a range of 0–33% of the diameter of said grown crystal, and dislocation clusters are absent.

5. A silicon single crystal grown-under such a condition that said crystal stays in a temperature range of 1250° C.–1000° C. for 7 hours or more when pulled by a Czochralski method, characterized in that the outside diameter of ringlike extending oxidation-induced stacking faults is within a range of 0–60% of the diameter of said grown crystal.

6. A silicon single crystal grown under such a condition that said crystal stays in a temperature range of 1250° C.–1000° C. for 7 hours or more when pulled by a Czochralski method, characterized in that the inside diameter or the outside diameter of an oxygen precipitation promoting region is within a range of 0–60% of the diameter of said grown crystal.

7. A silicon single crystal grown under such a condition that said crystal stays in a temperature range of 1250° C.–1000° C. for 7 hours or more when pulled by a Czochralski method, characterized in that the outside diameter of a circular region where laser scattering tomography defects are detected is within a range of 0–60% of the diameter of said grown crystal.

8. A method of producing a silicon single crystal characterized in that said single crystal is grown under such conditions that said crystal is pulled so as to stay in a temperature range of 1250° C.–1000° C. for 7 hours or more, and that the outside diameter of ring-like extending oxidation-induced stacking faults is within a range of 0–60% of the diameter of said grown crystal.

9. A method of producing a silicon single crystal characterized in that said single crystal is grown under such conditions that said crystal is pulled so as to stay in a temperature range of 1250° C.–1000° C. for 7 hours or more, and that the inside diameter or the outside diameter of an oxygen precipitation promoting region is within a range of 0–60% of the diameter of said grown crystal.

10. A method of producing a silicon single crystal characterized in that said single crystal is grown under such conditions that said crystal is pulled so as to stay in a temperature range of 1250° C.–1000° C. for 7 hours or more, and that the outside diameter of a circular region where laser scattering tomography defects are detected is within a range of 0–60% of the diameter of said grown crystal.

11. A method of producing a silicon single crystal characterized in that said crystal is pulled in such a state that the shape of a solid-melt interface between said single crystal being grown and a melt is upwardly convex at such a low rate as to allow the outside diameter of ring-like extending oxidation-induced stacking faults within said single crystal to be within a range of 0–60% of the diameter of said crystal, wherein the rotating speed of a crucible is set at 5 rpm or less, and the rotating speed of said single crystal is set at 13 rpm or more.

* * * * *